(12) United States Patent
Park et al.

(10) Patent No.: US 12,433,023 B2
(45) Date of Patent: Sep. 30, 2025

(54) DISPLAY DEVICE AND METHOD OF MANUFACTURING THE SAME

(71) Applicant: Samsung Display Co., LTD., Yongin-si (KR)

(72) Inventors: Do Yeong Park, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 556 days.

(21) Appl. No.: 17/663,910

(22) Filed: May 18, 2022

(65) Prior Publication Data

US 2023/0008145 A1 Jan. 12, 2023

(30) Foreign Application Priority Data

Jul. 8, 2021 (KR) .................. 10-2021-0089851

(51) Int. Cl.
*H10D 86/60* (2025.01)
*H01L 23/00* (2006.01)
(Continued)

(52) U.S. Cl.
CPC ............. *H10D 86/60* (2025.01); *H01L 24/03* (2013.01); *H01L 24/05* (2013.01); *H01L 25/167* (2013.01);
(Continued)

(58) Field of Classification Search
CPC ....... H01L 27/124; H01L 24/03; H01L 24/05; H01L 25/167; H01L 27/1214–1296; H01L 24/02–09; H01L 2224/02–09519; H05K 2201/10136; H10K 59/10–221; H10K 59/12–1315; H10K 59/80–95; H10D 86/60; H10D 86/0231; H10D 86/441; H10H 20/857; H10H 20/01; H10H 20/0364; H10H 29/142
See application file for complete search history.

(56) References Cited

U.S. PATENT DOCUMENTS 9,329,433 B2 5/2016 Negishi et al.
10,249,603 B2 4/2019 Cho et al.
(Continued)

FOREIGN PATENT DOCUMENTS

JP 2011-211047 A 10/2011
JP 2021-085904 A 6/2021
(Continued)

*Primary Examiner* — Shahed Ahmed
(74) *Attorney, Agent, or Firm* — Womble Bond Dickinson (US) LLP

(57) ABSTRACT

A display device includes a substrate including a display area in which pixels are located, and a non-display area, first and second electrodes in the display area and spaced from each other, light emitting elements between the first and second electrodes, connection electrodes electrically connected to the light emitting elements, a fan-out line electrically connected to the pixels in the non-display area, a first pad electrode on the fan-out line, a pad connection electrode on the fan-out line and the first pad electrode, and electrically connecting the fan-out line and the first pad electrode, and a second pad electrode at a same layer as at least one of the connection electrodes, and contacting the first pad electrode.

14 Claims, 42 Drawing Sheets

(51) Int. Cl.
  *H01L 25/16* (2023.01)
  *H10D 86/01* (2025.01)
  *H10D 86/40* (2025.01)
  *H10H 20/825* (2025.01)

(52) U.S. Cl.
  CPC ....... *H10D 86/0231* (2025.01); *H10D 86/441*
  (2025.01); *H01L 24/24* (2013.01); *H01L 24/82*
  (2013.01); *H01L 2224/039* (2013.01); *H01L*
  *2224/05018* (2013.01); *H01L 2224/05082*
  (2013.01); *H01L 2224/05083* (2013.01); *H01L*
  *2224/05084* (2013.01); *H01L 2224/05147*
  (2013.01); *H01L 2224/05166* (2013.01); *H01L*
  *2224/05186* (2013.01); *H01L 2224/05558*
  (2013.01); *H01L 2224/05686* (2013.01); *H01L*
  *2224/24051* (2013.01); *H01L 2224/24145*
  (2013.01); *H01L 2224/245* (2013.01); *H01L*
  *2224/82101* (2013.01); *H01L 2924/0549*
  (2013.01); *H10H 20/825* (2025.01)

(56) References Cited

U.S. PATENT DOCUMENTS

| | | | |
|---|---|---|---|
| 10,276,630 | B2 | 4/2019 | Lee et al. |
| 10,340,419 | B2 | 7/2019 | Kim et al. |
| 2020/0266259 | A1* | 8/2020 | Lee ................ H10K 59/131 |
| 2020/0271983 | A1* | 8/2020 | Lee ................ H01L 33/44 |
| 2021/0134877 | A1 | 5/2021 | Kim et al. |
| 2021/0202675 | A1* | 7/2021 | Jang ................ H10K 59/122 |
| 2022/0285332 | A1 | 9/2022 | Aoki et al. |
| 2022/0352252 | A1 | 11/2022 | Lee et al. |

FOREIGN PATENT DOCUMENTS

| | | |
|---|---|---|
| KR | 10-2018-0009014 A | 1/2018 |
| KR | 10-2018-0011404 A | 2/2018 |
| KR | 10-1987196 B1 | 6/2019 |
| KR | 10-2020-0088951 A | 7/2020 |
| KR | 10-2021-0039521 A | 4/2021 |
| KR | 10-2021-0054117 A | 5/2021 |

* cited by examiner

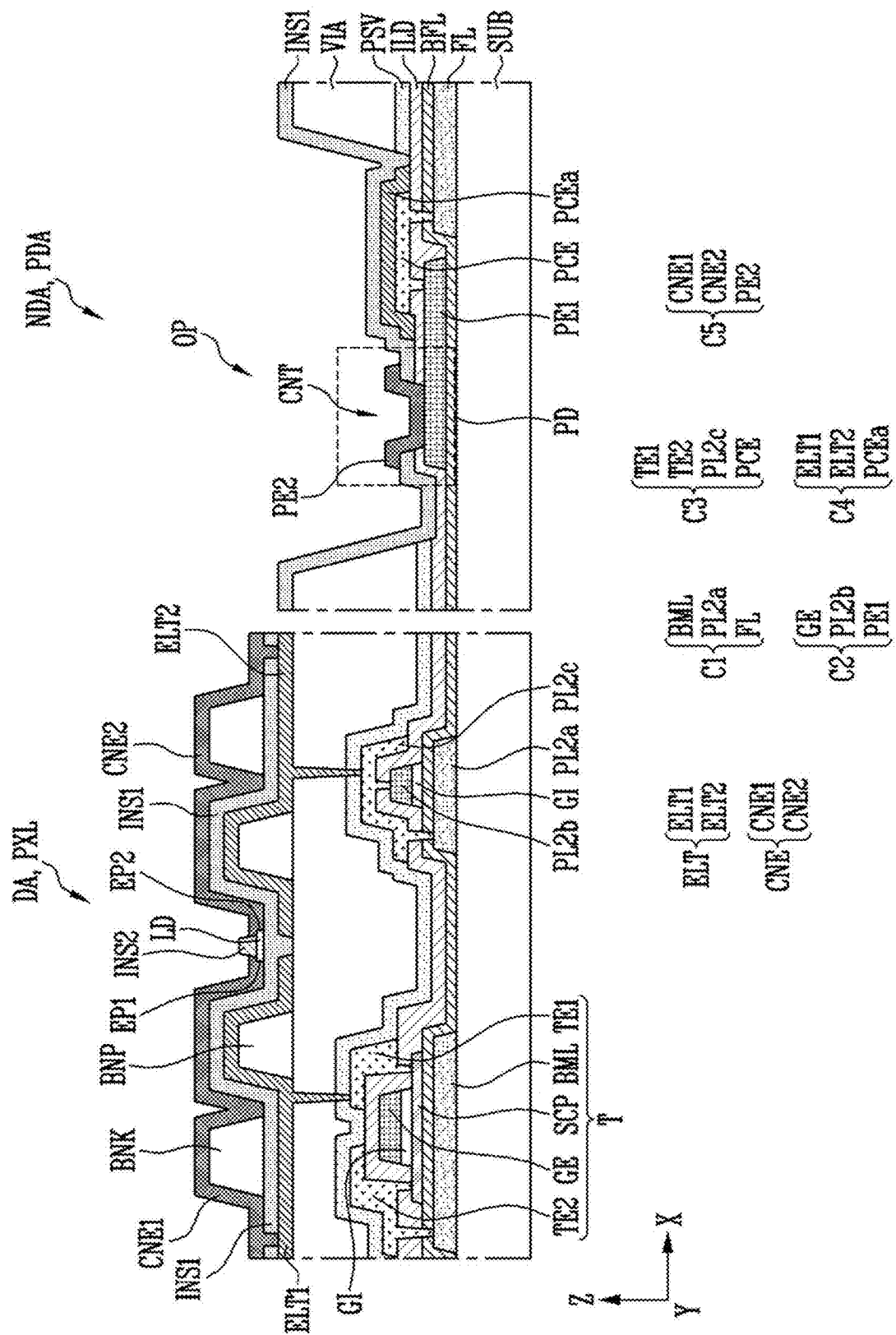

DISPLAY DEVICE AND METHOD OF MANUFACTURING THE SAME

CROSS-REFERENCE TO RELATED APPLICATION

This application claims priority to and the benefit of Korean patent application number 10-2021-0089851 filed on Jul. 8, 2021, the entire disclosure of which is incorporated by reference herein.

BACKGROUND

1. Field

Various embodiments of the present disclosure relate to a display device and a method of manufacturing the display device.

2. Description of Related Art

As interest in information display is increasing, research and development of display devices are continuously made.

SUMMARY

Various embodiments of the present disclosure are directed to a display device and a method of manufacturing the display device, capable of reducing or minimizing contact resistance of a pad component.

The effects, aspects, and features of embodiments of the present disclosure are not limited to the above-stated effects, aspects, and features, and those skilled in the art will clearly understand other non-mentioned effects aspects, and features of embodiments of the present disclosure from the accompanying specification, drawings, and claims.

One or more embodiments of the present disclosure may provide a display device including a substrate including a display area in which pixels are located, and a non-display area; first and second electrodes in the display area and spaced from each other; light emitting elements between the first and second electrodes; connection electrodes electrically connected to the light emitting elements; a fan-out line electrically connected to the pixels in the non-display area; a first pad electrode on the fan-out line; a pad connection electrode on the fan-out line and the first pad electrode, and electrically connecting the fan-out line and the first pad electrode; and a second pad electrode at a same layer as at least one of the connection electrodes, and contacting the first pad electrode.

The display device may further include a lower conductive layer on the substrate; a gate electrode on the lower conductive layer; a semiconductor pattern between the lower conductive layer and the gate electrode; and a source electrode and a drain electrode on the semiconductor pattern, wherein the first pad electrode may be at a same layer as the gate electrode.

The pad connection electrode may be at a same layer as the source electrode or the drain electrode.

The display device may further include a sub-connection electrode covering the pad connection electrode.

The sub-connection electrode may be at a same layer as the first and second electrodes.

The fan-out line may be at a same layer as the lower conductive layer.

The display device may further include a passivation layer on the source electrode or the drain electrode, and the passivation layer may include an opening exposing the second pad electrode.

The passivation layer may cover the pad connection electrode.

The first pad electrode may include a first electrode layer including titanium (Ti); a second electrode layer on the first electrode layer and including copper (Cu); a third electrode layer on the second electrode layer and including titanium (Ti); and a fourth electrode layer on the third electrode layer and including indium tin oxide (ITO).

The connection electrodes may include a first connection electrode electrically connected to a first end of the light emitting elements, and a second connection electrode electrically connected to a second end of the light emitting elements.

The display device may further include an insulating layer between the first connection electrode and the second connection electrode.

The display device may further include a third pad electrode on the second pad electrode, and the second pad electrode may be at a same layer as the first connection electrode, and the third pad electrode may be at a same layer as the second connection electrode.

The insulating layer may include an opening exposing the second pad electrode.

The second pad electrode may be at a same layer as the second connection electrode.

The first connection electrode and the second connection electrode may be at a same layer.

One or more embodiments of the present disclosure may provide a method of manufacturing a display device, including forming a lower conductive layer in a display area of a substrate and a fan-out line in a non-display area of the substrate; forming a gate electrode on the lower conductive layer and a first pad electrode on the fan-out line; forming a source electrode and a drain electrode on the gate electrode and a pad connection electrode on the first pad electrode; forming first and second electrodes on the source electrode or the drain electrode; providing light emitting elements between the first and second electrodes; and forming connection electrodes on the light emitting elements and a second pad electrode on the first pad electrode, wherein the pad connection electrode may electrically connect the fan-out line and the first pad electrode, and the second pad electrode may contact the first pad electrode.

The method may further include: forming an interlayer insulating layer on the gate electrode and the first pad electrode; forming a passivation layer on the interlayer insulating layer; forming an opening by etching the passivation layer; and primary etching the interlayer insulating layer exposed by the opening of the passivation layer.

A thickness of the interlayer insulating layer exposed by the opening of the passivation layer may be less than a thickness of the interlayer insulating layer covered by the passivation layer.

The method may further include forming a via layer on the passivation layer. At the forming the opening, the passivation layer and the via layer may be concurrently etched, and etched surfaces of the passivation layer and the via layer may form a same plane.

The method may further include: forming a first insulating layer on the first and second electrodes; forming a contactor by etching the first insulating layer; and secondary etching the interlayer insulating layer exposed by the contactor of the first insulating layer.

The method may further include: forming a second insulating layer on the light emitting elements; forming an opening by etching the second insulating layer; and forming a contactor by tertiary etching the interlayer insulating layer exposed by the opening of the second insulating layer.

The second pad electrode may contact the first pad electrode through the contactor of the interlayer insulating layer and the contactor of the first insulating layer.

Details of various embodiments are included in the detailed description and drawings.

BRIEF DESCRIPTION OF THE DRAWINGS

FIGS. 42 to 44 are sectional views of respective process steps to describe a method of manufacturing a display device in accordance with one or more embodiments of the present disclosure.

DETAILED DESCRIPTION

Figure 1:
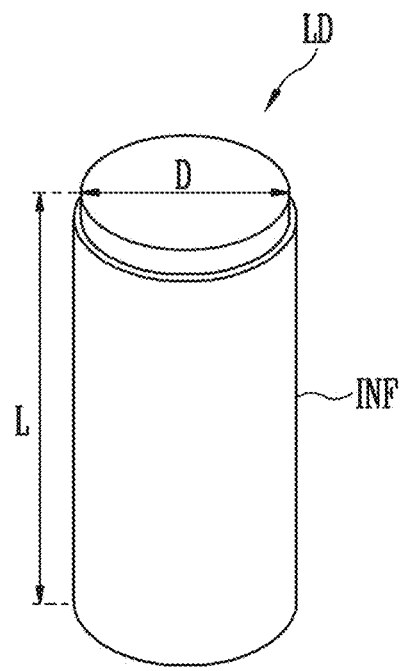
FIGS. 1 and 2 are a perspective view and a sectional view illustrating a light emitting element in accordance with one or more embodiments of the present disclosure.

Aspects and features of embodiments of the present disclosure, and methods for achieving the same will be cleared with reference to embodiments described later in detail together with the accompanying drawings. The present disclosure is not limited to the following embodiments, and various modifications are possible. The present embodiments are provided to make the present disclosure complete and make those skilled in the art completely understand the scope of the present disclosure, and the present disclosure is defined only by the scope of the claims.

The terminology used herein is for the purpose of describing particular embodiments only and is not intended to be limiting. The terms of a singular form may include plural forms unless specifically mentioned. It will be understood that the terms "comprise" and/or "comprising" when used in this specification do not preclude the presence or addition of one or more other components, steps, operations, and/or elements.

In addition, "connection" or "coupling" may comprehensively mean physical and/or electrical connection or coupling. Furthermore, this may generally mean direct or indirect connection or coupling and integrated or non-integrated connection or coupling.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure.

Hereinafter, embodiments of the present disclosure will be described in detail with reference to the accompanying drawings.

Figure 2:
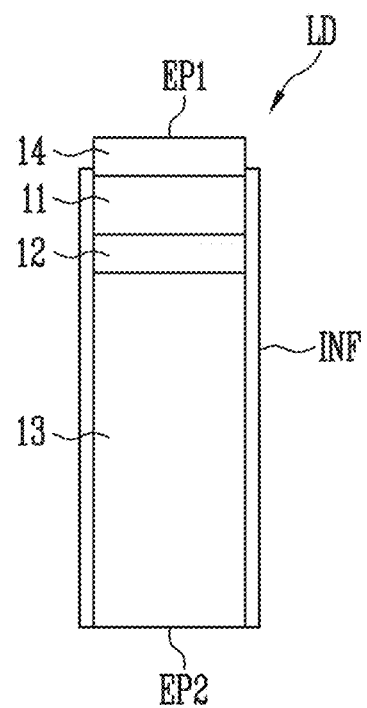

FIGS. 1 and 2 are a perspective view and a sectional view illustrating a light emitting element in accordance with one or more embodiments of the present disclosure. Although FIGS. 1 and 2 illustrate a columnar light emitting element LD, the type and/or shape of the light emitting element LD are not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in the shape of a column extending in one direction. The light emitting element LD may have a first end EP1 and a second end EP2. One of the first and second semiconductor layers 11 and 13 may be disposed on the first end EP1 of the light emitting element LD. A remaining one of the first and second semiconductor layers 11 and 13 may be disposed on the second end EP2 of the light emitting element LD. For example, the first semiconductor layer 11 may be disposed on the first end EP1 of the light emitting element LD, and the second semiconductor layer 13 may be disposed on the second end EP2 of the light emitting element LD.

In one or more embodiments, the light emitting element LD may be a light emitting element manufactured in a columnar shape through an etching method or the like. In this specification, the term "columnar shape" embraces a rod-like shape and a bar-like shape having an aspect ratio greater than 1, such as a cylindrical shape and a prismatic shape, and the cross-sectional shape thereof is not limited thereto.

The light emitting element LD may have a small size ranging from a nanometer scale to a micrometer scale. For instance, the light emitting element LD may have a diameter D (or width) and/or a length L ranging from the nanometer scale to the micrometer scale. The size of the light emitting element LD is not limited thereto. The size of the light emitting element LD may be variously changed depending on design conditions of various devices using a light emitting device employing the light emitting element LD as a light source, for example, a display device.

The first semiconductor layer 11 may be a first conductive semiconductor layer. For example, the first semiconductor layer 11 may include an p-type semiconductor layer. For instance, the first semiconductor layer 11 may include a p-type semiconductor layer which includes at least one semiconductor material of InAlGaN, GaN, AlGaN, InGaN, or AlN, and is doped with a first conductive dopant such as Mg. However, the material forming the first semiconductor layer 11 is not limited thereto, and the first semiconductor layer 11 may be formed of various other materials.

The active layer 12 may be disposed between the first semiconductor layer 11 and the second semiconductor layer 13. The active layer 12 may include any one of a single well structure, a multi-well structure, a single quantum well structure, a multi quantum well (MQW) structure, a quantum dot structure, or a quantum wire structure. However, the present disclosure is not necessarily limited thereto. The active layer 12 may include GaN, InGaN, InAlGaN, AlGaN, or AlN, and in addition, various materials may form the active layer 12.

If a voltage equal to or greater than a threshold voltage is applied between the opposite ends of the light emitting element LD, the light emitting element LD emits light by coupling electron-hole pairs in the active layer 12. Because the light emission of the light emitting element LD is controlled based on the foregoing principle, the light emitting element LD may be used as a light source of various light emitting devices as well as the pixel of the display device.

The second semiconductor layer 13 may be disposed on the active layer 12 and include a semiconductor layer having a type different from that of the first semiconductor layer 11. The second semiconductor layer 13 may include a n-type semiconductor layer. For instance, the second semiconductor layer 13 may include a n-type semiconductor layer which includes any one semiconductor material of InAlGaN, GaN, AlGaN, InGaN, or AlN and is doped with a second conductive dopant such as Si, Ge, or Sn. However, the material forming the second semiconductor layer 13 is not limited thereto, and the second semiconductor layer 13 may be formed of various other materials.

The electrode layer 14 may be disposed on the first end EP1 and/or the second end EP2 of the light emitting element LD. Although FIG. 2 illustrates a case in which the electrode layer 14 is formed on the first semiconductor layer 11, the present disclosure is not limited thereto. For example, a separate electrode layer may be further disposed on the second semiconductor layer 13 at the second end EP2.

The electrode layer 14 may include transparent metal or transparent metal oxide. For instance, the electrode layer 14 may include at least one of indium tin oxide (ITO), indium zinc oxide (IZO), and zinc tin oxide (ZTO), but the present disclosure is not limited thereto. As such, when the electrode layer 14 is made of a transparent metal or a transparent metal oxide, light generated in the active layer 12 of the light emitting element LD may pass through the electrode layer 14 to be emitted to the outside of the light emitting element LD.

An insulating film INF may be provided on the surface (e.g., the outer peripheral or circumferential surface) of the light emitting element LD. The insulating film INF may be directly disposed on the surface (e.g., the outer peripheral or circumferential surface) of each of the first semiconductor layer 11, the active layer 12, the second semiconductor layer 13, and/or the electrode layer 14. The insulating film INF may expose the first and second ends EP1 and EP2 of the light emitting element LD having different polarities. According to one or more embodiments, the insulating film INF may expose a side of each of the electrode layer 14 and/or the second semiconductor layer 13 adjacent to the first and second ends EP1 and EP2 of the light emitting element LD.

The insulating film INF may prevent the active layer 12 from electrically short-circuiting due to making contact with a conductive material of a different light emitting element except the first and second semiconductor layers 11 and 13 of the light emitting element LD. Furthermore, the insulating film INF may reduce or minimize surface defects of the light emitting element LD, thereby improving the lifespan and luminous efficiency of the light emitting element LD.

The insulating film INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). For example, the insulating film INF may be formed as a double layer structure, and respective layers constituting the double layer structure may include different materials. For example, the insulating layer INF may be formed as a double layer structure including aluminum oxide (AlOx) and silicon oxide (SiOx), but the present disclosure is not limited thereto. In one or more embodiments, the insulating film INF may be omitted.

A light emitting device including the above-described light emitting element LD may be used in various devices requiring light sources, such as a display device. For instance, light emitting elements LD may be disposed in each pixel of a display panel, and the light emitting elements LD may be used as the light source of the pixel. However, the application field of the light emitting element LD is not limited to the above-mentioned examples. For example, the light emitting element LD may also be used in various devices, such as a lighting device, which require the light source.

Figure 3:
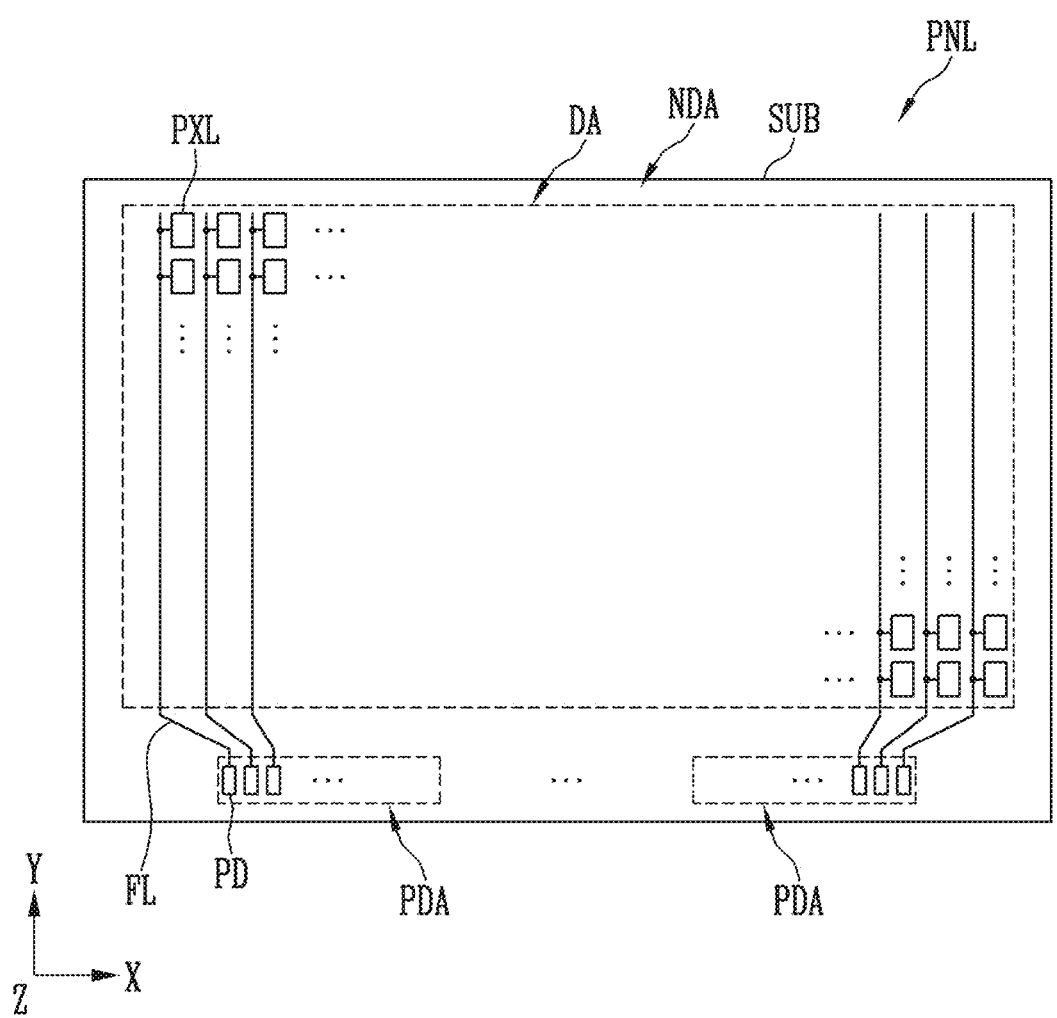
FIG. 3 is a plan view illustrating a display device in accordance with one or more embodiments of the present disclosure.

FIG. 3 is a plan view illustrating a display device in accordance with one or more embodiments of the present disclosure.

FIG. 3 illustrates a display device, in particular, a display panel PNL provided in the display device, as an example of an electronic device which may use, as a light source, the light emitting element LD described with reference to FIGS. 1 and 2.

Each pixel PXL of the display panel PNL may include at least one light emitting element LD. For the convenience of explanation, FIG. 3 simply illustrates the structure of the display panel PNL, focused on a display area DA. In one or more embodiments, at least one driving circuit component such as at least one of a scan driver and a data driver, lines and/or pads may be further disposed on the display panel PNL.

Referring to FIG. 3, the display panel PNL may include a substrate SUB and a pixel PXL disposed on the substrate SUB. The display panel PNL and the substrate SUB for forming the display panel PNL may include a display area DA for displaying an image, and a non-display area NDA formed in an area other than the display area DA. The display area DA may form a screen on which an image is displayed, while the non-display area NDA may be an area other than the display area DA. The non-display area NDA may be around (or surround) the display area DA along the edge or periphery of the display area DA.

The pixels PXL may be disposed in the display area DA on the substrate SUB. For instance, the display area DA may include a plurality of pixel areas in which each pixel PXL is disposed.

The non-display area NDA may be provided around the display area DA. The non-display area NDA includes the pad area PDA, and the pad component PD may be disposed in the pad area PDA. For example, the pad component PD may be connected to a driving circuit such as a source driver and a timing controller mounted on a circuit board. When the display panel PNL is connected to a plurality of source drivers, the pad areas PDA may correspond to the source drivers, respectively.

The pixel PXL may be electrically connected to the pad component PD through a fan-out line FL to receive a data signal from the source driver. When the display panel PNL includes an embedded circuit component (e.g., a gate driver), the embedded circuit component may be connected to the pad component PD. Although it is shown in FIG. 3 that the pad component PD (or the pad area PDA) is disposed below the display panel PNL only, the present disclosure is not limited thereto. For example, the pad component PD may be disposed above and/or below the display panel PNL.

In one or more embodiments, at least two types of pixels PXL emitting light of different colors may be disposed in the display area DA. Each pixel unit including pixels PXL of different colors disposed adjacent to each other may express various colors.

In one or more embodiments, each pixel PXL may be set as a pixel of a suitable color (e.g., a set or predetermined color), and may include the light emitting element LD which generates light of the suitable color (e.g., the set or predetermined color). In one or more embodiments, at least some of the pixels PXL may include the light emitting element LD that generates light of a first color, and a color conversion layer may be disposed over the pixel PXL to convert the light of the first color into light of a second color.

The pixel PXL may include at least one light source that is driven by a suitable control signal (e.g., a predetermined control signal, such as, a scan signal and a data signal) and/or a suitable power supply (e.g., a predetermined power supply, such as, a first power supply and a second power supply). In one or more embodiments, the light source may include at least one light emitting element LD according to any one of the embodiments of FIGS. 1 and 2, e.g., sub-miniature columnar light emitting elements LD having a small size ranging from the nanometer scale to the micrometer scale. However, the present disclosure is not limited thereto. In addition, various types of light emitting elements LD may be used as the light source of the pixel PXL.

Furthermore, the pixel PXL may have a structure according to at least one of embodiments which will be described below. For example, each pixel PXL may have a structure to which any one of the following embodiments is applied, or may have a structure to which at least two embodiments are applied in combination.

In one or more embodiments, the pixel PXL may be configured as an active pixel, but is not limited thereto. For example, the pixel PXL may be formed as a pixel of passive or active light emitting display devices having various structures and/or driving methods.

Figure 4:
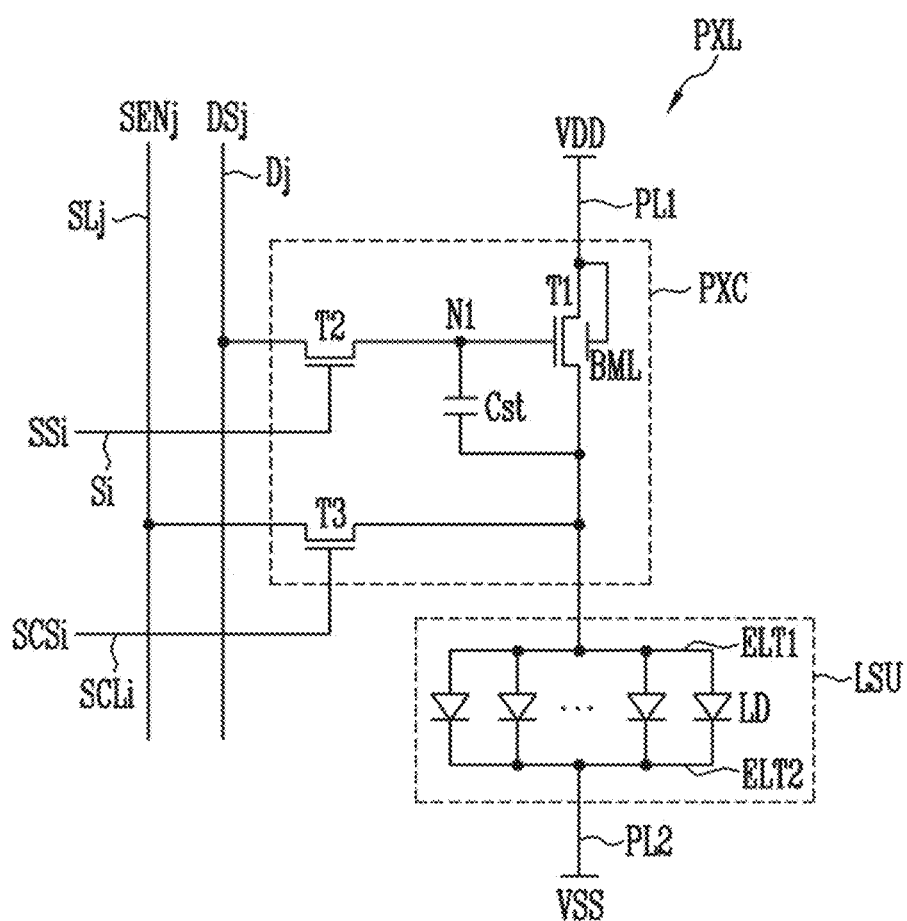
FIG. 4 is a circuit diagram illustrating a pixel in accordance with one or more embodiments of the present disclosure.

FIG. 4 is a circuit diagram illustrating a pixel in accordance with one or more embodiments of the present disclosure.

Referring to FIG. 4, the pixel PXL may include an emission component LSU that generates light having luminance corresponding to a data signal, and a pixel circuit PXC that drives the emission component LSU.

The emission component LSU may include at least one light emitting element LD connected between a first power supply VDD and a second power supply VSS. For example, the emission component LSU may include a first electrode ELT1 connected to the first power supply VDD via the pixel circuit PXC and a first power line PL1, a second electrode ELT2 connected to the second power supply VSS via a second power line PL2, and a plurality of light emitting elements LD electrically connected between the first electrode ELT1 and the second electrode ELT2. In one or more embodiments, the first electrode ELT1 may be an anode electrode, and the second electrode ELT2 may be a cathode electrode.

Each of the light emitting elements LD may include a first end connected to the first power supply VDD through the first electrode ELT1 and/or the pixel circuit PXC, and a second end connected to the second power supply VSS through the second electrode ELT2. In other words, the light emitting elements LD may be connected in a forward direction between the first and second electrodes ELT1 and ELT2. Each light emitting element LD connected in the forward direction between the first power supply VDD and the second power supply VSS may form a valid light source. These valid light sources may be gathered to form the emission component LSU of the pixel PXL.

The first and second power supplies VDD and VSS may have different potentials to allow the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least a light emitting period of the pixel PXL.

First ends of the light emitting elements LD forming each emission component LSU may be connected in common to the pixel circuit PXC through one electrode (e.g. the first electrode ELT1 of each pixel PXL) of the emission component LSU, and may be connected to the first power supply VDD through the pixel circuit PXC and the first power line PL1. The second ends of the light emitting elements LD may be connected in common to the second power supply VSS through another electrode (e.g. the second electrode ELT2 of each pixel PXL) of the emission component LSU and the second power line PL2.

The light emitting elements LD may emit light having a luminance corresponding to driving current supplied through the corresponding pixel circuit PXC. For example, during each frame period, the pixel circuit PXC may supply driving current corresponding to a gray scale value that is to be expressed in the corresponding frame to the emission component LSU. The driving current supplied to the emission component LSU may separately flow into the light emitting elements LD connected in a forward direction. Hence, each of the light emitting elements LD may emit light having a luminance corresponding to current applied thereto, while the emission component LSU may emit light having a luminance corresponding to the driving current.

The pixel circuit PXC may be connected between the first power supply VDD and the first electrode ELT1. The pixel circuit PXC may be connected to a scan line Si and a data line Dj of the corresponding pixel PXL. For example, if the pixel PXL is disposed on an i-th horizontal line (row) (i is a natural number) and a j-th vertical line (column) (j is a natural number) of the display area DA, the pixel circuit PXC may be connected to an i-th scan line Si and a j-th data line Dj of the display area DA.

In one or more embodiments, the pixel circuit PXC may include a plurality of transistors T1, T2, and T3, and at least one storage capacitor Cst.

The first transistor T1 may be connected between the first power supply VDD and the emission component LSU. For example, the first electrode (e.g., drain electrode) of the first transistor T1 may be connected to the first power supply VDD, and the second electrode (e.g., source electrode) of the first transistor T1 may be connected to the first electrode ELT1. A gate electrode of the first transistor T1 may be connected to the first node N1. The first transistor T1 may control a driving current supplied to the emission component LSU in response to the voltage of the first node N1. In other words, the first transistor T1 may be a drive transistor that controls the driving current of the pixel PXL.

In one or more embodiments, the first transistor T1 may further include a lower conductive layer BML (also referred to as a "lower electrode", a "back gate electrode", or a "lower light shielding layer"). The gate electrode and the lower conductive layer BML of the first transistor T1 may overlap each other with an insulating layer interposed therebetween. The lower conductive layer BML may be connected to one electrode of the first transistor T1, e.g., a source electrode or a drain electrode.

In case that the first transistor T1 includes the lower conductive layer BML, it is possible to apply a back-biasing technique (or sync technique) in which a back-biasing voltage is applied to the lower conductive layer BML of the first transistor T1, when the pixel PXL is driven, to move the threshold voltage of the first transistor T1 in a negative or positive direction. For example, by connecting the lower conductive layer BML to the source electrode of the first transistor T1 and then applying source-sync technique, the threshold voltage of the first transistor T1 may be moved in a negative or positive direction. Further, in case that the lower conductive layer BML is disposed under the semiconductor pattern forming a channel of the first transistor T1, the operation characteristics of the first transistor T1 may be stabilized while the lower conductive layer BML serves as a light shielding pattern. However, the function and/or utilization method of the lower conductive layer BML is not limited thereto.

The second transistor T2 may be connected between the data line Dj and the first node N1. For example, a first electrode of the second transistor T2 may be connected to the data line Dj, and a second electrode of the second transistor T2 may be connected to the first node N1. A gate electrode of the second transistor T2 may be connected to the scan line Si. When a scan signal SSi of a gate-on voltage (e.g., a high level voltage) is supplied from the scan line Si, the second transistor T2 may be turned on to electrically connect the first node N1 to the data line Dj.

For each frame period, the data signal DSj of the corresponding frame may be supplied to the data line Dj. The data signal DSj may be transferred to the first node N1 through the second transistor T2 that is turned on for a period when the scan signal SSi of the gate-on voltage is supplied. In other words, the second transistor T2 may be a switching transistor configured to transmit each data signal DSj into the pixel PXL.

The third transistor T3 may be connected between the first transistor T1 and the sensing line SLj. For example, one electrode of the third transistor T3 may be connected to a second electrode (e.g., a source electrode) of the first transistor T1 connected to the first electrode ELT1, and another electrode of the third transistor T3 may be connected to the sensing line SLj. When the sensing line SLj is omitted, another electrode of the third transistor T3 may be connected to the data line Dj.

A gate electrode of the third transistor T3 may be connected to a sensing control line SCLi. When the sensing control line SCLi is omitted, the gate electrode of the third transistor T3 may be connected to the scan line Si. The third transistor T3 is turned on by the sensing control signal SCSi of the gate-on voltage (e.g. high level voltage) supplied to the sensing control line SCLi for a sensing period (e.g., a set or predetermined sensing period), thus electrically connecting the sensing line SLj and the first transistor T1.

In one or more embodiments, the sensing period may be a period for extracting characteristics (e.g., the threshold voltage of the first transistor T1) of each of the pixels PXL disposed in the display area DA. During the sensing period, a reference voltage (e.g., a set or predetermined reference voltage) for turning on the first transistor T1 may be supplied to the first node N1 through the data line Dj and the second transistor T2, or each pixel PXL may be connected to a current source or the like, thus turning on the first transistor T1. Further, the first transistor T1 may be connected to the sensing line SLj via the third transistor T3 when the sensing control signal SCSi of the gate-on voltage is supplied to the third transistor T3 to turn on the third transistor T3. Thereafter, the sensing signal SENj may be obtained through the sensing line SLj, and the characteristics of each pixel PXL including the threshold voltage of the first transistor T1 may be detected using the sensing signal SENj. Information on the characteristics of each pixel PXL may be used to convert image data so that a characteristic deviation between the pixels PXL disposed in the display area DA may be compensated.

One electrode of the storage capacitor Cst may be connected to the second electrode of the first transistor T1, while the other electrode thereof may be connected to the first node N1. Such a storage capacitor Cst may charge a voltage (or holds a charge) corresponding to the data signal DSj supplied to the first node N1 during each frame period.

Further, although FIG. 4 illustrates one or more embodiments in which valid light sources constituting each emission component LSU, i.e., the light emitting elements LD, are connected in parallel, the present disclosure is not limited thereto. For example, the emission component LSU of each pixel PXL may be configured to include a serial structure of at least two stages. In this case, the light emitting elements constituting each serial stage may be connected in series to each other by at least one intermediate electrode.

Although FIG. 4 illustrates that all of the transistors included in the pixel circuit PXC are n-type transistors, the present disclosure is not limited thereto. For example, at least one of the first to third transistors T1, T2, and T3 may be changed to a p-type transistor.

Furthermore, the structure and driving method of the pixel PXL may be changed in various ways. For instance, the pixel circuit PXC may be a pixel circuit that may have various structures and/or may be operated in various driving manners, in addition to the embodiment illustrated in FIG. 4.

Figure 5:
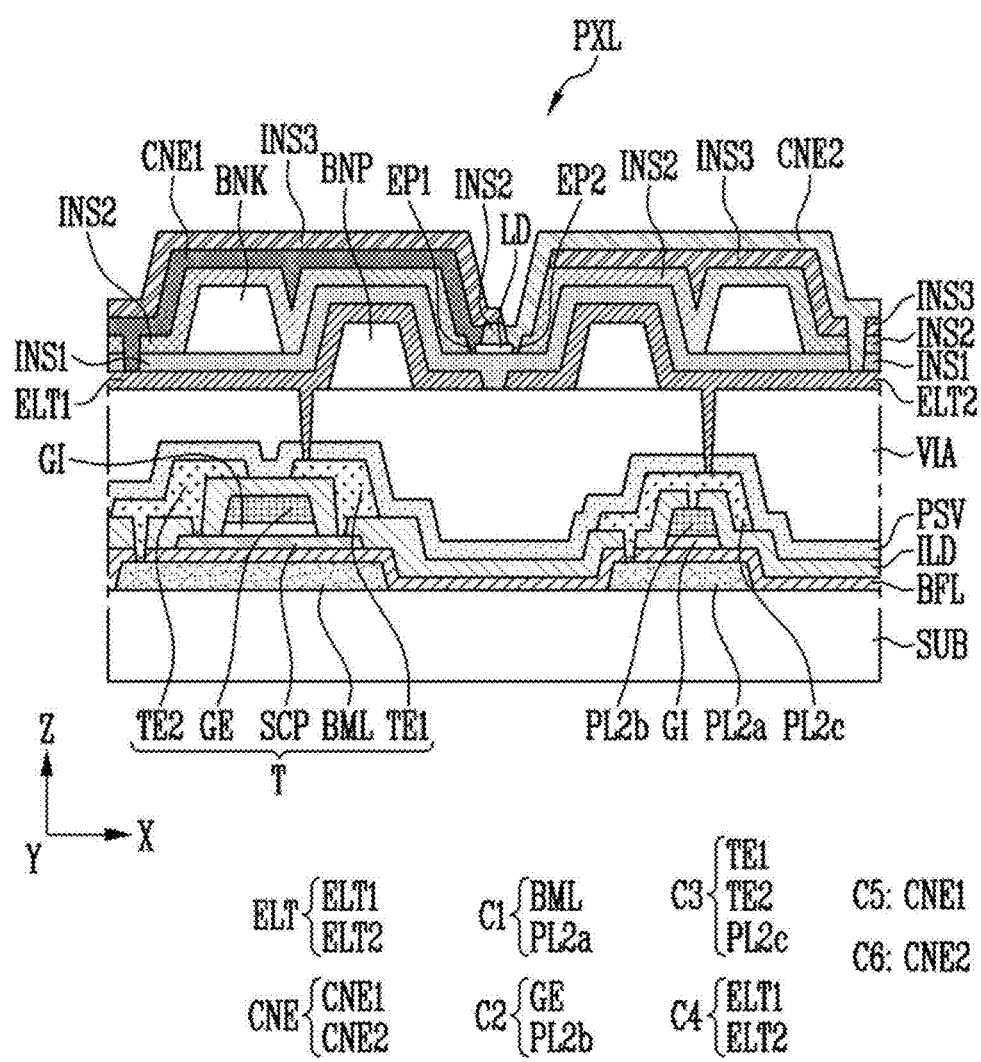
FIG. 5 is a sectional view illustrating a pixel in accordance with one or more embodiments of the present disclosure.

FIG. 5 is a sectional view illustrating a pixel in accordance with one or more embodiments of the present disclosure.

FIG. 5 illustrates a first transistor T1 among various circuit elements constituting the pixel circuit PXC (FIG. 4). When there is no need to separately describe the first to third transistors T1, T2, and T3, they will be collectively referred to as a "transistor T." The structure and/or the position of each layer of the transistor T is not limited to the embodiment shown in FIG. 5, and may be variously changed according to one or more embodiments.

Referring to FIG. 5, circuit elements including transistors T constituting the pixel circuit PXC and various wirings connected thereto may be disposed on the pixels PXL and the substrate SUB of the display panel PNL including the pixels PXL according to one or more embodiments. First and second electrodes ELT1 and ELT2 (also referred to as "alignment electrodes") constituting the emission component LSU, light emitting elements LD, and/or first and second connection electrodes CNE1 and CNE2 may be disposed on the circuit elements. Hereinafter, when comprehensively referring to the first and second electrodes ELT1 and ELT2 or arbitrarily referring to at least one electrode, they are referred to as "electrodes ELT" or an "electrode ELT." When comprehensively referring to the first and second connection electrodes CNE1 and CNE2 or arbitrarily referring to at least one connection electrode, they are referred to as "connection electrodes CNE" or a "connection electrode CNE."

The substrate SUB may form a base member, and may be a rigid or soft substrate or film. For example, the substrate SUB may be a rigid substrate made of glass or reinforced glass, a soft substrate (or a thin film) made of plastic or metal material, or at least one insulating layer. The material and/or physical properties of the substrate SUB may not be particularly limited. In one or more embodiments, the substrate SUB may be substantially transparent. Here, the expression "substantially transparent" may mean that light may be transmitted (through the substrate SUB (e.g., light may be transmitted with a predetermined transmittance through the substrate SUB)). In one or more embodiments, the substrate SUB may be translucent or opaque. Furthermore, in one or more embodiments, the substrate SUB may include reflective material.

A first conductive layer C1 may be disposed on the substrate SUB. The first conductive layer C1 may include a lower conductive layer BML of the transistor T and a first power conductive layer PL2a. The lower conductive layer BML and the first power conductive layer PL2a may be disposed on (or at) the same layer. For example, the lower conductive layer BML and the first power conductive layer PL2a may be concurrently (or simultaneously) formed in the same process, but the present disclosure is not limited thereto. The first power conductive layer PL2a may form a second power line PL2 described with reference to FIG. 4 and the like.

The first conductive layer C1 may be formed as a single- or multi-layered structure including at least one of molybdenum (Mo), copper (Cu), aluminum (Al), chrome (Cr), gold (Au), titanium (Ti), nickel (Ni), neodymium (Nd), or indium-tin oxide (ITO), or an alloy thereof.

A buffer layer BFL may be disposed on the first conductive layer C1. The buffer layer BFL may prevent impurities from diffusing into the circuit element. The buffer layer BFL may be formed as a single layer, or may be formed as multiple layers having at least two or more layers. In case that the buffer layer BFL is formed as the multilayer structure, the respective layers may be formed of the same material or different materials.

A semiconductor pattern SCP may be disposed on the buffer layer BFL. For instance, the semiconductor pattern SCP may include a first area that comes into contact with the first transistor electrode TE1, a second area that comes into contact with the second transistor electrode TE2, and a channel area disposed between the first and second areas. In one or more embodiments, one of the first and second areas may be a source area, and the other one may be a drain area.

In one or more embodiments, the semiconductor pattern SCP may be formed of polysilicon, amorphous silicon, an oxide semiconductor, etc. The channel area of the semiconductor pattern SCP may be an intrinsic semiconductor, which is an undoped semiconductor pattern. Each of the first and second areas of the semiconductor pattern SCP may be a semiconductor doped with a suitable impurity (e.g., a predetermined impurity).

A gate insulating layer GI may be disposed on the buffer layer BFL and the semiconductor pattern SCP. For example, the gate insulating layer GI may be disposed between the semiconductor pattern SCP and the gate electrode GE of the transistor T. Also, the gate insulating layer GI may be disposed between the buffer layer BFL and the second power conductive layer PL2b. The gate insulating layer GI may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A second conductive layer C2 may be disposed on the gate insulating layer GI. The second conductive layer C2 may include the gate electrode GE of the transistor T and the second power conductive layer PL2b. The gate electrode GE and the second power conductive layer PL2b may be disposed on the same layer. For example, the gate electrode GE and the second power conductive layer PL2b may be concurrently (or simultaneously) formed in the same process, but the present disclosure is not limited thereto. The gate electrode GE may be disposed to overlap the semiconductor pattern SCP in a third direction (e.g., a Z-axis direction or a thickness direction of the substrate SUB) on the gate insulating layer GI. The second power conductive layer PL2b may be disposed to overlap the first power conductive layer PL2a in the third direction (e.g., the Z-axis direction) on the gate insulating layer GI. The second power conductive layer PL2b and the first power conductive layer PL2a may form a second power line PL2 described with reference to FIG. 4 and the like.

The second conductive layer C2 may be formed as a single- or multi-layered structure including at least one of titanium (Ti), copper (Cu), indium-tin oxide (ITO), molybdenum (Mo), chrome (Cr), gold (Au), nickel (Ni), or neodymium (Nd), or an alloy thereof. For example, the second conductive layer C2 may be formed as a multi-layered structure in which titanium (Ti), copper (Cu), and/or indium tin oxide (ITO) are sequentially or repeatedly stacked. A detailed description thereof will be described later with reference to FIGS. 9 and 10.

An interlayer insulating layer ILD may be disposed on the second conductive layer C2. For example, the interlayer insulating layer ILD may be disposed between the gate electrode GE and the first and second transistor electrodes TE1 and TE2. Further, the interlayer insulating layer ILD may be disposed between the second power conductive layer PL2b and a third power conductive layer PL2c.

The first interlayer insulating layer ILD may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A third conductive layer C3 may be disposed on the interlayer insulating layer ILD. The third conductive layer C3 may include the first and second transistor electrodes TE1 and TE2 of the transistor T and the third power conductive layer PL2c. The first and second transistor electrodes TE1 and TE2 and the third power conductive layer PL2c may be disposed on the same layer. For example, the first and second transistor electrodes TE1 and TE2 and the third power conductive layer PL2c may be concurrently (or simultaneously) formed in the same process, but the present disclosure is not limited thereto.

The first and second transistor electrodes TE1 and TE2 may be disposed to overlap the semiconductor pattern SCP in the third direction (e.g., the Z-axis direction). The first and second transistor electrodes TE1 and TE2 may be electrically connected to the semiconductor pattern SCP. For example, the first transistor electrode TE1 may be electrically connected to a first area of the semiconductor pattern SCP through a contact hole formed through the interlayer insulating layer ILD. The second transistor electrode TE2 may be electrically connected to a second area of the semiconductor pattern SCP through a contact hole formed through the interlayer insulating layer ILD. Further, the second transistor electrode TE2 may be electrically connected to the lower conductive layer BML through a contact hole formed through the interlayer insulating layer ILD and the buffer layer BFL. According to one or more embodiments, one of the first and second transistor electrodes TE1 and TE2 may be a source electrode, and the other one may be a drain electrode.

The third power conductive layer PL2c may be disposed to overlap the first power conductive layer PL2a and/or the second power conductive layer PL2b in the third direction (e.g., the Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole formed through the interlayer insulating layer ILD and the buffer layer BFL. Further, the third power conductive layer PL2c may be electrically connected to the second power conductive layer PL2b through a contact hole formed through the interlayer insulating layer ILD. The third power conductive layer PL2c may form a second power line PL2 described with reference to FIG. 4 and the like, along with the first power conductive layer PL2a and/or the second power conductive layer PL2b.

The third conductive layer C3 may be formed as a single- or multi-layered structure including at least one of aluminum (Al), molybdenum (Mo), chrome (Cr), gold (Au), titanium (Ti), nickel (Ni), neodymium (Nd), or indium-tin oxide (ITO), or an alloy thereof.

A passivation layer PSV may be disposed on the third conductive layer C3. The passivation layer PSV may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A via layer VIA may be disposed on the passivation layer PSV. The via layer VIA may be formed of an organic material to planarize a lower step. For example, the via layer VIA may include organic material such as acrylates resin, epoxy resin, phenolic resin, polyamides resin, polyimides resin, polyesters resin, polyphenylene sulfides resin, or benzocyclobutene (BCB). However, without being limited thereto, the via layer VIA may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Bank patterns BNP may be disposed on the via layer VIA. According to one or more embodiments, the bank patterns BNP may have various shapes. In one or more embodiments, the bank patterns BNP may have a shape protruding in the third direction (e.g., the Z-axis direction) on the substrate SUB. Further, the bank patterns BNP may be formed to have an inclined surface which is inclined at an angle (e.g., a predetermined angle) with the substrate SUB. However, the present disclosure is not necessarily limited thereto, and the bank patterns BNP may have sidewalls each having the shape of a curved surface or a stepped shape. For instance, each of the bank patterns BNP may have a semi-circular or semi-elliptical cross-section.

The electrodes and insulating layers disposed above the bank patterns BNP may have a shape corresponding to that of the bank patterns BNP. For instance, the first and second electrodes ELT1 and ELT2 disposed on the bank patterns BNP may include an inclined surface or a curved surface having a shape corresponding to that of the bank patterns BNP. Thus, the bank patterns BNP may function as a reflective member that guides light emitted from the light emitting elements LD together with the first and second electrodes ELT1 and ELT2 provided thereon in the front direction of the pixel PXL (or the image display direction of the display panel PNL), that is, in the third direction (e.g., the Z-axis direction) to improve the light output efficiency of the display panel PNL.

The bank patterns BNP may include at least one organic material and/or inorganic material. For example, the bank patterns BNP may include organic material such as acrylates resin, epoxy resin, phenolic resin, polyamides resin, polyimides resin, polyesters resin, polyphenylene sulfides resin, or benzocyclobutene (BCB). However, without being limited thereto, the bank patterns BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A fourth conductive layer C4 may be disposed on the via layer VIA and the bank patterns BNP. The fourth conductive layer C4 may include first and second electrodes ELT1 and ELT2. The first and second electrodes ELT1 and ELT2 may be disposed in the pixel PXL to be spaced from each other. The first and second electrodes ELT1 and ELT2 may be formed on the same layer. For example, the first and second electrodes ELT1 and ELT2 may be concurrently (or simultaneously) formed in the same process, but the present disclosure is not limited thereto.

The first electrode ELT1 may be electrically connected to the first transistor electrode TE1 of the transistor T through the contact hole formed through the via layer VIA and the passivation layer PSV. The second electrode ELT2 may be electrically connected to the third power conductive layer PL2c through the contact hole formed through the via layer VIA and the passivation layer PSV.

The first and second electrodes ELT1 and ELT2 may receive an alignment signal in an alignment step of the light emitting elements LD. Thus, an electric field may be formed between the first and second electrodes ELT1 and ELT2 to allow the light emitting elements LD provided to the pixels PXL to be aligned between the first and second electrodes ELT1 and ELT2

The fourth conductive layer C4 may include at least one conductive material. For example, the fourth conductive layer C4 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy containing the same, and at least one conductive material among conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and conductive polymers such as PEDOT, but the present disclosure is not necessarily limited thereto.

A first insulating layer INS1 may be disposed on the fourth conductive layer C4. The first insulating layer INS1 may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The bank BNK may be disposed on the first insulating layer INS1. The bank BNK may form a dam structure defining an emission area to which the light emitting elements LD are to be supplied, in the step of supplying the light emitting elements LD to the pixels PXL, respectively. For example, a desired type and/or amount of light-emitting-element ink may be supplied to the area defined by the bank BNK.

The bank BNK may include organic material such as acrylates resin, epoxy resin, phenolic resin, polyamides resin, polyimides resin, polyesters resin, polyphenylene sulfides resin, or benzocyclobutene (BCB). However, without being limited thereto, the bank BNK may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

According to one or more embodiments, the bank BNK may include at least one light shielding and/or reflective material. Therefore, light leakage may be prevented between adjacent pixels PXL. For example, the bank BNK may include at least one black matrix material and/or color filter material. For example, the bank BNK may be formed in a black opaque pattern capable of blocking light transmission. In one or more embodiments, a reflective film may be formed on a surface (e.g., a sidewall) of the bank BNK to increase the optical efficiency of each pixel PXL.

The light emitting elements LD may be disposed on the first insulating layer INS1. The light emitting elements LD may be disposed between the first and second electrodes ELT1 and ELT2 on the first insulating layer INS1. The light emitting elements LD may be prepared in a dispersed form in the light-emitting-element ink, and may be supplied to the pixels PXL, respectively, through an inkjet printing method or the like. For example, the light emitting elements LD may be dispersed in a volatile solvent and supplied to the pixels PXL, respectively. Subsequently, if an alignment signal (or voltage) is supplied to the first and second electrodes ELT1 and ELT2, an electric field may be formed between the first and second electrodes ELT1 and ELT2, whereby the light emitting elements LD may be aligned between the first and second electrodes ELT1 and ELT2. After the light emitting elements LD have been aligned, the solvent may be removed by a volatilization method or other methods. Thereby, the light emitting elements LD may be reliably arranged between the first and second electrodes ELT1 and ELT2.

The second insulating layer INS2 may be disposed on the first insulating layer INS1 and the light emitting elements LD. For instance, the second insulating layer INS2 may be partially disposed on the first insulating layer INS1 and the light emitting elements LD, and may expose the first and second ends EP1 and EP2 of the light emitting elements LD. In case that the second insulating layer INS2 is formed on the light emitting elements LD after the alignment of the light emitting elements LD is completed, it is possible to prevent the light emitting elements LD from being dislodged from the alignment position.

The second insulating layer INS2 may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second connection electrodes CNE1 and CNE2 may be respectively disposed on the first and second ends EP1 and EP2 of the light emitting elements LD exposed by the second insulating layer INS2. The first connection electrode CNE1 may be directly disposed on the first ends EP1 of the light emitting elements LD to contact the first ends EP1 of the light emitting elements LD. Further, the second connection electrode CNE2 may be directly disposed on the second ends EP2 of the light emitting elements LD to contact the second ends EP2 of the light emitting elements LD. Further, the first connection electrode CNE1 may be electrically connected to the first electrode ELT1 through a contact hole formed through the second insulating layer INS2 and the first insulating layer INS1. The second connection electrode CNE2 may be electrically connected to the second electrode ELT2 through a contact hole formed through a third insulation layer INS3, the second insulating layer INS2, and the first insulating layer INS1.

In one or more embodiments, the first and second connection electrodes CNE1 and CNE21 may be disposed on different layers. For instance, as shown in FIG. 5, the first connection electrode CNE1 may formed as a fifth conductive layer C5, and the second connection electrode CNE2 may be formed as a sixth conductive layer C6. A third insulating layer INS3 may be further disposed between the fifth conductive layer C5 and the sixth conductive layer C6. The third insulating layer INS3 may cover the first connection electrode CNE1 formed as the fifth conductive layer C5, and expose the second ends EP2 of the light emitting elements LD. The second connection electrode CNE2 formed as a sixth conductive layer C6 may be disposed on the second end EP2 of the light emitting element LD exposed by the third insulating layer INS3. As such, in case that the third insulating layer INS3 is disposed between the first and second connection electrodes CNE1 and CNE2 formed as different conductive layers, electrical stability between the first and second ends EP1 and EP2 of the light emitting elements LD may be secured because the first and second connection electrodes CNE1 and CNE2 may be reliably separated by the third insulating layer INS3. The third insulating layer INS3 may also be disposed between the second connection electrode CNE2 and the second insulation layer INS2.

The fifth conductive layer C5 and/or the sixth conductive layer C6 may be formed of various transparent conductive materials. For instance, the fifth conductive layer C5 and/or the sixth conductive layer C6 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparently or translucently formed to satisfy a desired light transmittance (e.g., a predetermined light transmittance). Thus, light emitted from the first and second ends EP1 and EP2 of the light emitting elements LD may pass through the first and second connection electrodes CNE1 and CNE2 to be emitted to the outside of the display panel PNL.

The third insulating layer INS3 may be formed as a single- or multi-layered structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Hereinafter, one or more embodiments of the pixel will be described. In the following embodiment, the same components as those already described will be denoted by the same reference numerals, and duplicated descriptions will be omitted or simplified.

Figure 6:
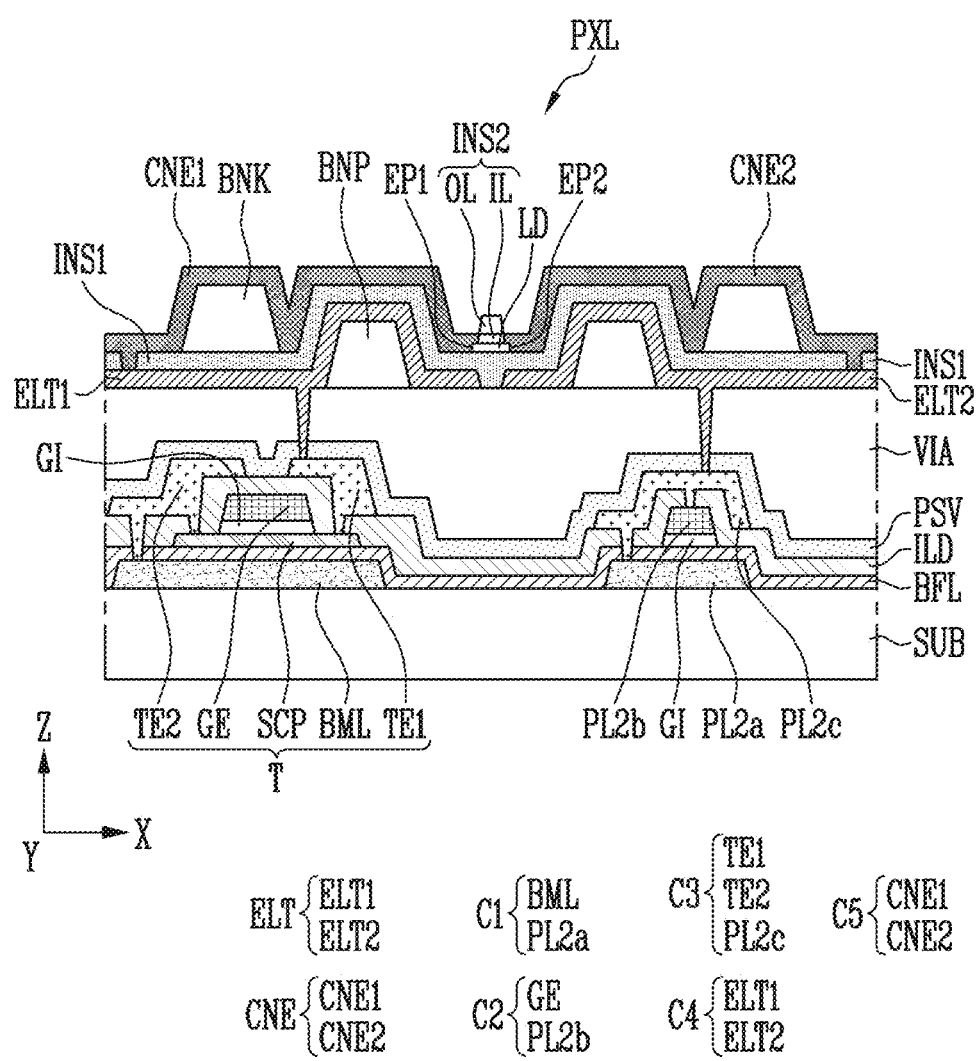
FIG. 6 is a sectional view illustrating a pixel in accordance with one or more embodiments of the present disclosure.

FIG. 6 is a sectional view illustrating a pixel in accordance with one or more embodiments of the present disclosure.

Referring to FIG. 6, the pixel PXL according to one or more embodiments is different from the embodiment of FIG. 5 in that the first and second connection electrodes CNE1 and CNE2 are disposed on the same layer.

For example, each of the first and second connection electrodes CNE1 and CNE2 may be formed as a fifth conductive layer C5. For example, the first and second connection electrodes CNE1 and CNE2 may be concurrently (or simultaneously) formed in the same process, but the present disclosure is not limited thereto.

A second insulating layer INS2 for reliably separating the first and second connection electrodes CNE1 and CNE2 may be disposed on the light emitting elements LD. The second insulating layer INS2 may be partially disposed on the light emitting elements LD, and may expose the first and second ends EP1 and EP2 of the light emitting elements LD.

In one or more embodiments, the second insulating layer INS2 may be provided in a structure in which an inorganic layer IL and an organic layer OL are sequentially stacked on the light emitting elements LD. For example, the inorganic layer IL of the second insulating layer INS2 may be directly disposed on the light emitting elements LD. The organic layer OL of the second insulating layer INS2 may be disposed on the inorganic layer IL. A thickness of the organic layer OL in the third direction (e.g., the Z-axis direction) may be greater than a thickness of the inorganic layer IL in the third direction (e.g., the Z-axis direction). As such, in case that the organic layer OL of the second insulating layer INS2 is thickly formed between the first and second connection electrodes CNE1 and CNE2, electrical stability between the first and second ends EP1 and EP2 of the light emitting elements LD may be secured because the first and second connection electrodes CNE1 and CNE2 may be reliably separated by the second insulating layer INS2. However, the second insulating layer INS2 is not necessarily limited to the structure shown in FIG. 6. For example, according to one or more embodiments, the second insulating layer INS2 may be changed in various ways in a range where the connection electrodes CNE may be separated or disconnected, by omitting the inorganic layer IL, alternately arranging a plurality of inorganic layers IL and organic layers OL, or forming a fine uneven pattern on the organic layer OL.

Hereinafter, a pad area of a display device will be described. In the following embodiment, the same components as those already described will be denoted by the same reference numerals, and duplicated descriptions will be omitted or simplified.

Figure 7:
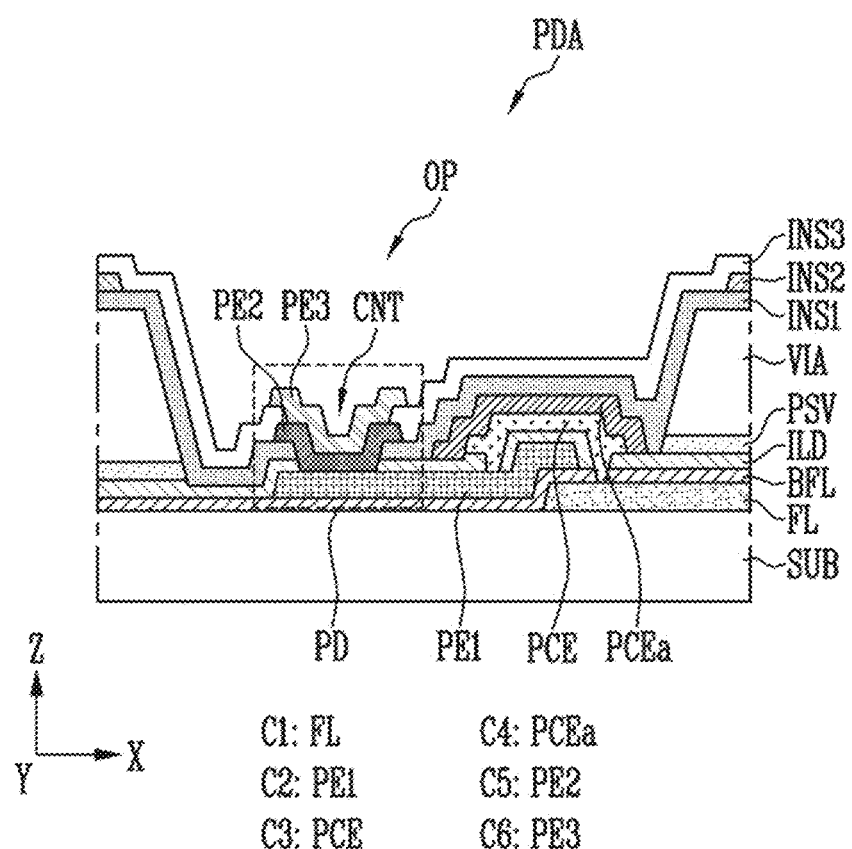
FIGS. 7 and 8 are sectional views illustrating a pad area in accordance with one or more embodiments of the present disclosure.
Figure 8:
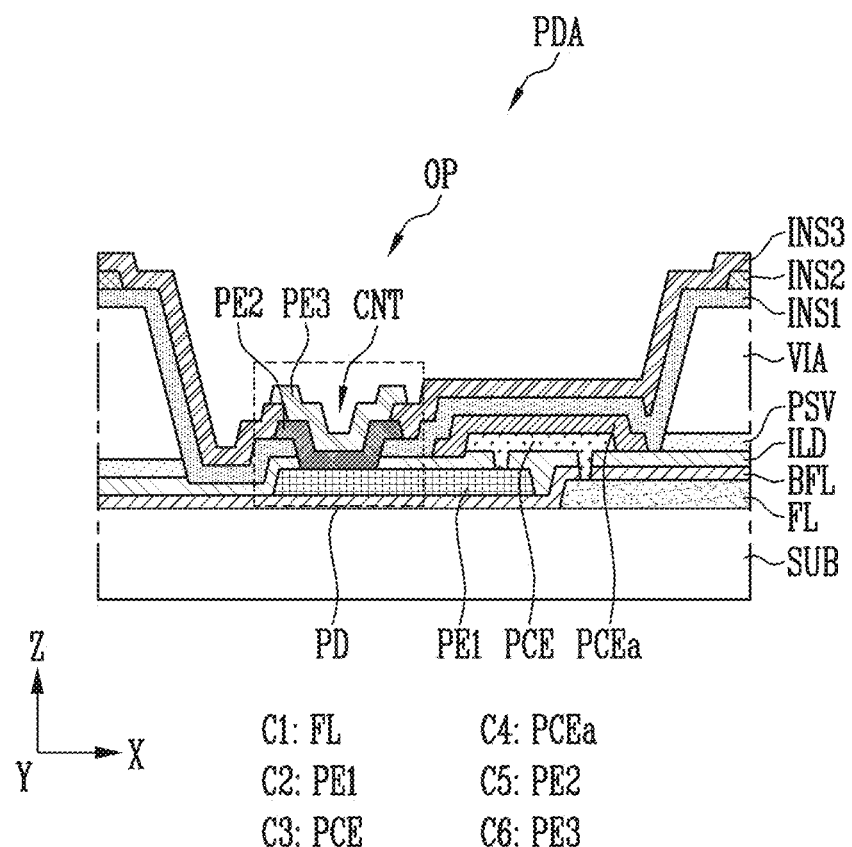

FIGS. 7 and 8 are sectional views illustrating a pad area in accordance with one or more embodiments of the present disclosure.

Referring to FIGS. 7 and 8, a pad component PD including a first pad electrode PE1, a second pad electrode PE2, and/or a third pad electrode PE3, a pad connection electrode PCE, and a fan-out line FL may be disposed in a pad area PDA.

The fan-out line FL may electrically connect pixels PXL and the pad component PD. In other words, the pixels PXL may receive a suitable control signal (e.g., a predetermined control signal) through the fan-out line FL. The fan-out line FL may be formed as the above-described first conductive layer C1. In other words, the fan-out line FL may be disposed between the above-described substrate SUB and the buffer layer BFL.

The buffer layer BFL may be disposed on the fan-out line FL, and the first pad electrode PE1 may be disposed on the buffer layer BFL. For instance, as shown in FIG. 7, the first pad electrode PE1 may at least partially overlap the fan-out line FL in the third direction (e.g., the Z-axis direction). However, the present disclosure is not limited thereto. As shown in FIG. 8, the first pad electrode PE1 may be disposed not to overlap the fan-out line FL.

The first pad electrode PE1 may contact the second pad electrode PE2 to constitute the pad component PD. In one or more embodiments, in order to reduce or minimize contact resistance between the first pad electrode PE1 and the second pad electrode PE2, the first pad electrode PE1 may be formed as a multi-layer structure in which titanium (Ti), copper (Cu), and/or indium tin oxide (ITO) are sequentially or repeatedly stacked. This will be described in detail with reference to FIGS. 9 and 10.

Figure 9:
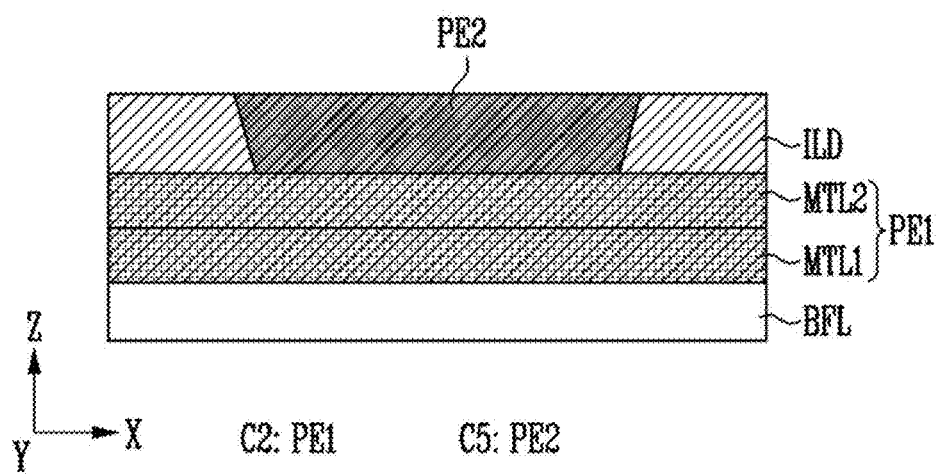
FIGS. 9 and 10 are enlarged sectional views illustrating a first pad electrode of FIG. 7 according to one or more embodiments of the present disclosure.
Figure 10:
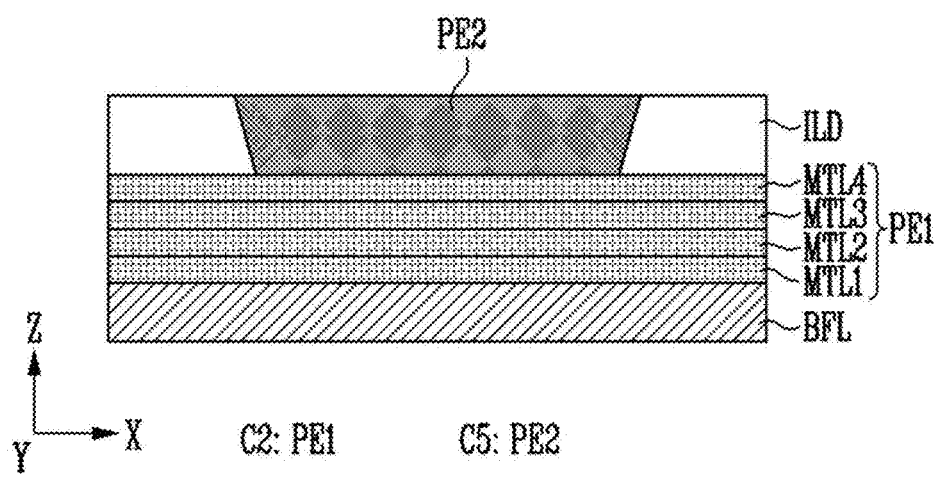

FIGS. 9 and 10 are enlarged sectional views illustrating the first pad electrode of FIG. 7.

Referring to FIG. 9, the first pad electrode PE1 may include first and second electrode layers MTL1 and MTL2. The first and second electrode layers MTL1 and MTL2 may be sequentially stacked on the buffer layer BFL. The first and second electrode layers MTL1 and MTL2 may be formed of different materials. For example, the first electrode layer MTL1 may be made of titanium (Ti) and the second electrode layer MTL2 may be made of copper (Cu), but the present disclosure is not limited thereto. When the first pad electrode PE1 is made of the above-described materials, the second pad electrode PE2 may contact the second electrode layer MTL2 made of copper (Cu). FIG. 9 illustrates a double layer structure composed of titanium (Ti) and copper (Cu), but the present disclosure is not necessarily limited thereto. The first pad electrode PE1 may have a quadruple layer structure in which titanium (Ti) and copper (Cu) are repeatedly stacked.

Referring to FIG. 10, the first pad electrode PE1 may include first to fourth electrode layers MTL1, MTL2, MTL3, and MTL4. The first to fourth electrode layers MTL1, MTL2, MTL3, and MTL4 may be sequentially stacked on the buffer layer BFL. At least some of the first to fourth electrode layers MTL1, MTL2, MTL3, and MTL4 may be formed of the same material. For example, the first electrode layer MTL1 and the third electrode layer MTL3 may be made of the same material, and the second electrode layer MTL2 and the fourth electrode layer MTL4 may be made of different materials. For example, the first electrode layer MTL1 and the third electrode layer MTL3 may be made of titanium (Ti), the second electrode layer MTL2 may be made of copper (Cu), and the fourth electrode layer MTL4 may be made of indium tin oxide (ITO), but the present disclosure is not limited thereto. When the first pad electrode PE1 is made of the above-described materials, the second pad electrode PE2 may contact the fourth electrode layer MTL4 made of indium tin oxide (ITO). As such, when the fourth electrode layer MTL4 forming the uppermost layer of the first pad electrode PE1 is formed of indium tin oxide (ITO), damage by etchant may be more effectively prevented in the process of etching the fourth conductive layer C4 and the like.

As described above, in case that the second pad electrode PE2 is formed of titanium (Ti), copper (Cu), and/or indium tin oxide (ITO), contact resistance with an oxide layer (e.g., an aluminum oxide layer) may be improved, thus solving the heat issue of the pad component PD and a reduction in luminance of the display panel PNL.

Turning back to FIGS. 7 and 8, the first pad electrode PE1 may be formed as the above-described second conductive layer C2. In other words, the first pad electrode PE1 may be disposed between the above-described buffer layer BFL and the interlayer insulating layer ILD.

As such, in case that the first pad electrode PE1 constituting the pad component PD is formed as the second conductive layer C2 (or the gate conductive layer), the first pad electrode PE1 may be protected by the interlayer insulating layer ILD in a subsequent process. For instance, even if the second conductive layer C2 and the third conductive layer C3 of the pad area PDA are exposed through an opening OP of the passivation layer PSV and the via layer VIA, which will be described later, the second conductive layer C2 may be protected by the interlayer insulating layer ILD. Therefore, by forming the first pad electrode PE1 as the second conductive layer C2, it is possible to prevent the first pad electrode PE1 from being damaged by the etchant in the process of etching the fourth conductive layer C4 and the like. A detailed description thereof will be described later with reference to FIGS. 15 to 30.

An interlayer insulating layer ILD may be disposed on the first pad electrode PE1 and the fan-out line FL, and a pad connection electrode PCE may be disposed on the interlayer insulating layer ILD. The pad connection electrode PCE may electrically connect the first pad electrode PE1 and the fan-out line FL.

The pad connection electrode PCE may be formed as the above-described third conductive layer C3. That is, the pad connection electrode PCE may be disposed between the interlayer insulating layer ILD and the passivation layer PSV. In one or more embodiments, the pad connection electrode PCE may be disposed between the interlayer insulating layer ILD and the first insulating layer INS1. In one or more embodiments, a sub-connection electrode PCEa may be disposed between the pad connection electrode PCE and the first insulating layer INS1. One end of the pad connection electrode PCE may be electrically connected to the first pad electrode PE1 through a contact hole formed through the interlayer insulating layer ILD. The other end of the pad connection electrode PCE may be electrically connected to the fan-out line FL through a contact hole formed through the interlayer insulating layer ILD and the buffer layer BFL.

The passivation layer PSV and/or the via layer VIA may be disposed on the interlayer insulating layer ILD. The passivation layer PSV and/or the via layer VIA each may include an opening OP that exposes the pad component PD. For example, the opening OP of the passivation layer PSV and/or the via layer VIA may overlap the first pad electrode PE1, the second pad electrode PE2, the third pad electrode PE3, and/or the pad connection electrode PCE.

The sub-connection electrode PCEa may be disposed on the pad connection electrode PCE. For example, the sub-connection electrode PCEa may be provided on the pad connection electrode PCE in the opening OP of the passivation layer PSV and/or the via layer VIA. The sub-connection electrode PCEa may be directly disposed on the pad connection electrode PCE. For example, the sub-connection electrode PCEa may serve to protect the pad connection electrode PCE in a subsequent process. The sub-connection electrode PCEa may be formed as the above-described fourth conductive layer C4.

The first insulating layer INS1 may be disposed on the sub-connection electrode PCEa, and the second pad electrode PE2 may be disposed on the first insulating layer INS1. The second pad electrode PE2 may contact the above-described first pad electrode PE1 through a contactor CNT passing through the first insulating layer INS1 and the interlayer insulating layer ILD. The second pad electrode PE2 may constitute the pad component PD along with the first pad electrode PE1. The second pad electrode PE2 may be formed as the above-described fifth conductive layer C5.

A second insulating layer INS2 may be disposed on the first insulating layer INS1. The second insulating layer INS2 may include an opening OP which exposes the pad component PD. For example, the opening OP of the second insulating layer INS2 may overlap the first pad electrode PE1, the second pad electrode PE2, the third pad electrode PE3, and/or the pad connection electrode PCE.

A third insulating layer INS3 may be disposed on the second pad electrode PE2, the first insulating layer INS1, and the second insulating layer INS2, and the third pad electrode PE3 may be disposed on the third insulating layer INS3. The third pad electrode PE3 may contact the above-described second pad electrode PE2 through a contactor CNT passing through the third insulating layer INS3. The third pad electrode PE3 may constitute the pad component PD along with the second pad electrode PE2 and/or the first pad electrode PE1. The third pad electrode PE3 may be formed as the above-described sixth conductive layer C6.

According to the above-described embodiment, damage to the first pad electrode PE1 of the pad component PD is prevented, and concurrently (or simultaneously) the contact resistance of the pad component PD is improved, so the heat issue of the pad component PD and the reduction in luminance of the display panel PNL may be solved.

Hereinafter, an embodiment of a pad area will be described. In the following embodiment, the same components as those already described will be denoted by the same reference numerals, and duplicated descriptions will be omitted or simplified.

Figure 11:
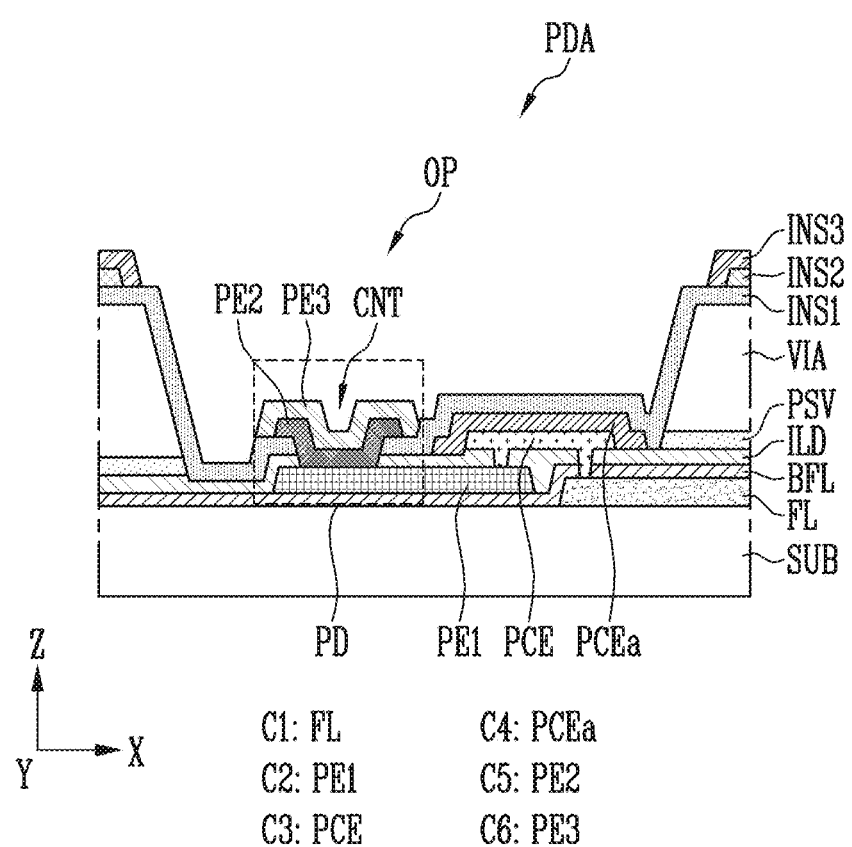
FIG. 11 is a sectional view illustrating a pad area in accordance with one or more embodiments of the present disclosure.

FIG. 11 is a sectional view illustrating a pad area in accordance with one or more embodiments of the present disclosure.

Referring to FIG. 11, the pad area PDA according to this embodiment is different from the embodiment of FIGS. 7 and 8 in that the third insulating layer INS3 includes the opening OP which exposes the pad component PD. For example, the opening OP of the third insulating layer INS3 may overlap the first pad electrode PE1, the second pad electrode PE2, the third pad electrode PE3, and/or the pad connection electrode PCE. As such, in case that the third insulating layer INS3 is opened to expose the pad component PD, the third insulating layer INS3 interposed between the second pad electrode PE2 and the third pad electrode PE3 constituting the pad component PD may be omitted, so that a step of the pad component PD may be reduced or minimized and the pad component may be reliably connected to a circuit board or the like.

Figure 12:
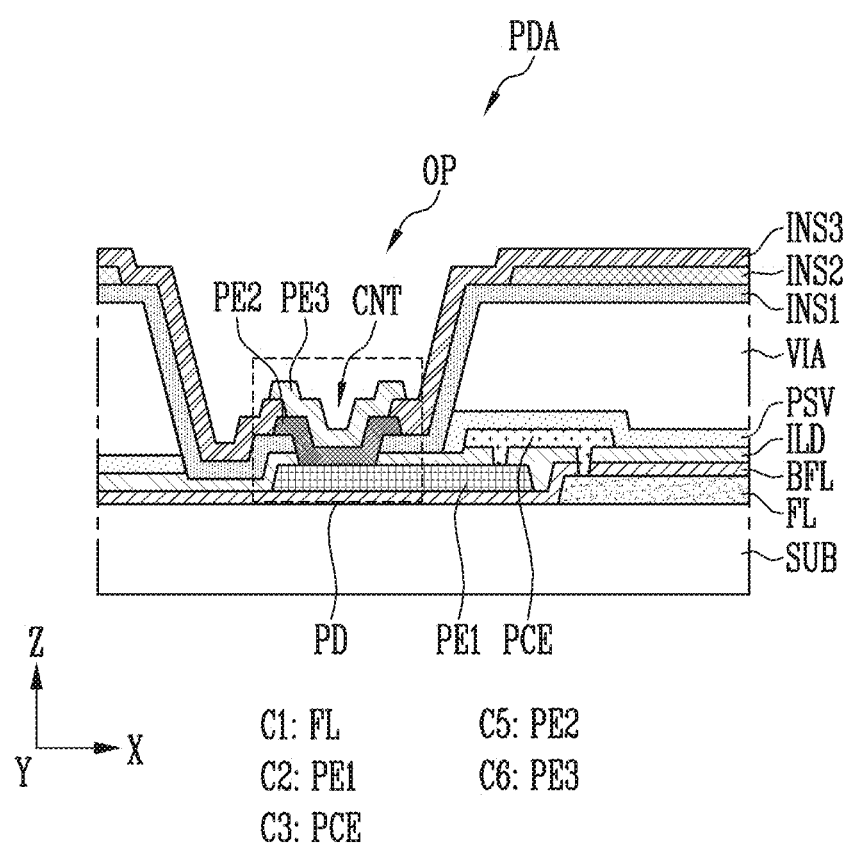
FIG. 12 is a sectional view illustrating a pad area in accordance with one or more embodiments of the present disclosure.

FIG. 12 is a sectional view illustrating a pad area in accordance with one or more embodiments of the present disclosure.

Referring to FIG. 12, the pad area PDA according to this embodiment is different from the embodiment of FIGS. 7 and 8 in that the passivation layer PSV and/or the via layer VIA are disposed on the pad connection electrode PCE.

The passivation layer PSV and/or the via layer VIA may cover the pad connection electrode PCE. In this case, because the pad connection electrode PCE may be protected by the passivation layer PSV and/or the via layer VIA, the sub-connection electrode PCEa (see FIGS. 7 and 8) for protecting the pad connection electrode PCE may be omitted.

The passivation layer PSV and/or the via layer VIA each may include an opening OP that exposes the pad component PD. For example, the opening OP of the passivation layer PSV and/or the via layer VIA may overlap the first pad electrode PE1, the second pad electrode PE2, and/or the third pad electrode PE3.

Figure 13:
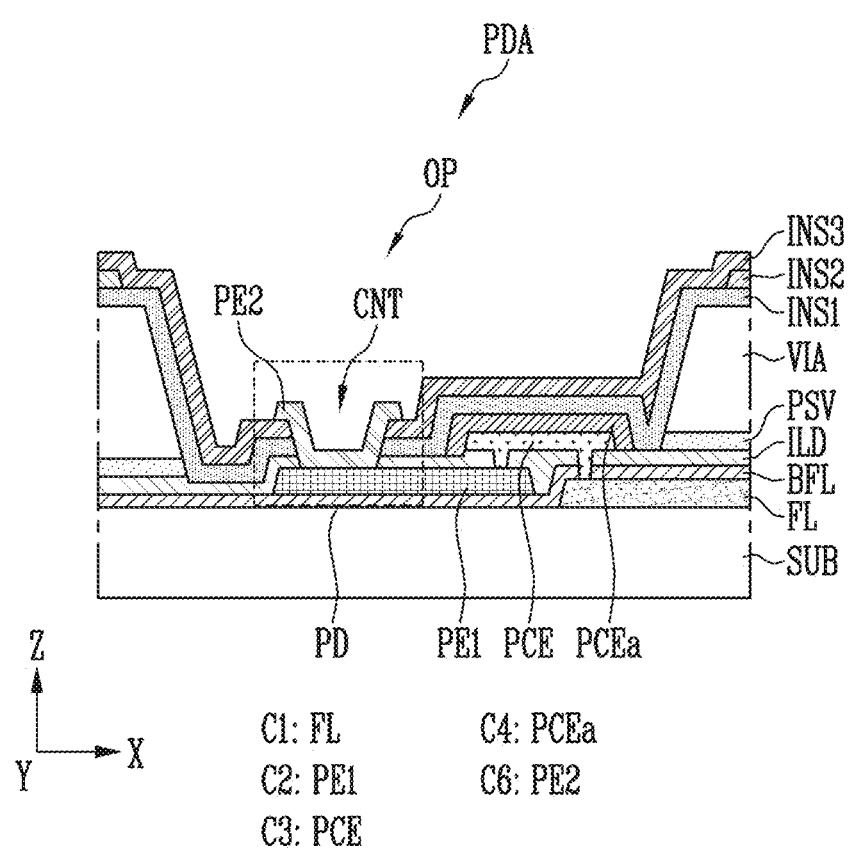
FIG. 13 is a sectional view illustrating a pad area in accordance with one or more embodiments of the present disclosure.

FIG. 13 is a sectional view illustrating a pad area in accordance with one or more embodiments of the present disclosure.

Referring to FIG. 13, the pad area PDA according to this embodiment is different from the embodiment of FIGS. 7 and 8 in that the second pad electrode PE2 is formed as the sixth conductive layer C6 and the third pad electrodes PE3 (see FIGS. 7 and 8) is omitted.

The second pad electrode PE2 may be disposed on the third insulating layer INS3 to contact the first pad electrode PE1 through the contactor CNT passing through the third insulating layer INS3, the first insulating layer INS1, and the interlayer insulating layer ILD. The second pad electrode PE2 may be formed as the above-described sixth conductive layer C6. As such, in case that the second pad electrode PE2 is formed as the sixth conductive layer C6, the contactor CNT is formed by sequentially etching the insulating layers provided at a lower position before the sixth conductive layer C6 is formed, thus protecting the first pad electrode PE1 and effectively removing a residual layer present on the first pad electrode PE1. A detailed description thereof will be described later with reference to FIGS. 37 to 41.

Although FIG. 13 illustrates a case in which the pad connection electrode PCE overlaps the opening OP of the passivation layer PSV and/or the via layer VIA, the present disclosure is not necessarily limited thereto. According to one or more embodiments, the passivation layer PSV and/or the via layer VIA may be disposed on the pad connection electrode PCE. In other words, the passivation layer PSV and/or the via layer VIA may cover the pad connection electrode PCE.

Figure 14:
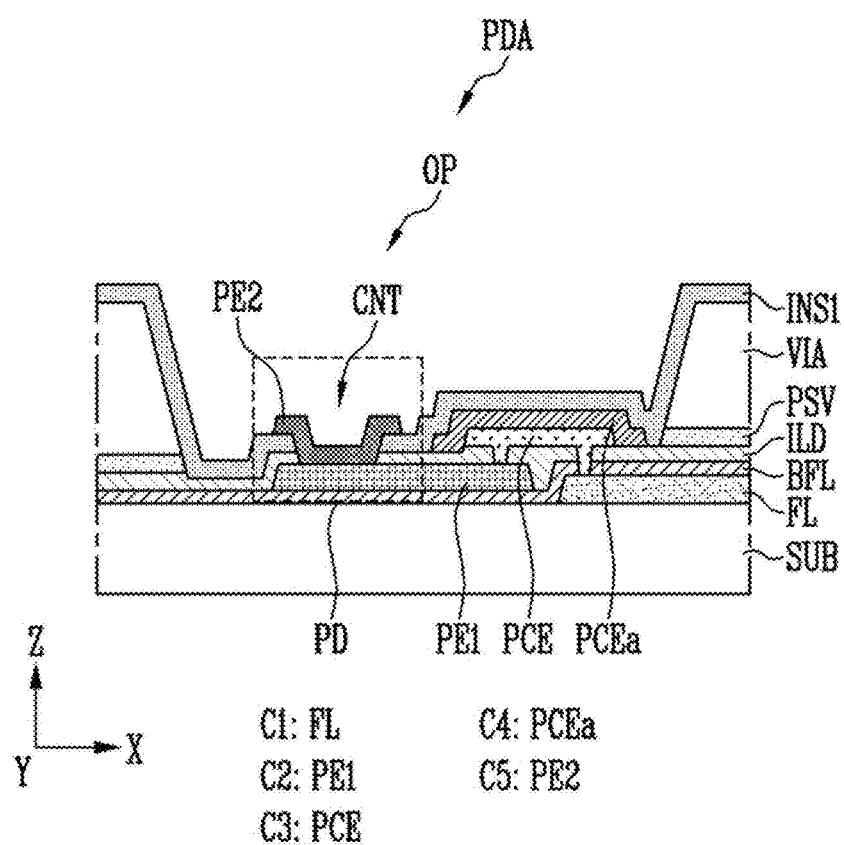
FIG. 14 is a sectional view illustrating a pad area in accordance with one or more embodiments of the present disclosure.

FIG. 14 is a sectional view illustrating a pad area in accordance with one or more embodiments of the present disclosure.

Referring to FIG. 14, the pad area PDA according to this embodiment is different from the embodiment of FIGS. 7 and 8 in that the third insulating layer INS3 (see FIGS. 7 and 8) and the sixth conductive layer C6 (see FIGS. 7 and 8) are omitted.

As described with reference to FIG. 6, in case that the first and second connection electrodes CNE1 and CNE2 are formed as the fifth conductive layer C5, the third insulating layer INS3 and the sixth conductive layer C6 are omitted, so that the third pad electrode PE3 (see FIGS. 7 and 8) of the pad area PDA may be omitted.

The second pad electrode PE2 may contact the first pad electrode PE1 through the contactor CNT passing through the first insulating layer INS1 and the interlayer insulating layer ILD. For instance, the second pad electrode PE2 may be formed as the fifth conductive layer C5 to be disposed on the same layer as the first and second connection electrodes CNE1 and CNE2 illustrated in FIG. 6. The second pad electrode PE2 may be concurrently (or simultaneously) formed with the first and second connection electrodes CNE1 and CNE2 in the same process. As such, in case that the third insulating layer INS3 and the sixth conductive layer C6 are omitted, the number of masks may be reduced and thereby a manufacturing process may be simplified. A detailed description thereof will be described later with reference to FIGS. 42 to 44.

Although FIG. 14 illustrates a case in which the pad connection electrode PCE overlaps the opening OP of the passivation layer PSV and/or the via layer VIA, the present disclosure is not necessarily limited thereto. According to one or more embodiments, the passivation layer PSV and/or the via layer VIA may be disposed on the pad connection electrode PCE. In other words, the passivation layer PSV and/or the via layer VIA may cover the pad connection electrode PCE. Subsequently, a method of manufacturing the display device in accordance with the above-described embodiments will be described.

FIGS. 15 to 30 are sectional views of respective process steps to describe a method of manufacturing a display device in accordance with one or more embodiments of the present disclosure. FIGS. 15 to 30 are sectional views for describing the method of manufacturing the display device of FIGS. 5 and 8. Components that are substantially the same as those of FIGS. 5 and 8 are denoted by the same reference numerals, and a detailed description thereof will be omitted.

Figure 15:
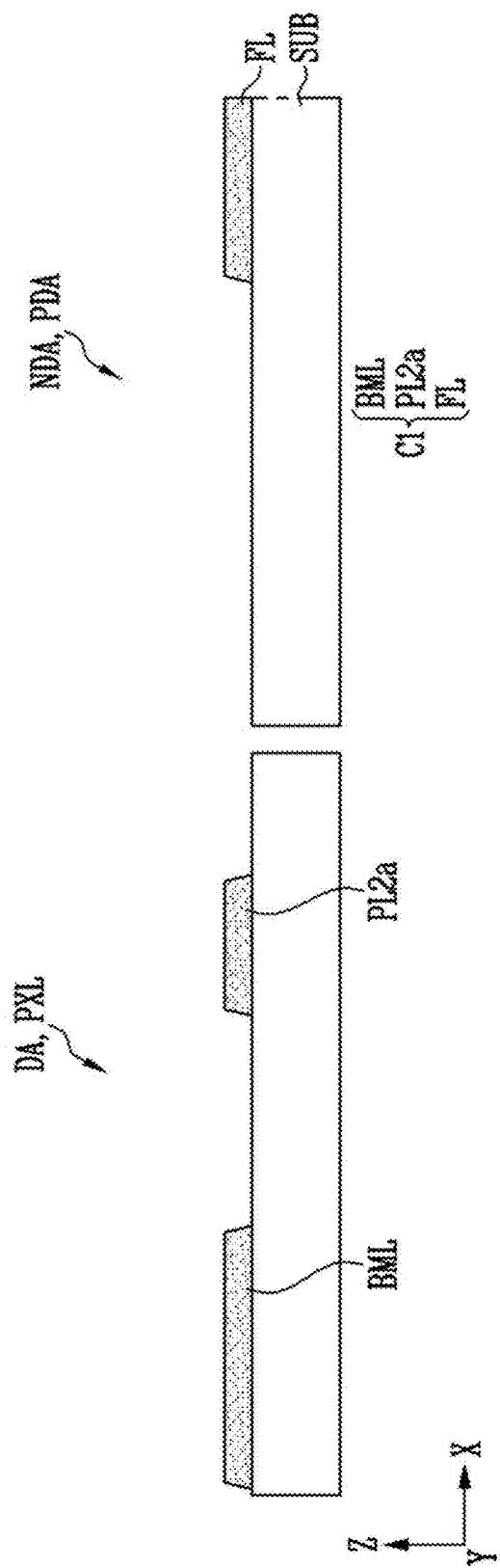
FIGS. 15 to 30 are sectional views of respective process steps to describe a method of manufacturing a display device in accordance with one or more embodiments of the present disclosure.

Referring to FIG. 15, first, the lower conductive layer BML, the first power conductive layer PL2a, and/or the fan-out line FL are formed on the substrate SUB. The lower conductive layer BML and the first power conductive layer PL2a may be provided in the display area DA, e.g., the pixel PXL. The fan-out line FL may be provided in the non-display area NDA, e.g., the pad area PDA. The lower conductive layer BML, the first power conductive layer PL2a, and/or the fan-out line FL may be formed as the first conductive layer C1. The lower conductive layer BML, the first power conductive layer PL2a, and/or the fan-out line FL may be concurrently (or simultaneously) formed in the same process, but the present disclosure is not limited thereto. Here, the 'same process' may mean that it is formed on the same layer or formed of the same material, but the present disclosure is not necessarily limited thereto.

Figure 16:
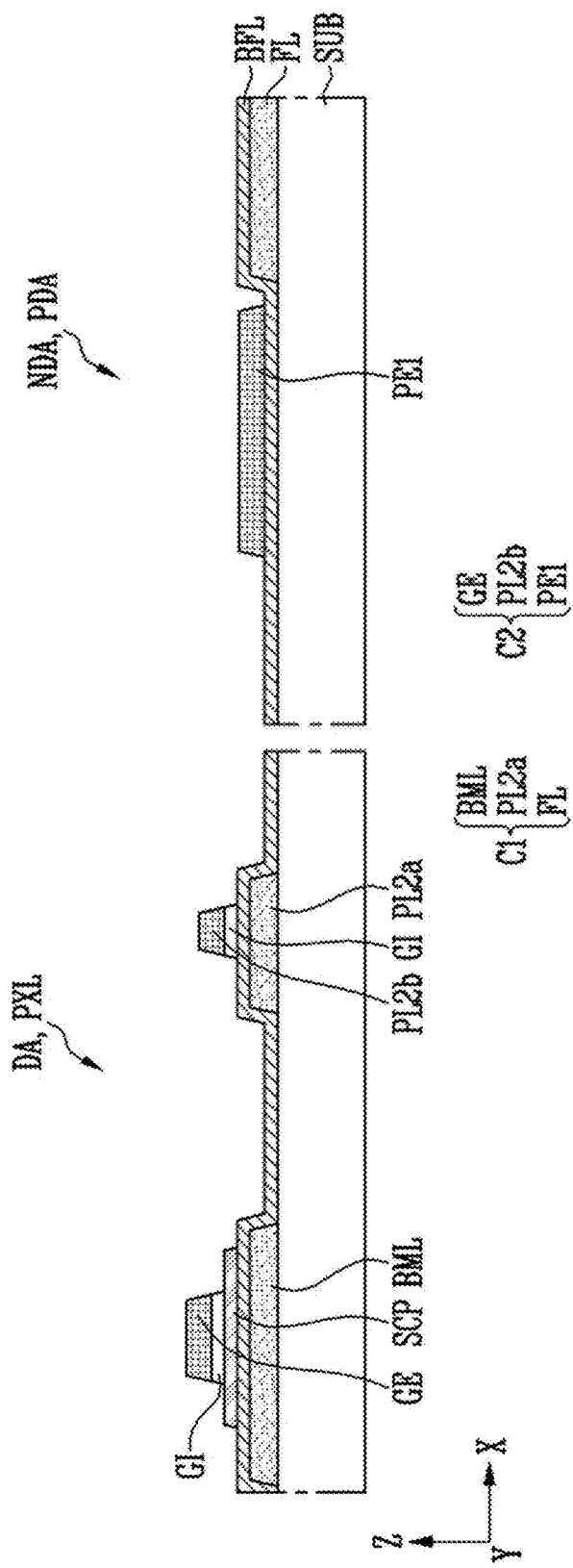

Referring to FIG. 16, next, the buffer layer BFL is formed on the first conductive layer C1, and the gate electrode GE, the second power conductive layer PL2b, and/or the first pad electrode PE1 are formed on the buffer layer BFL. The gate electrode GE may be provided on the lower conductive layer BML in the display area DA, e.g., in the pixel PXL. The semiconductor pattern SCP and the gate insulating layer GI may be further formed between the gate electrode GE and the lower conductive layer BML. The second power conductive layer PL2b may be provided on the first power conductive layer PL2a in the display area DA, e.g., the pixel PXL. The gate insulating layer GI may be further formed between the second power conductive layer PL2b and the first power conductive layer PL2a.

The first pad electrode PE1 may be disposed on the fan-out line FL in the non-display area NDA, e.g., in the pad area PDA. For instance, as shown in FIG. 7, the first pad electrode PE1 may at least partially overlap the fan-out line FL. However, the present disclosure is not limited thereto. As shown in FIG. 8, the first pad electrode PE1 may be disposed not to overlap the fan-out line FL.

The gate electrode GE, the second power conductive layer PL2b, and/or the first pad electrode PE1 may be formed as the second conductive layer C2. The gate electrode GE, the second power conductive layer PL2b, and/or the first pad electrode PE1 may be concurrently (or simultaneously) formed in the same process, but the present disclosure is not limited thereto.

As described with reference to FIGS. 9 and 10, in order to reduce or minimize contact resistance of the pad component PD, the second conductive layer C2 including the first pad electrode PE1 may be formed as a multi-layer structure in which titanium (Ti), copper (Cu), and/or indium tin oxide (ITO) are sequentially or repeatedly stacked. Thus, because contact resistance with an oxide layer (e.g., aluminum oxide layer) is improved, the heat issue of the pad component PD and a reduction in luminance of the display panel PNL can be solved as described above.

Figure 17:
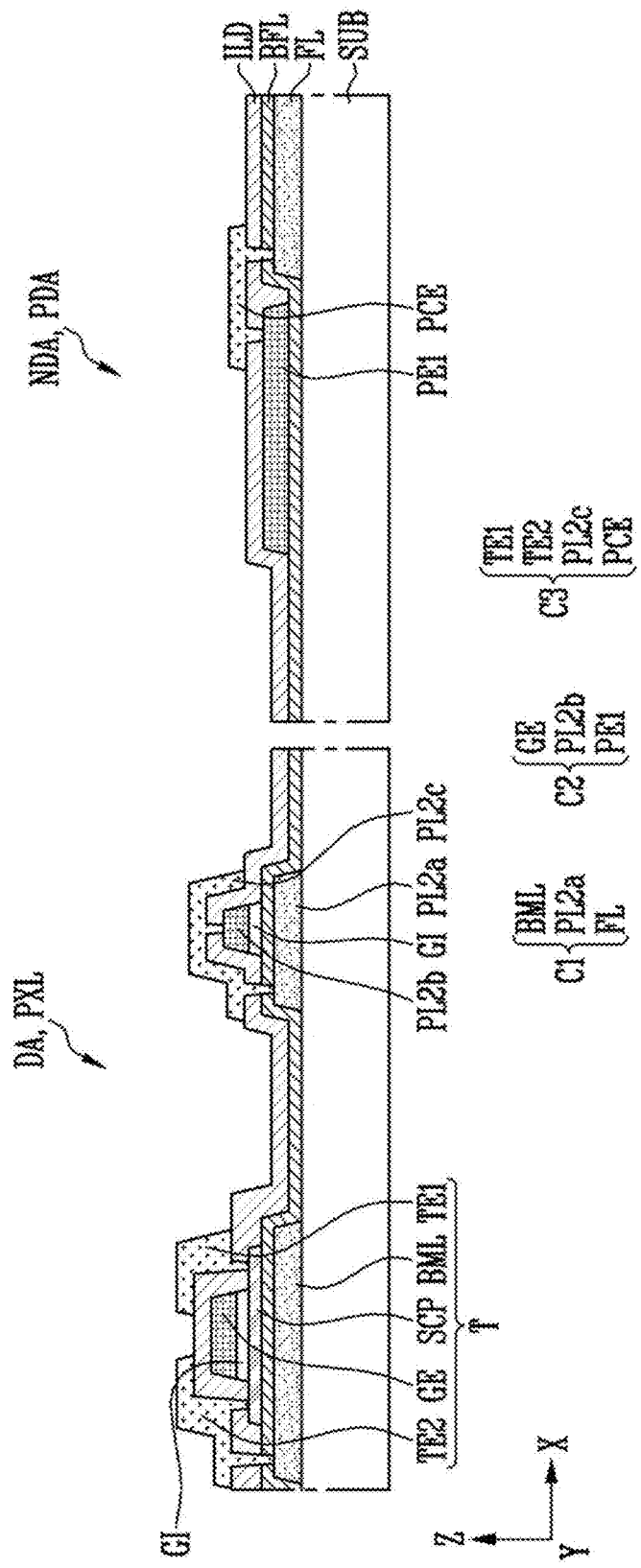

Referring to FIG. 17, next, the interlayer insulating layer ILD is formed on the second conductive layer C2, and the first transistor electrode TE1, the second transistor electrode TE2, the third power conductive layer PL2c, and/or the pad connection electrode PCE are formed on the interlayer insulating layer ILD. The first and second transistor electrodes TE1 and TE2 may be provided on the gate electrode GE in the display area DA, for example, the pixel PXL. The first transistor electrode TE1 may be electrically connected to a first area of the semiconductor pattern SCP through the contact hole formed through the interlayer insulating layer ILD. The second transistor electrode TE2 may be electrically connected to a second area of the semiconductor pattern SCP through a contact hole formed through the interlayer insulating layer ILD. Further, the second transistor electrode TE2 may be electrically connected to the lower conductive layer BML through the contact hole formed through the interlayer insulating layer ILD and the buffer layer BFL.

The third power conductive layer PL2c may be provided on the first power conductive layer PL2a and/or the second power conductive layer PL2b in the display area DA, e.g., the pixel PXL. The third power conductive layer PL2c may be electrically connected to the first power conductive layer PL2a through the contact hole formed through the interlayer insulating layer ILD and the buffer layer BFL. Further, the third power conductive layer PL2c may be electrically connected to the second power conductive layer PL2b through the contact hole formed through the interlayer insulating layer ILD.

The pad connection electrode PCE may be provided on the first pad electrode PE1 in the non-display area NDA, for example, in the pad area PDA. One end of the pad connection electrode PCE may be electrically connected to the first pad electrode PE1 through the contact hole formed through the interlayer insulating layer ILD. Further, the other end of the pad connection electrode PCE may be electrically connected to the fan-out line FL through the contact hole formed through the interlayer insulating layer ILD and the buffer layer BFL. Thus, the first pad electrode PE1 may be electrically connected to the fan-out line FL through the pad connection electrode PCE.

The first transistor electrode TE1, the second transistor electrode TE2, the third power conductive layer PL2c, and/or the pad connection electrode PCE may be formed as the third conductive layer C3. The first transistor electrode TE1, the second transistor electrode TE2, the third power conductive layer PL2c, and/or the pad connection electrode PCE may be concurrently (or simultaneously) formed in the same process, but the present disclosure is not necessarily limited thereto.

Figure 18:
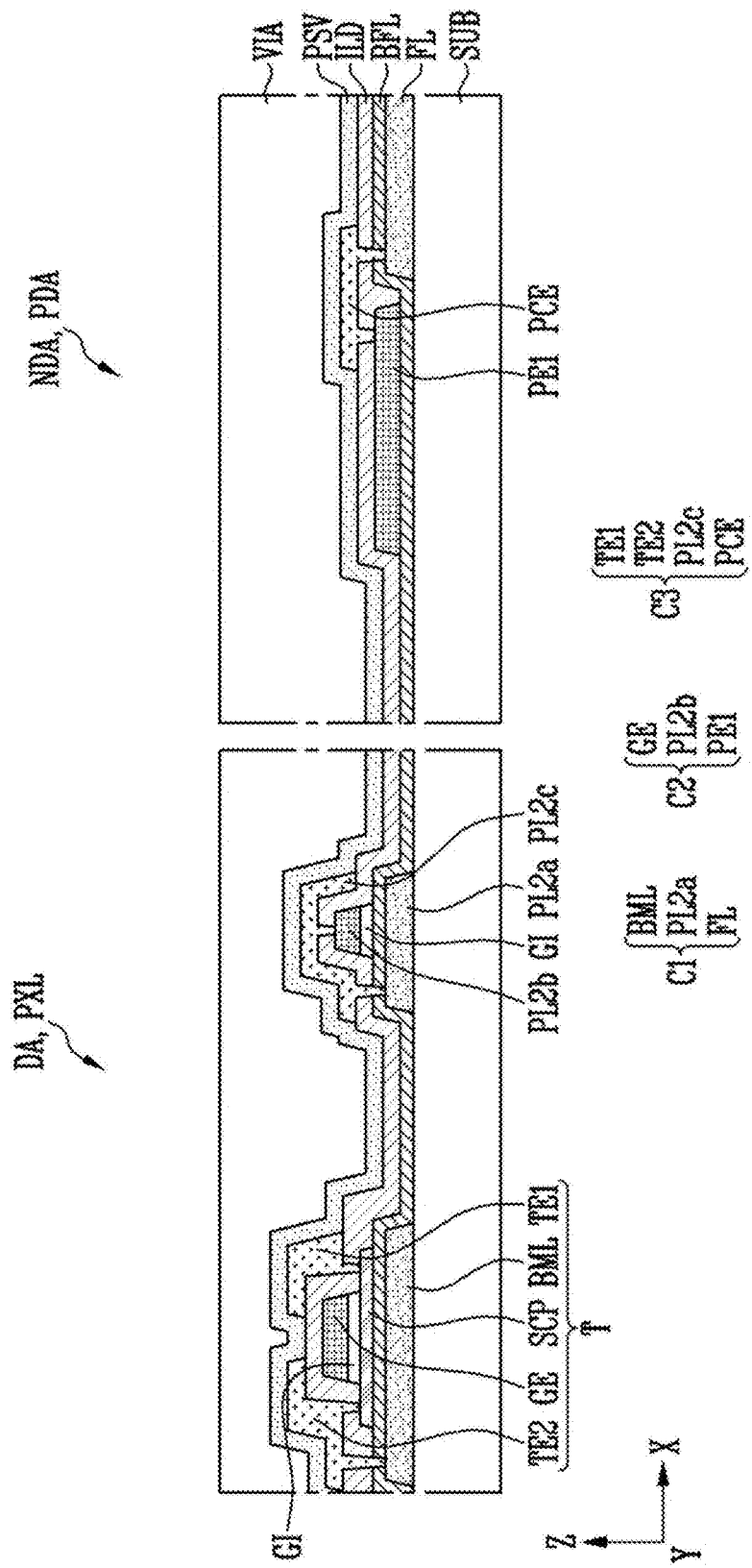

Referring to FIG. 18, next, the passivation layer PSV is formed on the third conductive layer C3, and the via layer VIA is formed on the passivation layer PSV. The passivation layer PSV and/or the via layer VIA may be formed throughout the display area DA and the non-display area NDA, for example, the pixel PXL and the pad area PDA.

Figure 19:
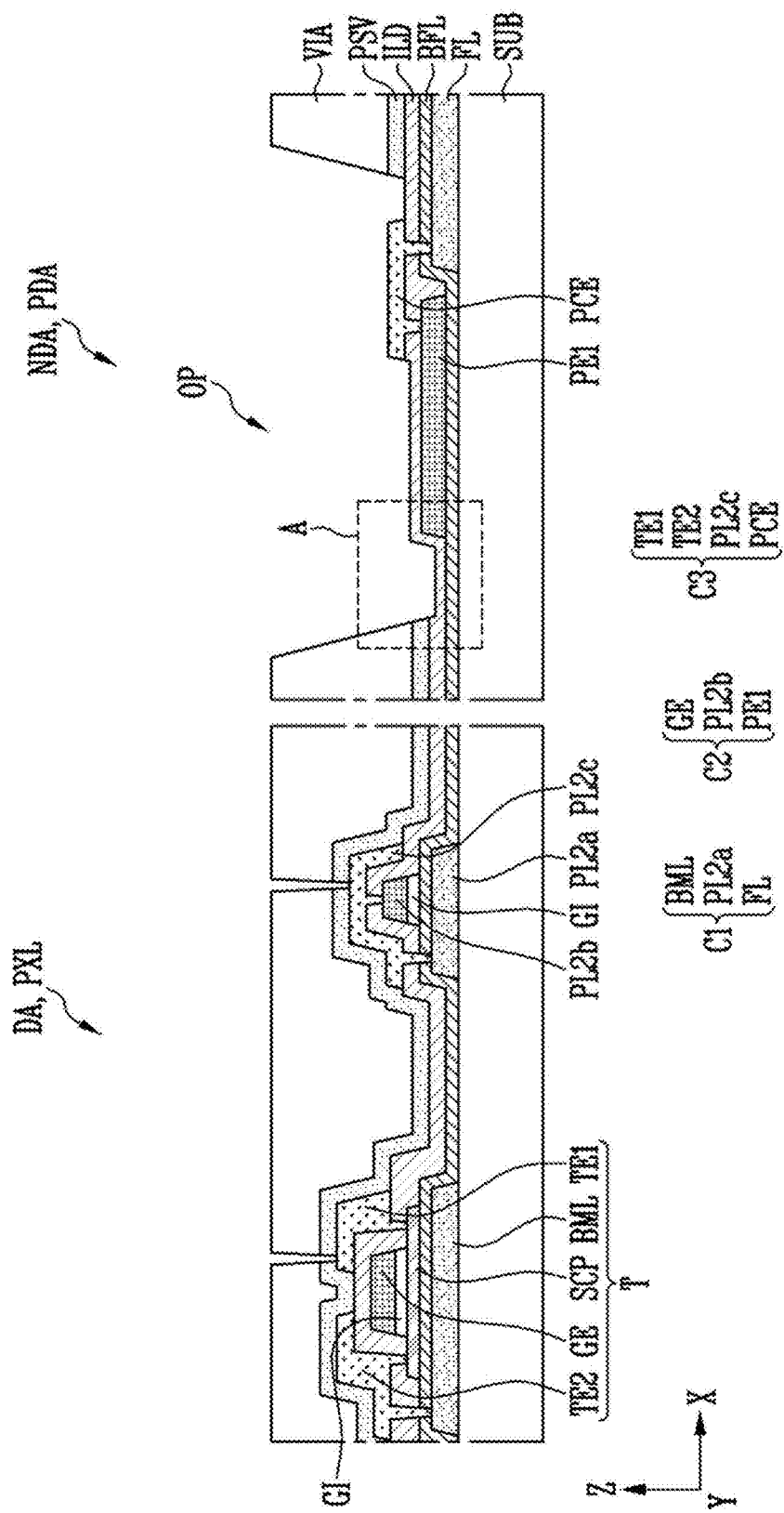
Figure 20:
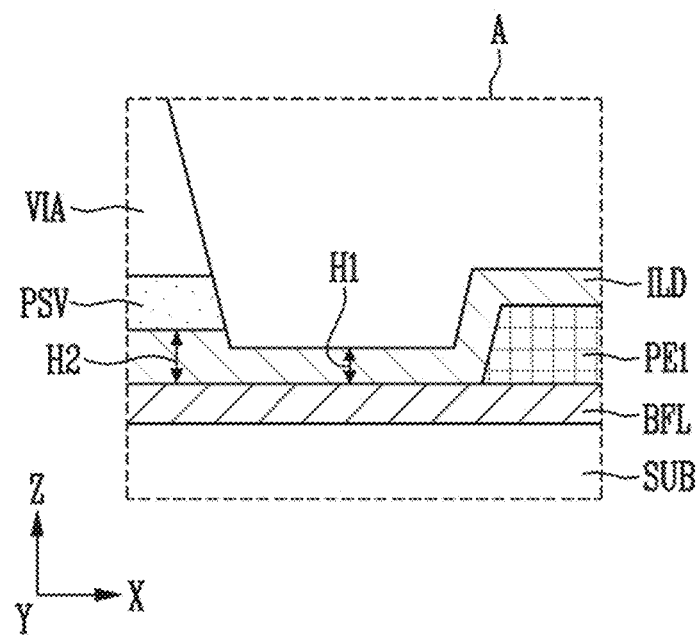

Referring to FIGS. 19 and 20, the passivation layer PSV and the via layer VIA are then etched. FIG. 20 is an enlarged diagram of area A of FIG. 19.

The passivation layer PSV and the via layer VIA of the display area DA and the non-display area NDA, for example, the pixel PXL and the pad area PDA may be concurrently (or simultaneously) etched in the same process. Thus, the manufacturing process can be simplified by reducing the number of masks. As such, in case that the passivation layer PSV and the via layer VIA are concurrently (or simultaneously) etched, the etched surfaces of the passivation layer PSV and the via layer VIA may form the same plane.

The passivation layer PSV and the via layer VIA of the display area DA, for example, the pixel PXL are etched, so that contact holes exposing the third conductive layer C3 may be formed. The contact holes may expose the first transistor electrode TE1 and the third power conductive layer PL2c, respectively, but the present disclosure is not necessarily limited thereto.

The passivation layer PSV and the via layer VIA of the non-display area NDA, for example, the pad area PDA are etched, so that an opening OP exposing the interlayer insulating layer ILD and the third conductive layer C3 may be formed. The opening OP of each of the passivation layer PSV and the via layer VIA may expose the interlayer insulating layer ILD and the pad connection electrode PCE.

In one or more embodiments, the interlayer insulating layer ILD located at a lower position may be primarily etched in the process of etching the passivation layer PSV and the via layer VIA. For example, the opening OP of the passivation layer PSV and the via layer VIA is formed and over-etching is performed, so that the interlayer insulating layer ILD exposed by the opening OP of the passivation layer PSV and the via layer VIA may be partially removed. In this case, as shown in FIG. 20, a thickness H1 in the third direction (e.g. the Z-axis direction) of the interlayer insulating layer ILD exposed by the opening OP of the passivation layer PSV and the via layer VIA may be less than a thickness H2 of the third direction (e.g., the Z-axis direction) of the interlayer insulating layer ILD covered by the passivation layer PSV and/or the via layer VIA. In case that the interlayer insulating layer ILD is primarily etched to be partially removed, the first pad electrode PE1 may be protected by the interlayer insulating layer ILD, and at the same time it may be possible to prevent the interlayer insulating layer ILD from remaining in the contactor CNT of the pad component PD in a subsequent process. In addition, in case that the passivation layer PSV and the via layer VIA are over-etched to primarily etch the interlayer insulating layer ILD, an additional mask for primarily etching the interlayer insulating layer ILD is not required, so that economic efficiency for a process may be enhanced.

Figure 21:
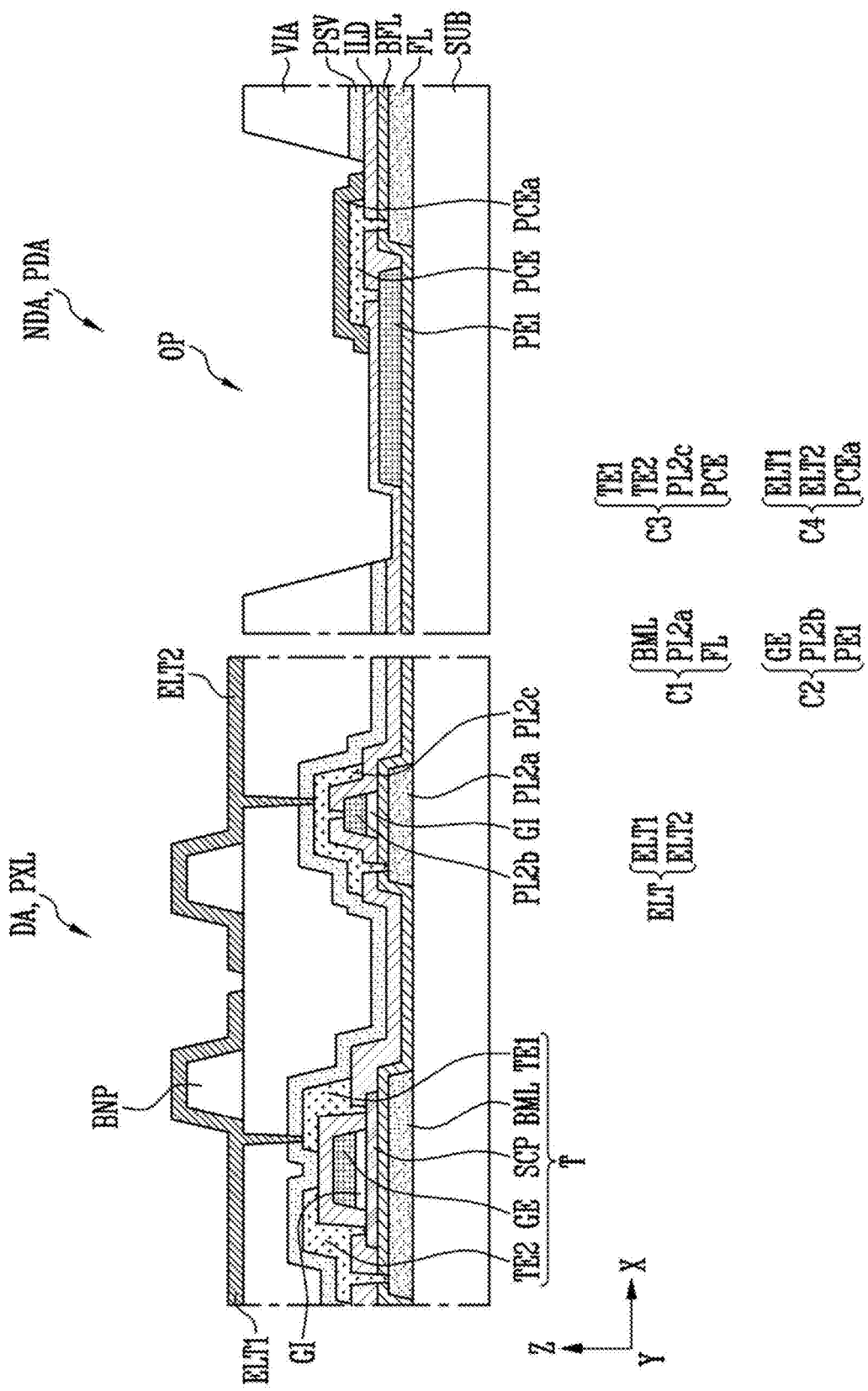

Referring to FIG. 21, next, the first electrode ELT1, the second electrode ELT2, and/or the sub-connection electrode PCEa are formed in the via layer VIA or the opening OP of the via layer VIA. The first and second electrodes ELT1 and ELT2 may be provided on the via layer VIA in the display area DA, for example, the pixel PXL. For example, the first and second electrodes ELT1 and ELT2 may be formed on the bank patterns BNP provided on the via layer VIA. The first electrode ELT1 may be electrically connected to the first transistor electrode TE1 through the contact hole formed through the via layer VIA and the passivation layer PSV. The second electrode ELT2 may be electrically connected to the third power conductive layer PL2c through the contact hole formed through the via layer VIA and the passivation layer PSV.

The sub-connection electrode PCEa may be provided on the pad connection electrode PCE in the non-display area NDA, for example, in the pad area PDA. The sub-connection electrode PCEa may be directly formed on the pad connection electrode PCE exposed by the opening OP of the via layer VIA and the passivation layer PSV. For example, the sub-connection electrode PCEa may serve to protect the pad connection electrode PCE in a subsequent process.

The first electrode ELT1, the second electrode ELT2, and/or the sub-connection electrode PCEa may be formed as the fourth conductive layer C4. The first electrode ELT1, the second electrode ELT2, and/or the sub-connection electrode PCEa may be concurrently (or simultaneously) formed in the same process, but the present disclosure is not necessarily limited thereto.

As described above, in case that the first pad electrode PE1 is formed as the second conductive layer C2 (or the gate conductive layer), the first pad electrode PE1 may be protected by the interlayer insulating layer ILD, thus preventing the first pad electrode from being damaged by the etchant in the process of forming the fourth conductive layer C4.

Figure 22:
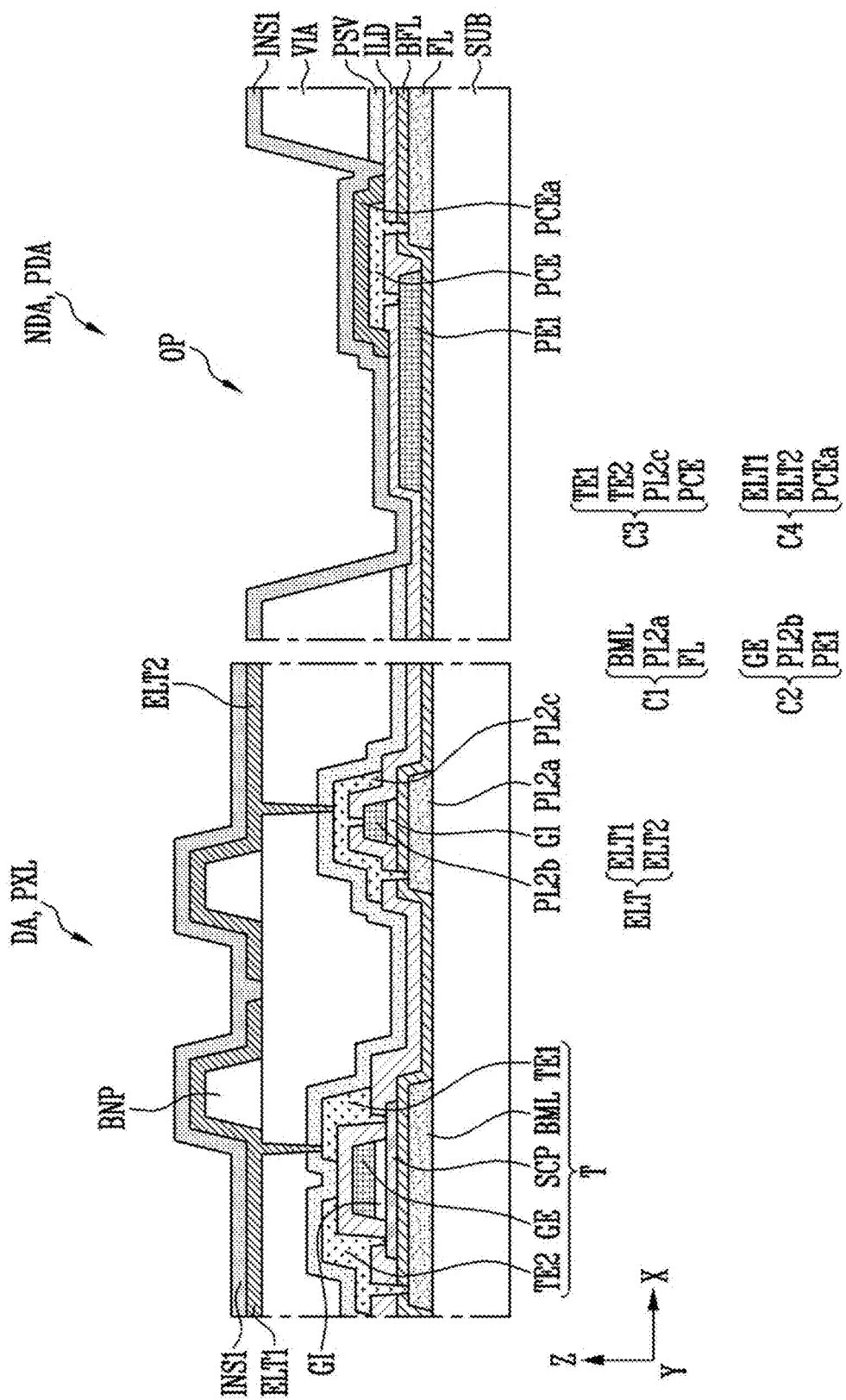

Referring to FIG. 22, next, the first insulating layer INS1 is formed on the fourth conductive layer C4. The first insulating layer INS1 may be formed throughout the display area DA and the non-display area NDA, for example, the pixel PXL and the pad area PDA.

Figure 23:
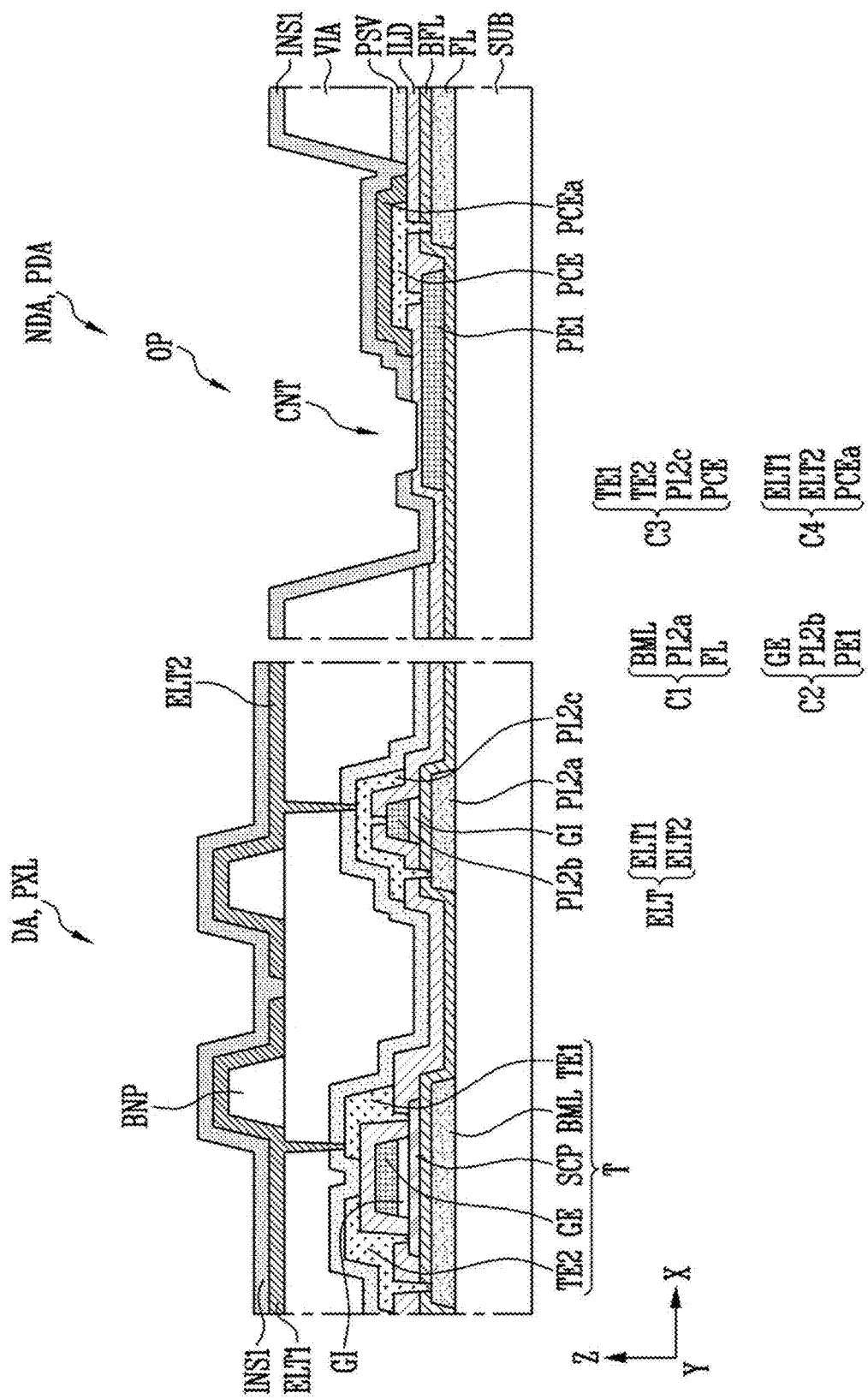

Referring to FIG. 23, next, the first insulating layer INS1 is etched. The first insulating layer INS1 of the non-display area NDA, e.g., the pad area PDA may be etched to form the contactor CNT which exposes the interlayer insulating layer ILD.

In one or more embodiments, the interlayer insulating layer ILD located at a lower position may be secondarily etched in the process of etching the first insulating layer INS1. For instance, the contactor CNT of the first insulating layer INS1 may be formed and over-etched to partially remove the interlayer insulating layer ILD exposed by the contactor CNT of the first insulating layer INS1. In this case, the thickness of the third direction (e.g., the Z-axis direction) of the interlayer insulating layer ILD exposed by the contactor CNT of the first insulating layer INS1 may be less than the thickness of the third direction (e.g., the Z-axis direction) of the interlayer insulating layer ILD covered by the first insulating layer INS1. In case that the interlayer insulating layer ILD is secondarily etched to be partially removed, the first pad electrode PE1 may be protected by the interlayer insulating layer ILD, and at the same time it may be possible to prevent the interlayer insulating layer ILD from remaining in the contactor CNT of the pad component PD in a subsequent process. In addition, in case that the first insulating layer INS1 is over-etched to secondarily etch the interlayer insulating layer ILD, an additional mask for secondarily etching the interlayer insulating layer ILD is not required, so that economic efficiency for a process may be enhanced.

Figure 24:
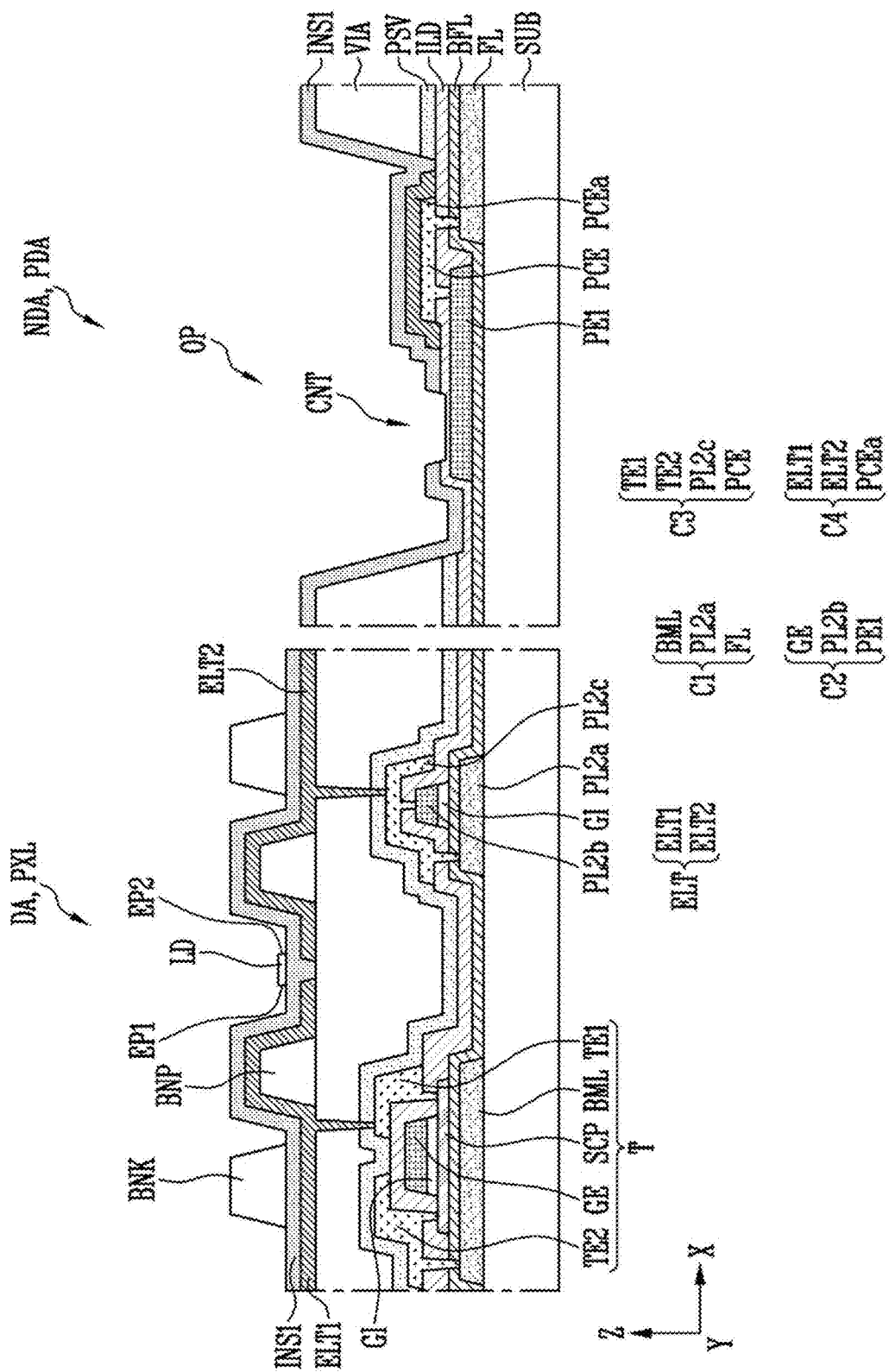

Referring to FIG. 24, next, the bank BNK is formed on the first insulating layer INS1 of the pixel PXL, and the light emitting elements LD are provided in a space partitioned by the bank BNK. The light emitting elements LD may be prepared in a dispersed form in the light-emitting-element ink, and may be supplied to the pixel PXL through an inkjet printing method or the like. For example, the light emitting elements LD may be dispersed in a volatile solvent and supplied to the pixel PXL. Subsequently, if an alignment signal (or voltage) is supplied to the first and second electrodes ELT1 and ELT2, an electric field may be formed between the first and second electrodes ELT1 and ELT2, whereby the light emitting elements LD may be aligned between the first and second electrodes ELT1 and ELT2. After the light emitting elements LD have been aligned, the solvent may be removed by a volatilization method or other methods. Thereby, the light emitting elements LD may be reliably arranged between the first and second electrodes ELT1 and ELT2.

Figure 25:
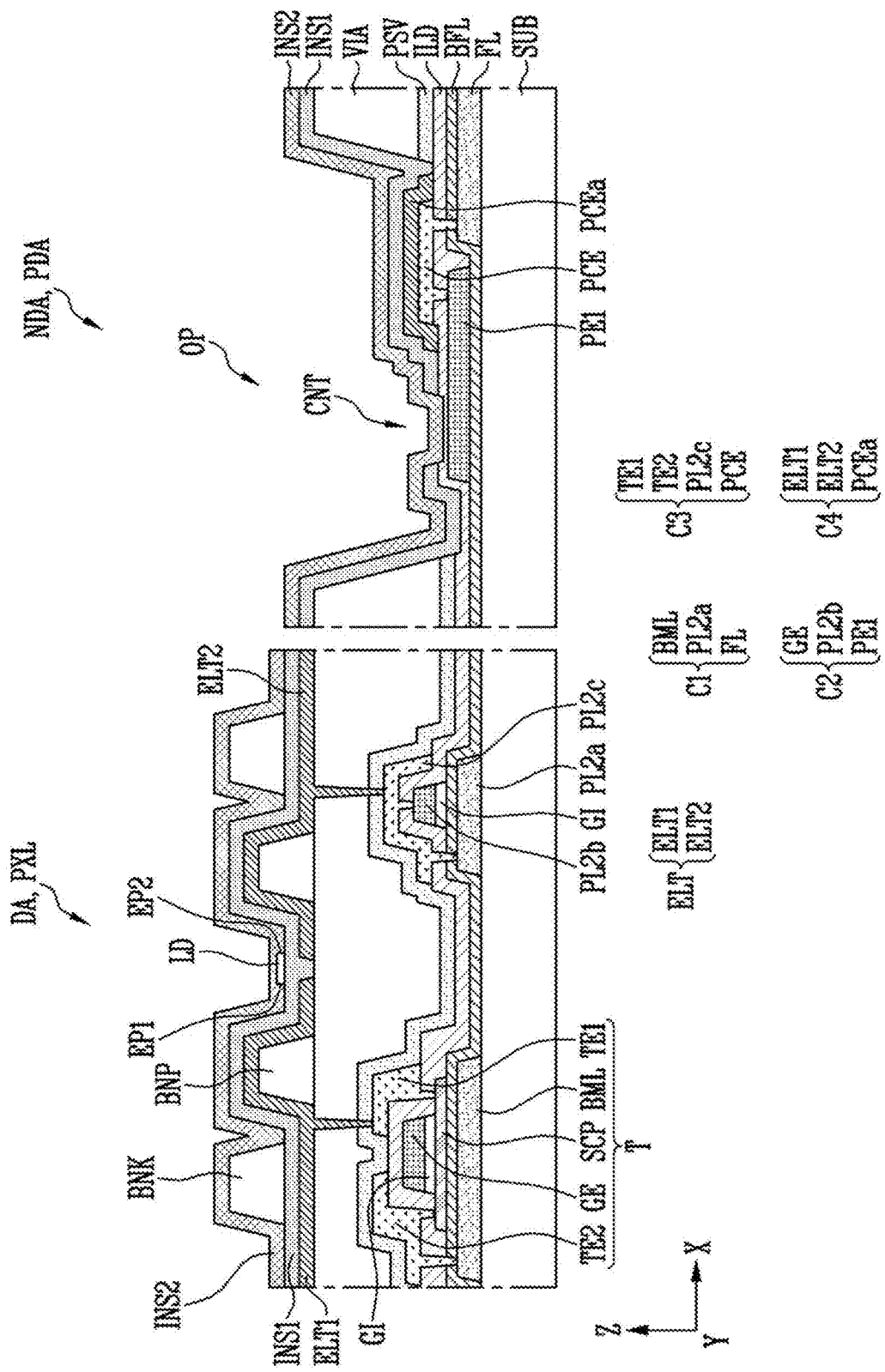

Referring to FIG. 25, next, the second insulating layer INS2 is formed on the light emitting elements LD. The second insulating layer INS2 may be formed throughout the display area DA and the non-display area NDA, for example, the pixel PXL and the pad area PDA.

Figure 26:
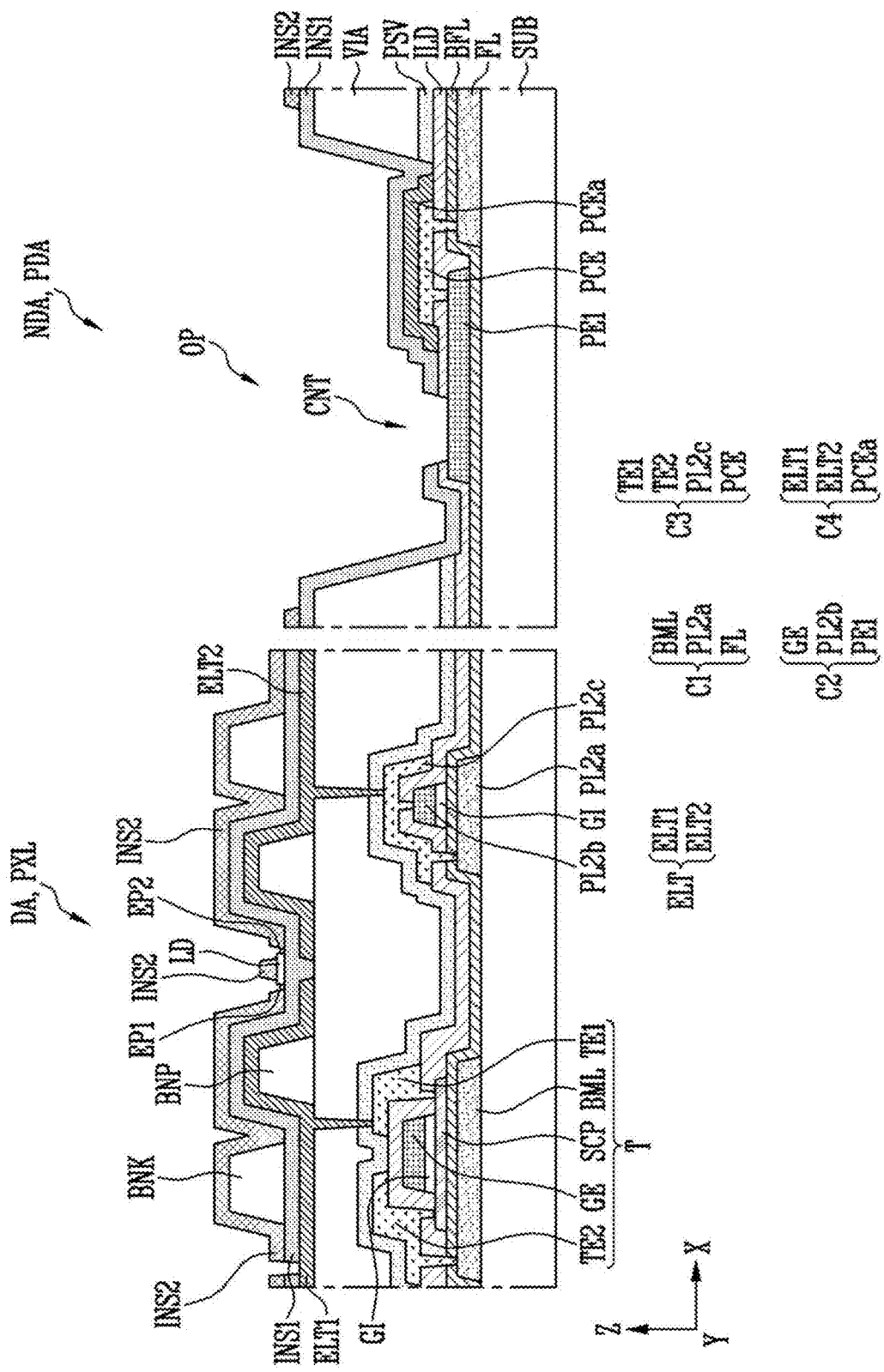

Referring to FIG. 26, next, the second insulating layer INS2 is etched. The second insulating layer INS2 of the display area DA and the non-display area NDA, for example, the pixel PXL and the pad area PDA may be concurrently (or simultaneously) etched in the same process. Thus, the manufacturing process can be simplified by reducing the number of masks.

The second insulating layer INS2 of the display area DA, e.g., the pixel PXL may be etched to form the contact hole that exposes the fourth conductive layer C4, e.g., the first electrode ELT1. Further, the second insulating layer INS2 may cover the light emitting elements LD, and may be partially removed to expose the first and second ends EP1 and EP2 of the light emitting elements LD.

The second insulating layer INS2 of the non-display area NDA, e.g., the pad area PDA may be etched to form the opening OP. In one or more embodiments, the interlayer insulating layer ILD located at a lower position may be tertiary-etched to form the contactor CNT in the process of etching the second insulating layer INS2. In this case, the contactor CNT, i.e., the etched surfaces of the first insulating layer INS1 and the interlayer insulating layer ILD may form the same plane. For instance, the opening OP of the second insulating layer INS2 may be formed and over-etched to completely remove the interlayer insulating layer ILD exposed by the opening OP of the second insulating layer INS2 and the contactor CNT of the first insulating layer INS1. Thus, the first pad electrode PE1 may be exposed by the interlayer insulating layer ILD and the contactor CNT of the first insulating layer INS1.

According to one or more embodiments, the interlayer insulating layer ILD and/or the first insulating layer INS1 may expose the upper surface of the first pad electrode PE1, but may cover a side surface of the first pad electrode PE1. In this case, because the side surface of the first pad electrode PE1 may be protected by the interlayer insulating layer ILD and/or the first insulating layer INS1, it is possible to prevent the side surface of the first pad electrode PE1 from being damaged.

As described above, in case that the interlayer insulating layer ILD is sequentially removed by primary to tertiary etching, the first pad electrode PE1 may be protected, and at the same time it may be possible to prevent the interlayer insulating layer ILD from remaining in the contactor CNT of the pad component PD. Further, in case that the second insulating layer INS2 is over-etched to tertiary etch the interlayer insulating layer ILD, an additional mask for tertiary etching the interlayer insulating layer ILD may not be required, so that economic efficiency for a process can be enhanced.

Figure 27:
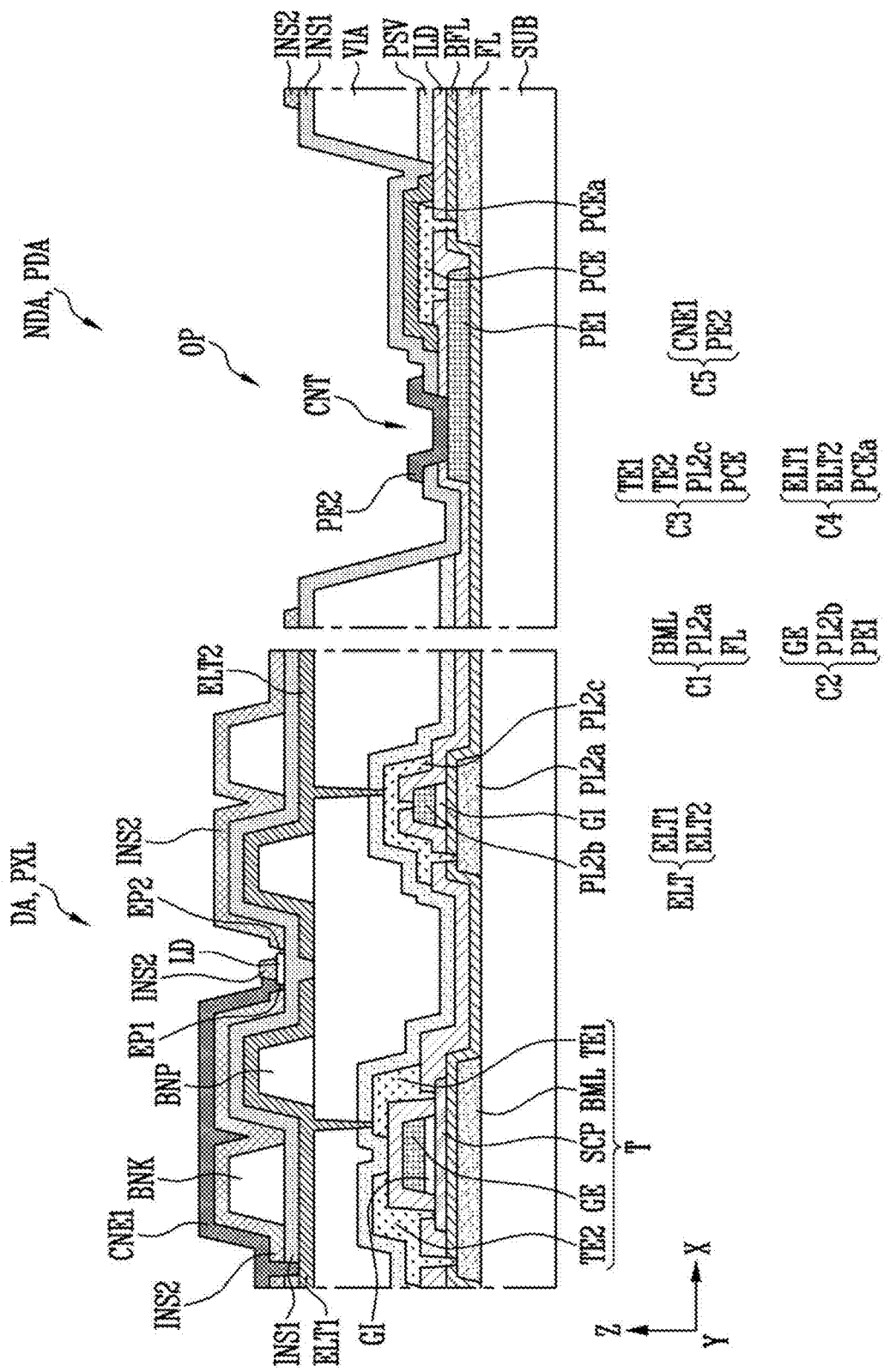

Referring to FIG. 27, next, the first connection electrode CNE1 and/or the second pad electrode PE2 are formed. The first connection electrode CNE1 may be formed on the light emitting elements LD in the display area DA, for example, the pixel PXL. The first connection electrode CNE1 may be electrically connected to the first end EP1 of the light emitting elements LD exposed by the second insulating layer INS2. The first connection electrode CNE1 may be electrically connected to the first electrode ELT1 through the contact hole formed through the second insulating layer INS2 and the first insulating layer INS1.

The second pad electrode PE2 may be formed on the first pad electrode PE1 in the non-display area NDA, for example, in the pad area PDA. The second pad electrode PE2 may contact the first pad electrode PE1 exposed by the contactor CNT of the first insulating layer INS1 and the interlayer insulating layer ILD.

The first connection electrode CNE1 and/or the second pad electrode PE2 may be formed as the fifth conductive layer C5. The first connection electrode CNE1 and/or the second pad electrode PE2 may be concurrently (or simultaneously) formed in the same process, but the present disclosure is not necessarily limited thereto.

Figure 28:
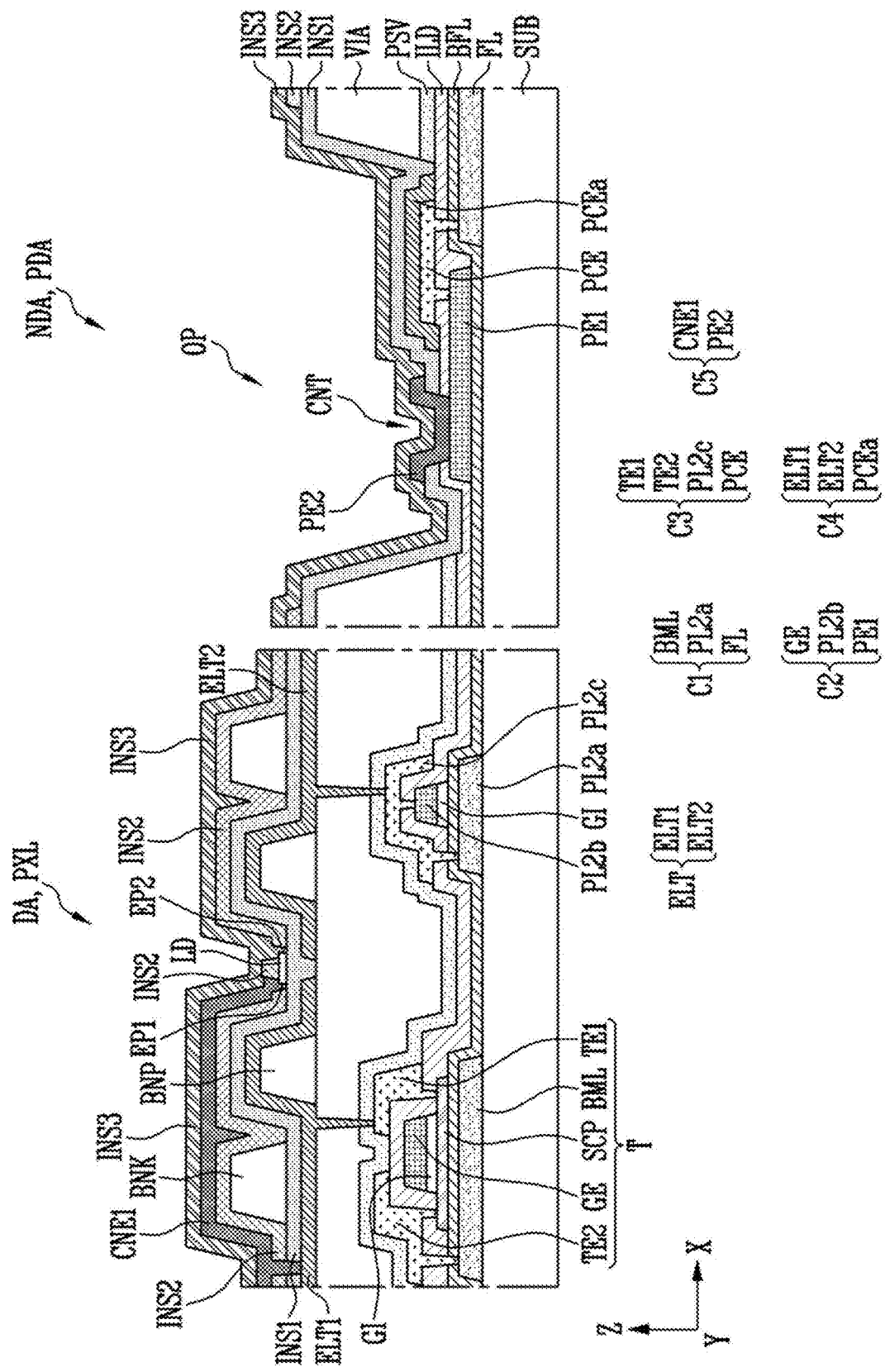

Referring to FIG. 28, next, the third insulating layer INS3 is formed on the fifth conductive layer C5. The third insulating layer INS3 may be formed throughout the display area DA and the non-display area NDA, for example, the pixel PXL and the pad area PDA.

Figure 29:
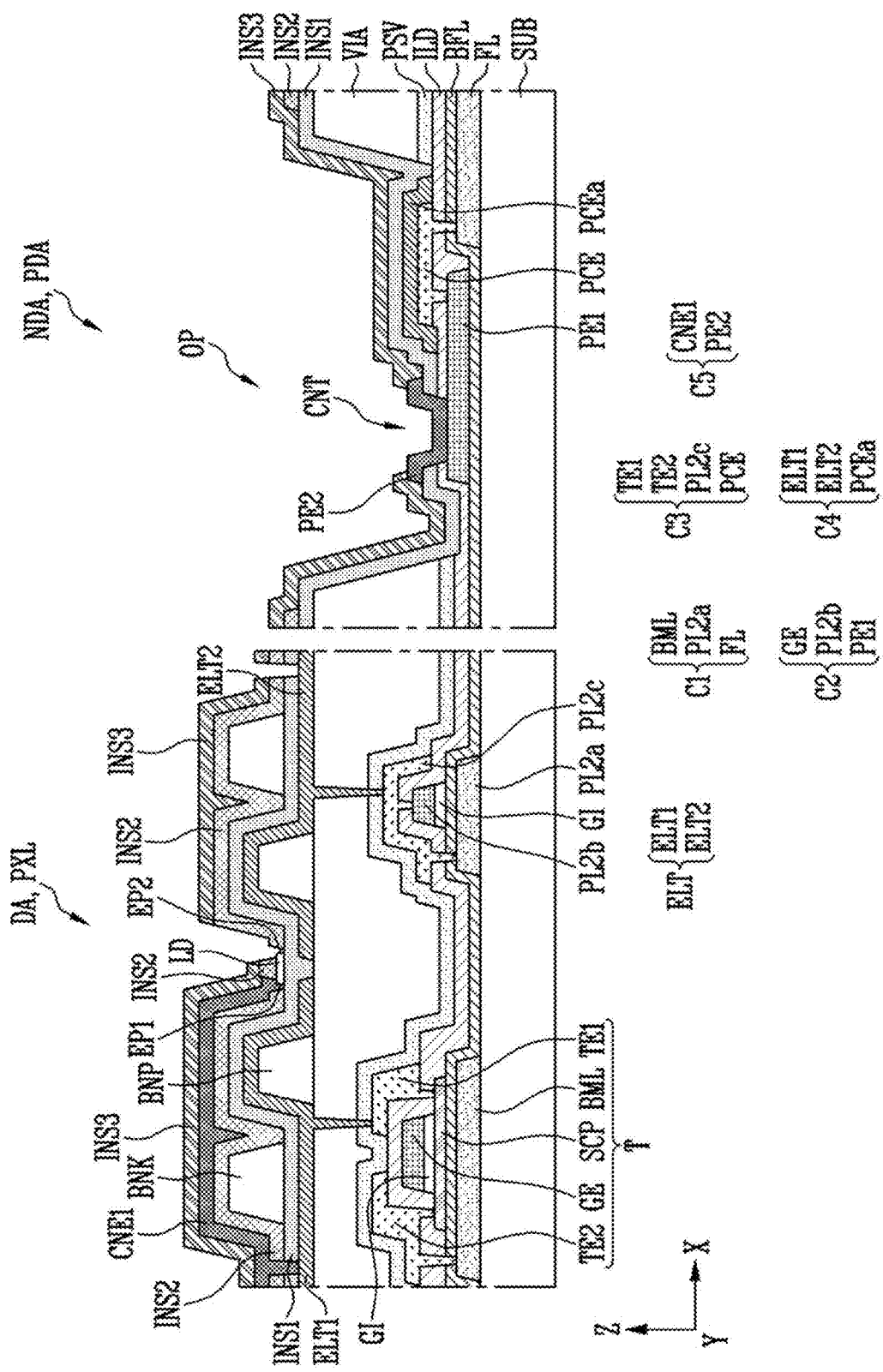

Referring to FIG. 29, next, the third insulating layer INS3 is etched. The third insulating layer INS3 of the display area DA and the non-display area NDA, for example, the pixel PXL and the pad area PDA may be concurrently (or simultaneously) etched in the same process. Thus, the manufacturing process can be simplified by reducing the number of masks.

The third insulating layer INS3 of the display area DA, e.g., the pixel PXL may be etched to form the contact hole that exposes the fourth conductive layer C4, e.g., the second electrode ELT2. Further, the third insulating layer INS3 may cover the first connection electrode CNE1, the second insulating layer INS2, and/or the light emitting elements LD, and may be partially removed to expose the second ends EP2 of the light emitting elements LD.

The third insulating layer INS3 of the non-display area NDA, e.g., the pad area PDA may be etched to form the contactor CNT. The second pad electrode PE2 may be exposed by the contactor CNT of the third insulating layer INS3.

Figure 30:
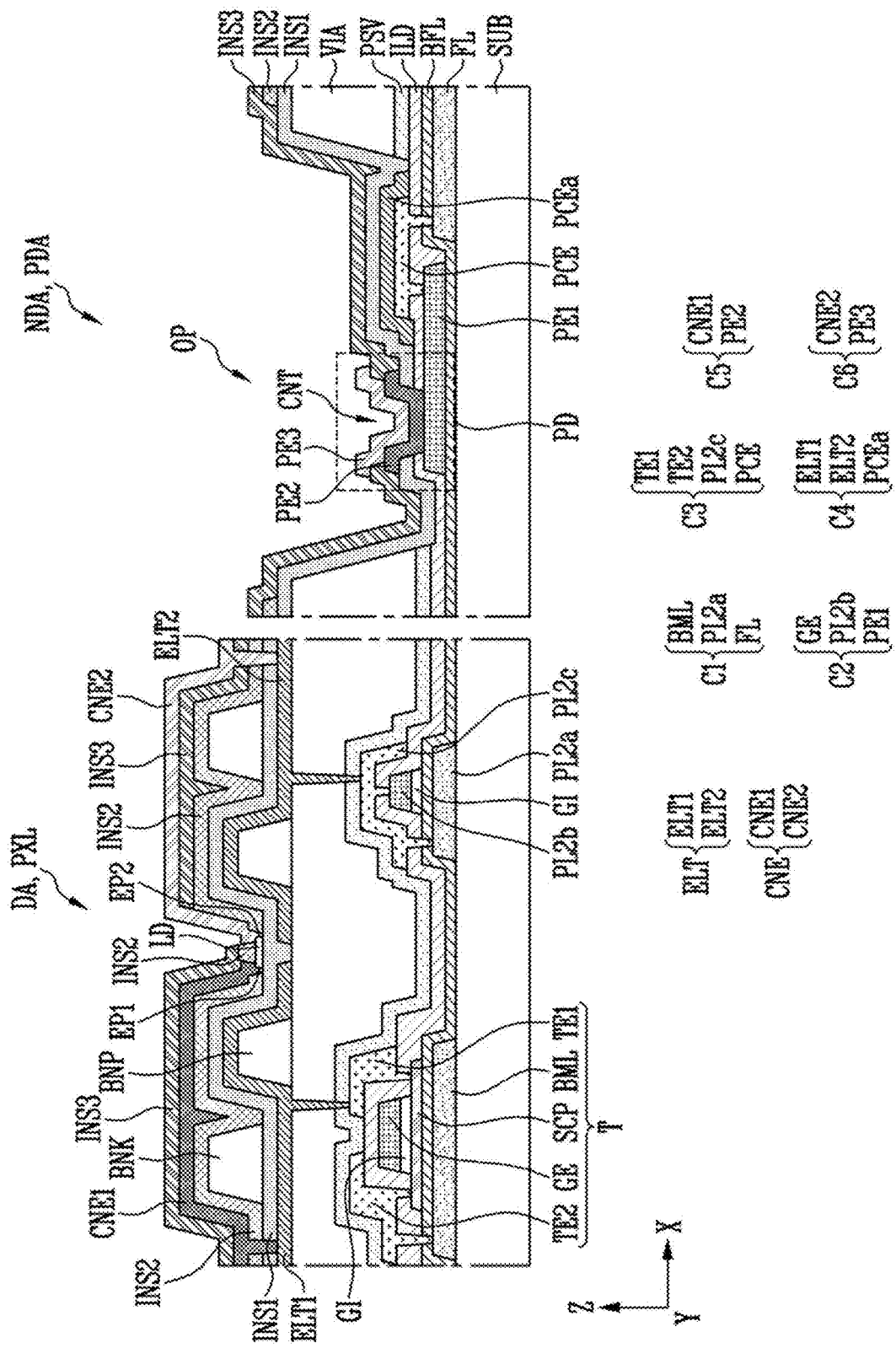

Referring to FIG. 30, next, the display device of FIGS. 5 and 8 may be completed by forming the second connection electrode CNE2 and/or the third pad electrode PE3 on the third insulating layer INS3. The second connection electrode CNE2 may be formed on the light emitting elements LD in the display area DA, for example, the pixel PXL. The second connection electrode CNE2 may be electrically connected to the second end EP2 of the light emitting elements LD exposed by the third insulating layer INS3. The second connection electrode CNE2 may be electrically connected to the second electrode ELT2 through the contact hole formed through the third insulating layer INS3, the second insulating layer INS2, and the first insulating layer INS1.

The third pad electrode PE3 may be formed on the second pad electrode PE2 in the non-display area NDA, for example, in the pad area PDA. The third pad electrode PE3 may contact the second pad electrode PE2 exposed by the contactor CNT of the third insulating layer INS3.

The second connection electrode CNE2 and/or the third pad electrode PE3 may be formed as the sixth conductive layer C6. The second connection electrode CNE2 and/or the third pad electrode PE3 may be concurrently (or simultaneously) formed in the same process, but the present disclosure is not necessarily limited thereto.

According to the above-described embodiment, as the interlayer insulating layer ILD is sequentially removed by the primary to tertiary etching processes, it is possible to prevent the interlayer insulating layer ILD from remaining in the contactor CNT of the pad component PD. Further, as the insulating layers disposed over the interlayer insulating layer ILD are over-etched to partially etch the interlayer insulating layer ILD, an additional mask for etching the interlayer insulating layer ILD is unnecessary, so that the economic efficiency for a process can be secured.

Hereinafter, an embodiment will be described. In the following embodiment, the same components as those already described will be denoted by the same reference numerals, and duplicated descriptions will be omitted or simplified.

Figure 31:
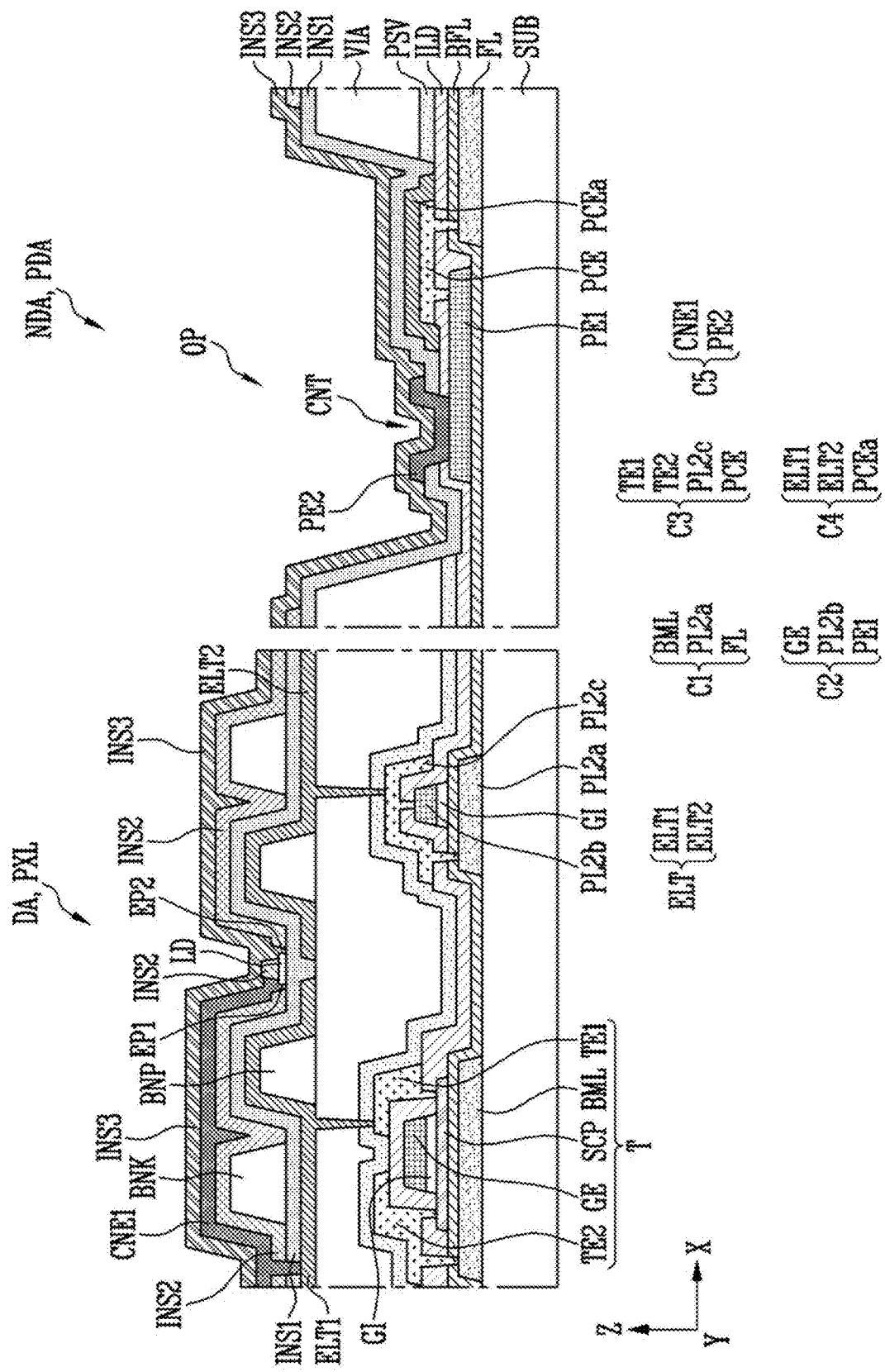
FIGS. 31 to 33 are sectional views of respective process steps to describe a method of manufacturing a display device in accordance with one or more embodiments of the present disclosure.
Figure 32:
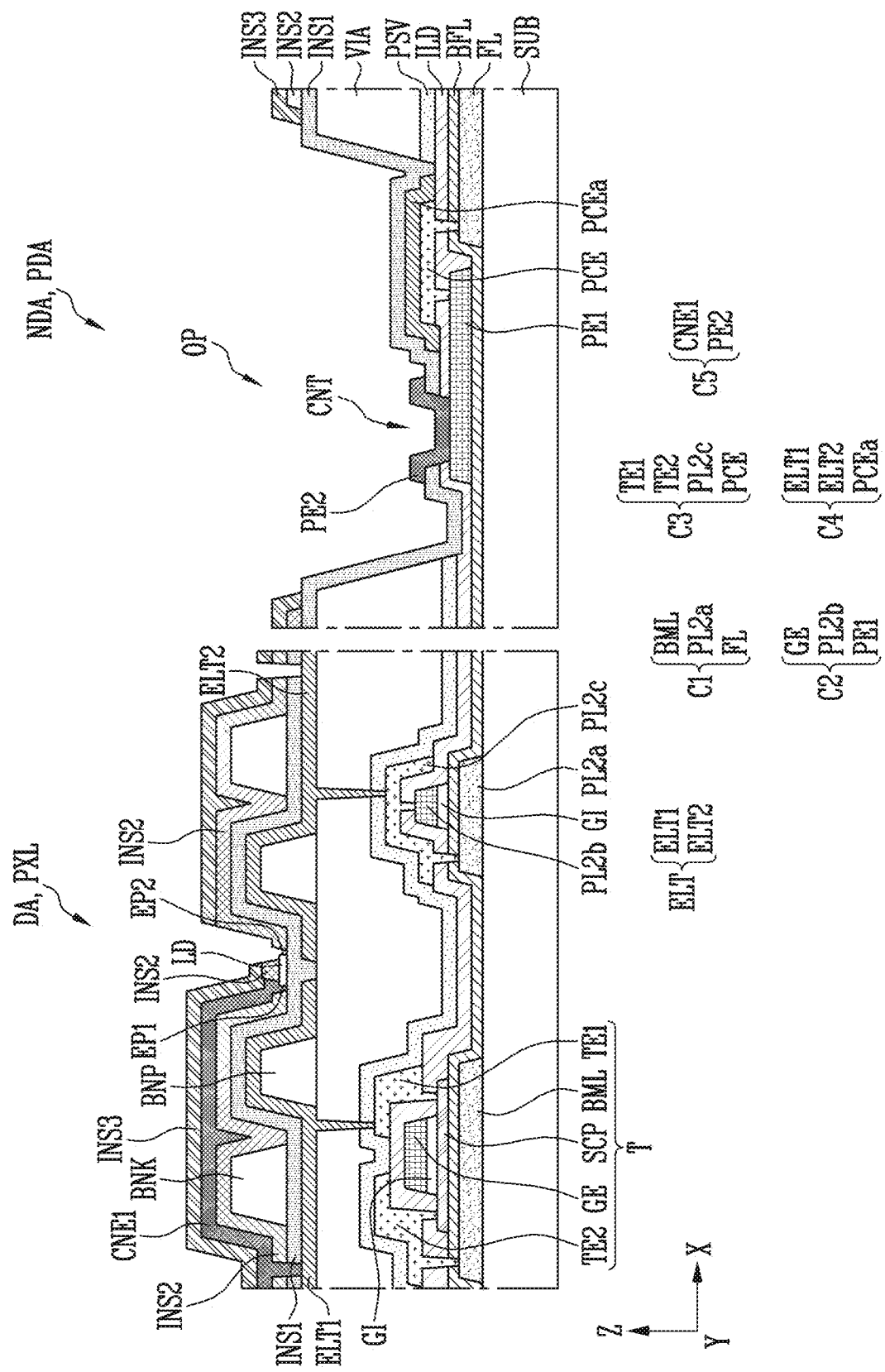
Figure 33:
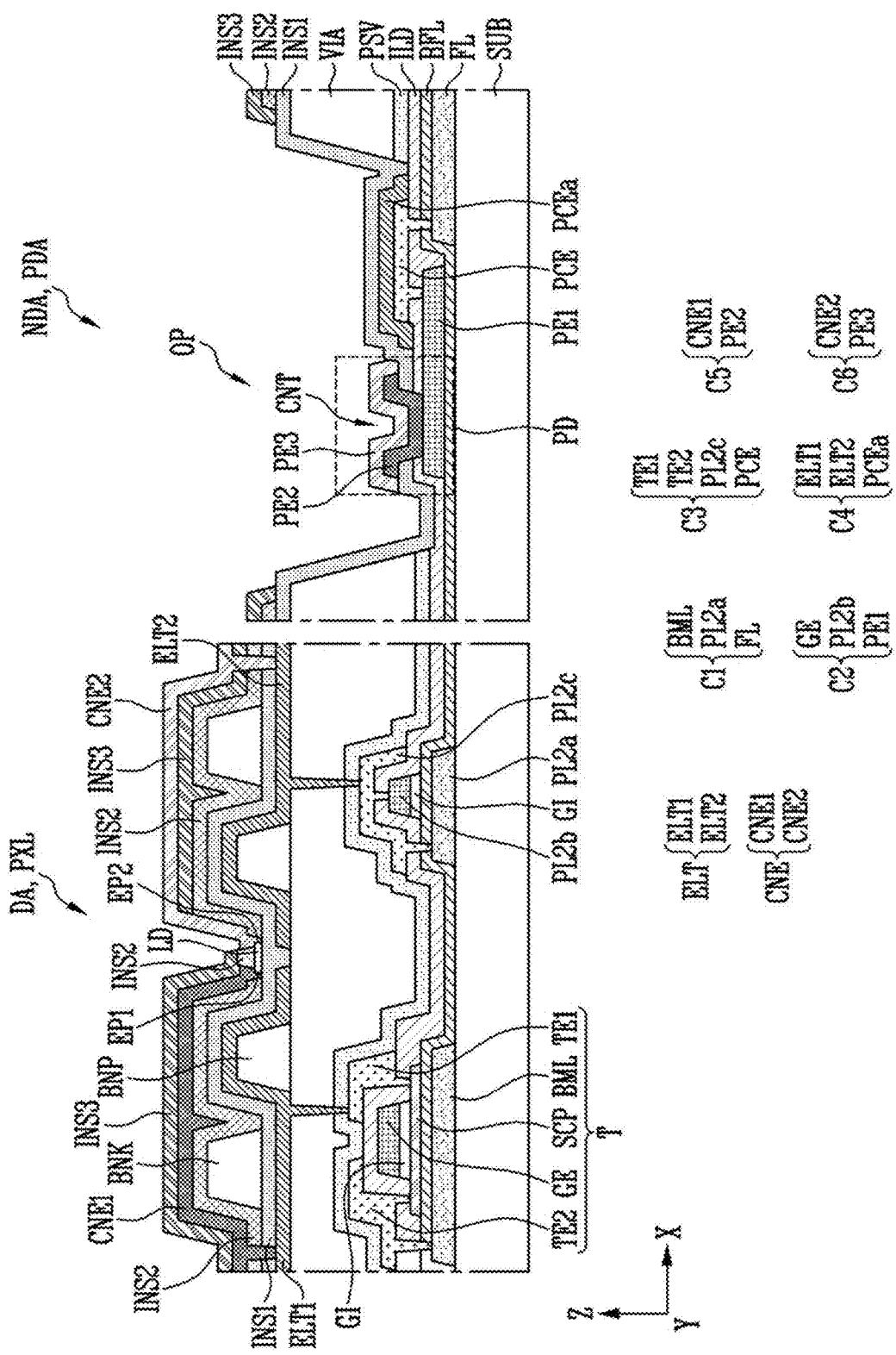

FIGS. 31 to 33 are sectional views of respective process steps to describe a method of manufacturing a display device in accordance with one or more embodiments of the present disclosure. FIGS. 31 to 33 are sectional views for describing the method of manufacturing the display device of FIGS. 5 and 11. Components that are substantially the same as those of FIGS. 5 and 11 are denoted by the same reference numerals, and a detailed description thereof will be omitted.

Referring to FIG. 31, the third insulating layer INS3 is formed on the fifth conductive layer C5. The third insulating layer INS3 may be formed throughout the display area DA and the non-display area NDA, for example, the pixel PXL and the pad area PDA. Because the step of providing the fifth conductive layer C5 on the substrate SUB has been described in detail with reference to FIGS. 15 to 27, duplicated description will be omitted.

Referring to FIG. 32, next, the third insulating layer INS3 is etched. The third insulating layer INS3 of the display area DA and the non-display area NDA, for example, the pixel PXL and the pad area PDA may be concurrently (or simultaneously) etched in the same process. Thus, as described above, the manufacturing process can be simplified by reducing the number of masks.

The third insulating layer INS3 of the display area DA, e.g., the pixel PXL may be etched to form the contact hole which exposes the fourth conductive layer C4, e.g., the second electrode ELT2. Further, the third insulating layer INS3 may cover the first connection electrode CNE1, the second insulating layer INS2, and/or the light emitting elements LD, and may be partially removed to expose the second ends EP2 of the light emitting elements LD.

The third insulating layer INS3 of the non-display area NDA, e.g., the pad area PDA may be etched to form the opening OP. The second pad electrode PE2 may be exposed by the opening OP of the third insulating layer INS3. For instance, the third insulating layer INS3 may be completely opened so as not to overlap circuit elements constituting the pad component PD including the second pad electrode PE2.

Referring to FIG. 33, next, the display device of FIGS. 5 and 11 may be completed by forming the second connection electrode CNE2 and/or the third pad electrode PE3. The second connection electrode CNE2 may be formed on the light emitting elements LD in the display area DA, for example, the pixel PXL. The second connection electrode CNE2 may be electrically connected to the second end EP2 of the light emitting elements LD exposed by the third insulating layer INS3. The second connection electrode CNE2 may be electrically connected to the second electrode ELT2 through the contact hole formed through the third insulating layer INS3, the second insulating layer INS2, and the first insulating layer INS1.

The third pad electrode PE3 may be formed on the second pad electrode PE2 in the non-display area NDA, for example, in the pad area PDA. The third pad electrode PE3 may contact the second pad electrode PE2 exposed by the opening OP of the third insulating layer INS3.

The second connection electrode CNE2 and/or the third pad electrode PE3 may be formed as the sixth conductive layer C6. The second connection electrode CNE2 and/or the third pad electrode PE3 may be concurrently (or simultaneously) formed in the same process, but the present disclosure is not necessarily limited thereto.

As described above, in case that the third insulating layer INS3 is opened to expose the pad component PD, the third insulating layer INS3 interposed between the second pad electrode PE2 and the third pad electrode PE3 constituting the pad component PD may be omitted, so that a step of the pad component PD may be reduced or minimized and the pad component may be reliably connected to a circuit board or the like.

Figure 34:
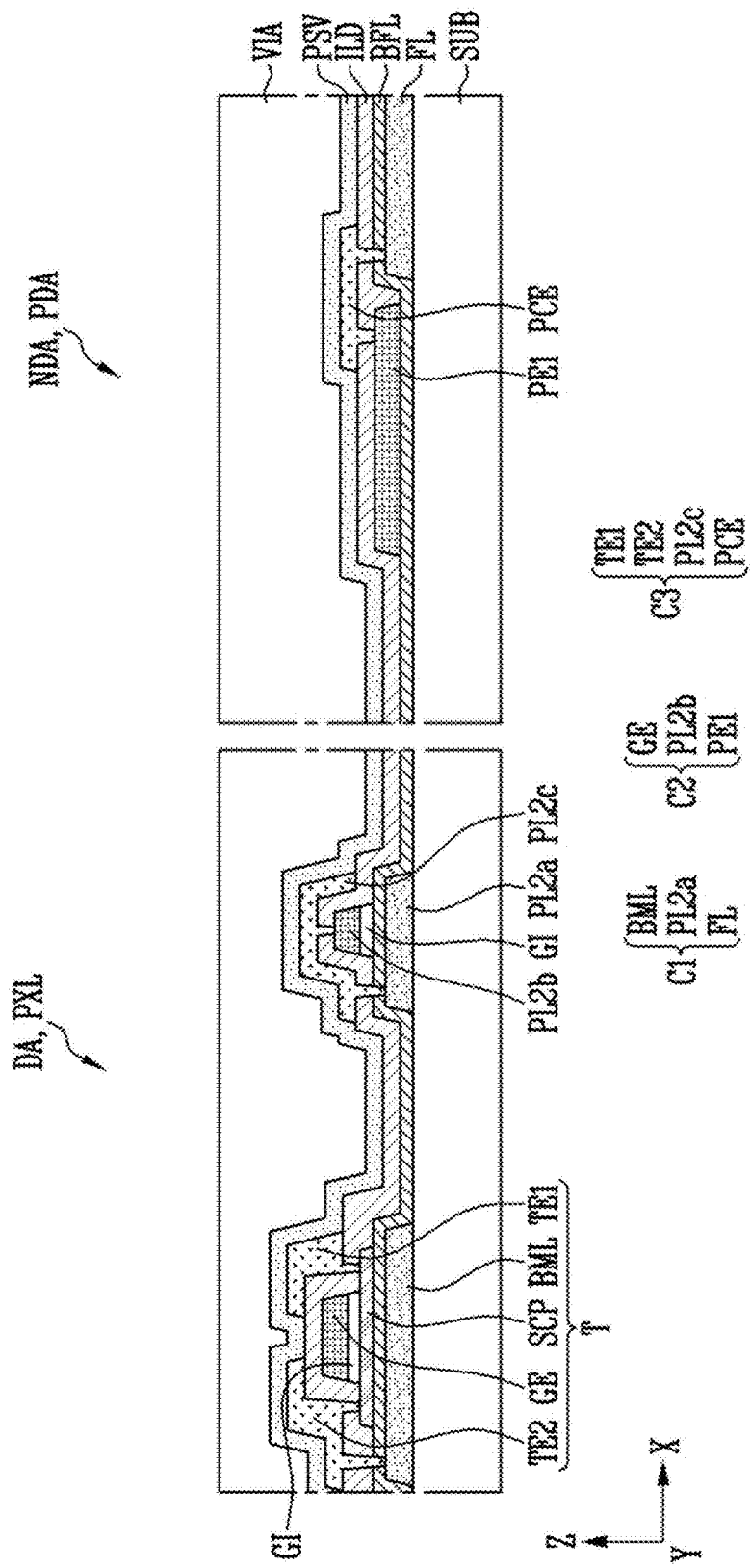
FIGS. 34 to 36 are sectional views of respective process steps to describe a method of manufacturing a display device in accordance with one or more embodiments of the present disclosure.
Figure 35:
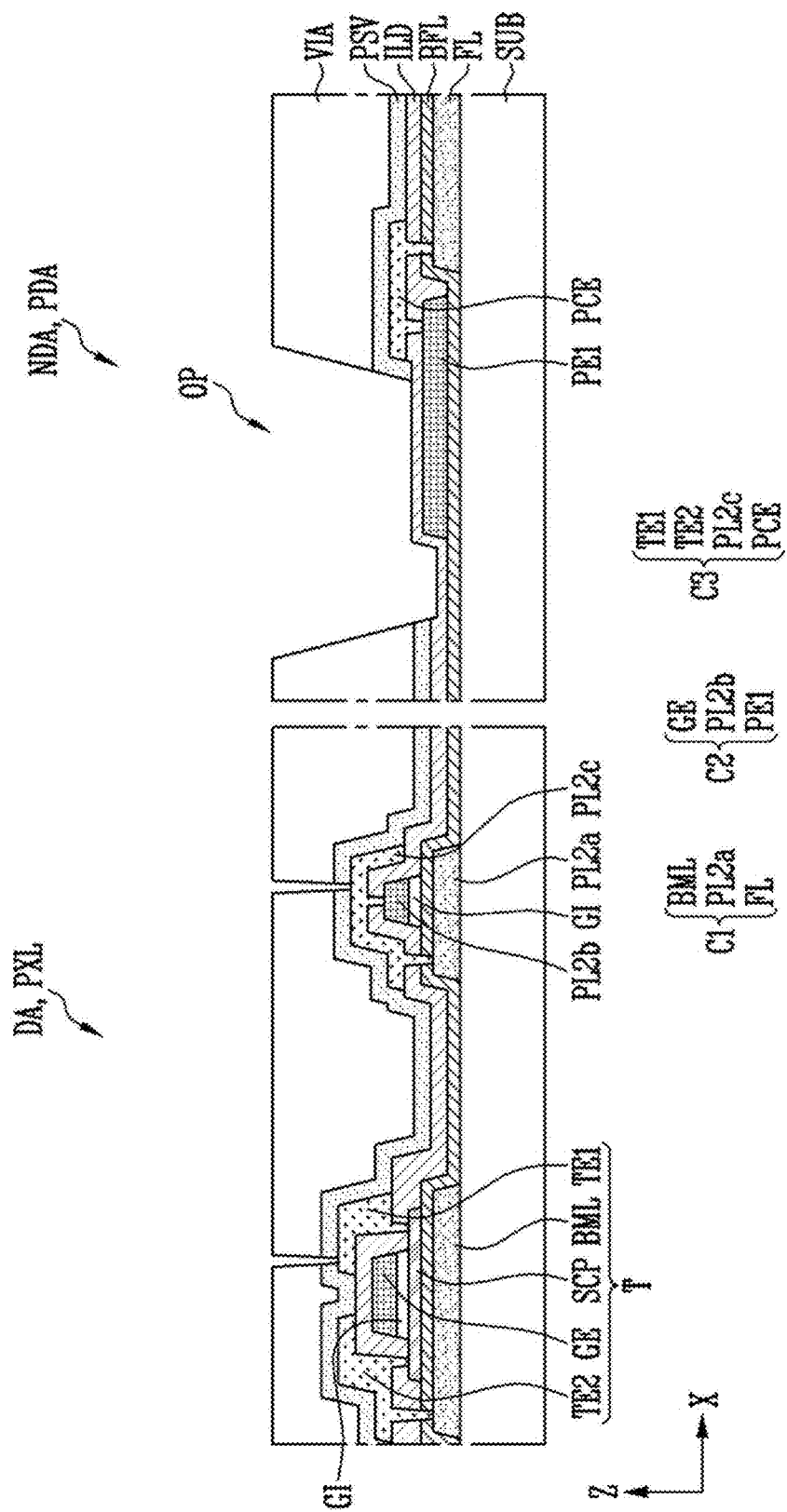
Figure 36:
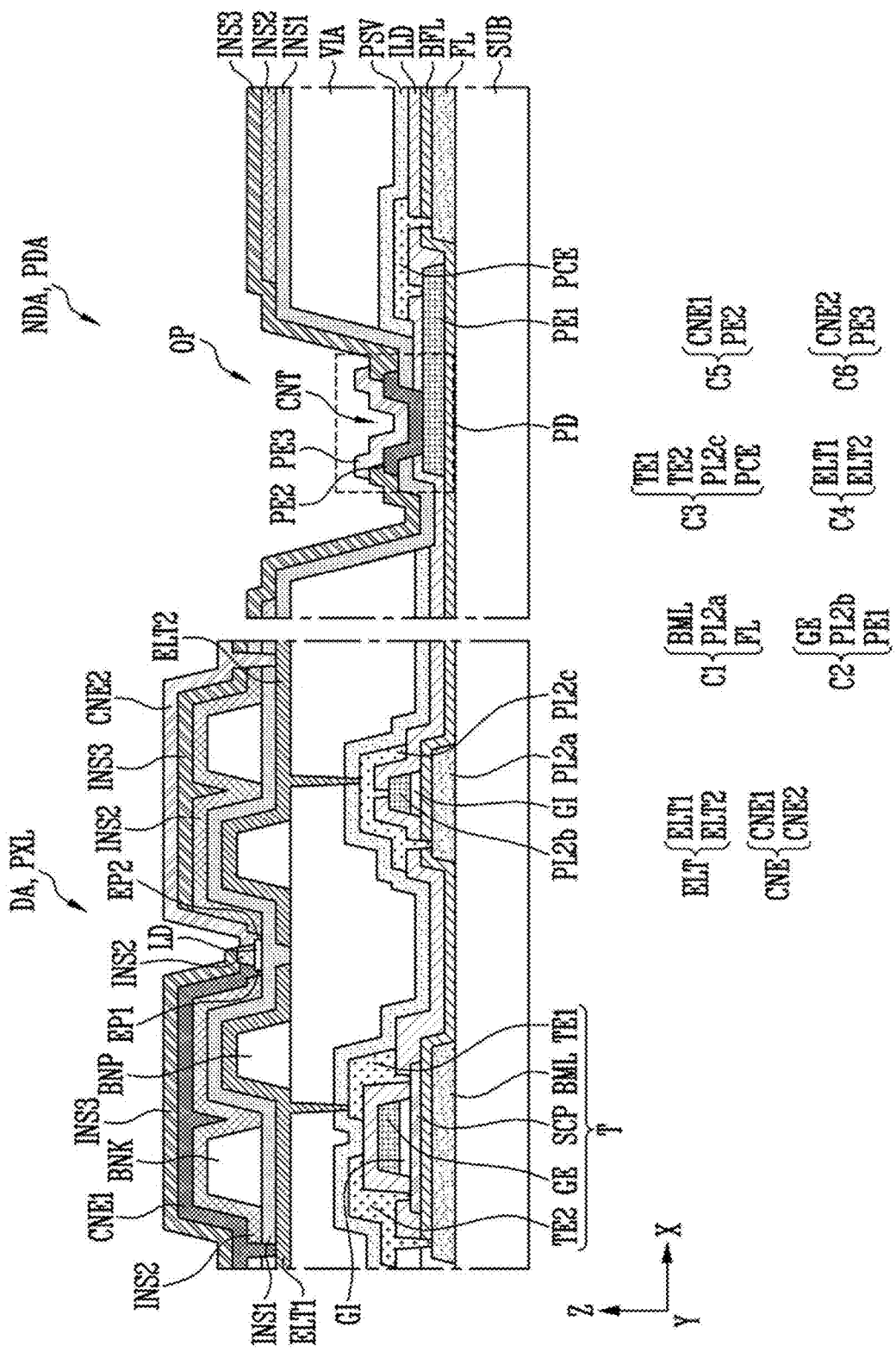

FIGS. 34 to 36 are sectional views of respective process steps to describe a method of manufacturing a display device in accordance with one or more embodiments of the present disclosure. FIGS. 34 to 36 are sectional views for describing the method of manufacturing the display device of FIGS. 5 and 12. Components that are substantially the same as those of FIGS. 5 and 12 are denoted by the same reference numerals, and a detailed description thereof will be omitted.

Referring to FIG. 34, the passivation layer PSV is formed on the third conductive layer C3, and the via layer VIA is formed on the passivation layer PSV. The passivation layer PSV and/or the via layer VIA may be formed throughout the display area DA and the non-display area NDA, for example, the pixel PXL and the pad area PDA. Because the step of providing the third conductive layer C3 on the substrate SUB has been described in detail with reference to FIGS. 15 to 17, duplicated description will be omitted.

Referring to FIG. 35, the passivation layer PSV and the via layer VIA are then etched. The passivation layer PSV and the via layer VIA of the display area DA and the non-display area NDA, for example, the pixel PXL and the pad area PDA may be concurrently (or simultaneously) etched in the same process. Thus, as described above, the manufacturing process may be simplified by reducing the number of masks. As such, in case that the passivation layer PSV and the via layer VIA are concurrently (or simultaneously) etched, etched surfaces of the passivation layer PSV and the via layer VIA may form the same plane.

The passivation layer PSV and the via layer VIA of the display area DA, for example, the pixel PXL are etched, so that contact holes exposing the third conductive layer C3 may be formed. The contact holes may expose the first transistor electrode TE1 and the third power conductive layer PL2c, respectively, but the present disclosure is not necessarily limited thereto.

The passivation layer PSV and the via layer VIA of the non-display area NDA, for example, the pad area PDA are etched, so that the opening OP exposing the interlayer insulating layer ILD may be formed. For instance, the passivation layer PSV and the via layer VIA may cover the pad connection electrode PCE, but may be opened to partially expose the interlayer insulating layer ILD. In other words, the pad connection electrode PCE may be covered and protected by the passivation layer PSV and/or the via layer VIA.

The interlayer insulating layer ILD located at a lower position may be primarily etched in the process of etching the passivation layer PSV and the via layer VIA. For example, the opening OP of the passivation layer PSV and the via layer VIA is formed and over-etching is performed, so that the interlayer insulating layer ILD exposed by the opening OP of the passivation layer PSV and the via layer VIA may be partially removed. In this case, a thickness of the third direction (e.g., the Z-axis direction) of the interlayer insulating layer ILD exposed by the opening OP of the passivation layer PSV and the via layer VIA may be less than a thickness of the third direction (e.g., the Z-axis direction) of the interlayer insulating layer ILD covered by the passivation layer PSV and/or the via layer VIA. As described above, in case that the interlayer insulating layer ILD is primarily etched to be partially removed, the first pad electrode PE1 may be protected by the interlayer insulating layer ILD, and at the same time it may be possible to prevent the interlayer insulating layer ILD from remaining in the contactor CNT of the pad component PD in a subsequent process.

Referring to FIG. 36, next, the display device of FIGS. 5 and 12 may be completed by forming fourth to sixth conductive layers C4, C5, and C6. As described above, in case that the pad connection electrode PCE is covered and protected by the passivation layer PSV and/or the via layer VIA, the sub-connection electrode PCEa (see FIG. 21) for protecting the pad connection electrode PCE may be omitted in the step of forming the fourth conductive layer C4. Because the steps of forming the fourth to sixth conductive layers C4, C5, and C6 have been described in detail with reference to FIGS. 21 to 30, duplicated description will be omitted.

FIGS. 37 to 41 are sectional views of respective process steps to describe a method of manufacturing a display device in accordance with an embodiment of the present disclosure. FIGS. 37 to 41 are sectional views for describing the method of manufacturing the display device of FIGS. 5 and 13. Components that are substantially the same as those of FIGS. 5 and 13 are denoted by the same reference numerals, and a detailed description thereof will be omitted.

Figure 37:
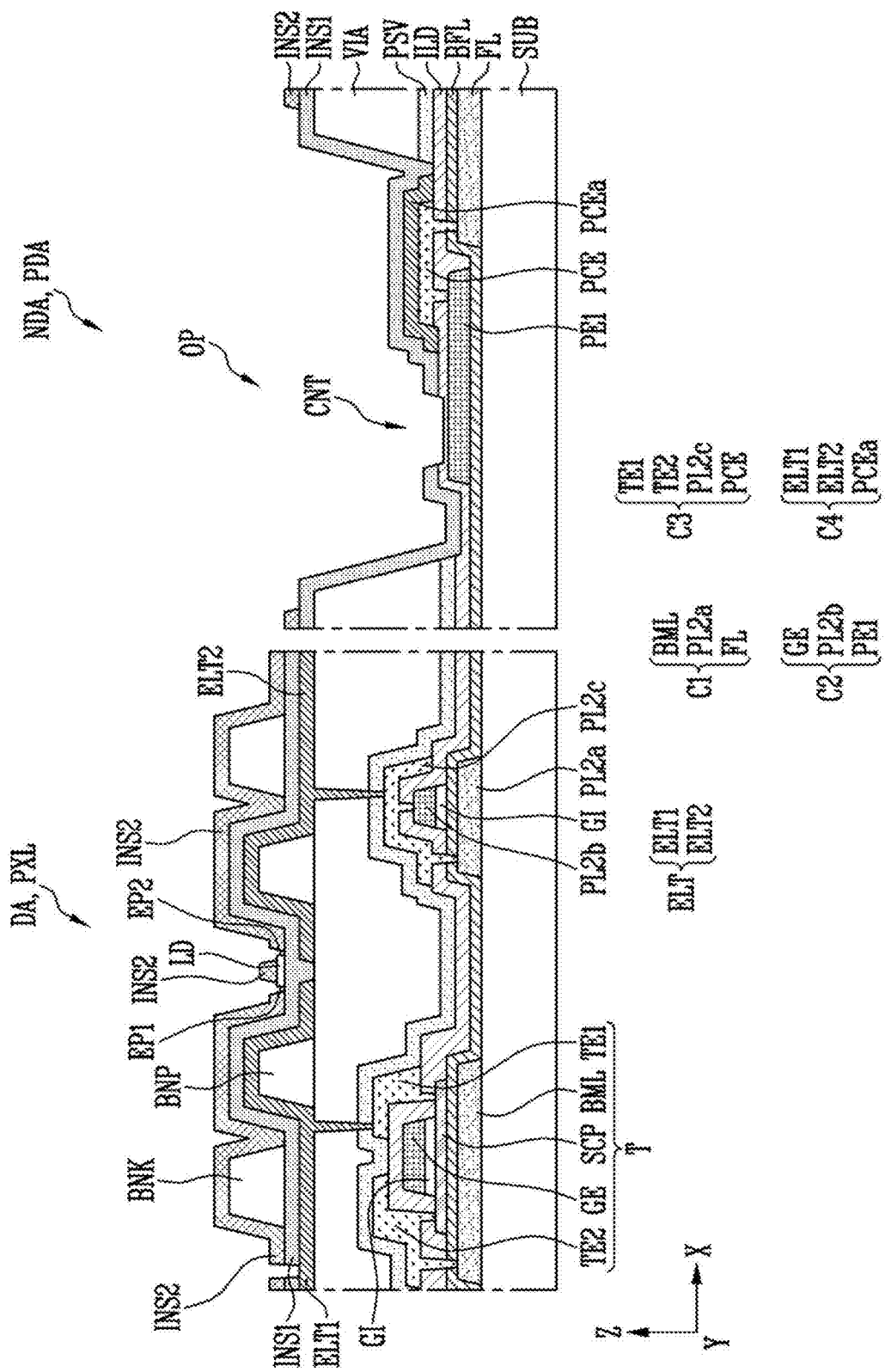
FIGS. 37 to 41 are sectional views of respective process steps to describe a method of manufacturing a display device in accordance with one or more embodiments of the present disclosure.

Referring to FIG. 37, the second insulating layer INS2 is etched. Because the step of forming the second insulating layer INS2 on the substrate SUB has been described in detail with reference to FIGS. 15 to 25, duplicated description will be omitted.

The second insulating layer INS2 of the display area DA and the non-display area NDA, for example, the pixel PXL and the pad area PDA may be concurrently (or simultaneously) etched in the same process. Thus, as described above, the manufacturing process can be simplified by reducing the number of masks.

The second insulating layer INS2 of the display area DA, e.g., the pixel PXL may be etched to form the contact hole that exposes the fourth conductive layer C4, e.g., the first electrode ELT1. Further, the second insulating layer INS2 may cover the light emitting elements LD, and may be partially removed to expose the first and second ends EP1 and EP2 of the light emitting elements LD.

The second insulating layer INS2 of the non-display area NDA, e.g., the pad area PDA may be etched to form the opening OP. In one or more embodiments, the interlayer insulating layer ILD located at a lower position may be tertiary etched in the process of etching the second insulating layer INS2. For instance, the opening OP of the second insulating layer INS2 may be formed and over-etched to partially remove the interlayer insulating layer ILD exposed by the opening OP of the second insulating layer INS2 and the contactor CNT of the first insulating layer INS1. In this case, the thickness of the third direction (e.g., the Z-axis direction) of the interlayer insulating layer ILD exposed by the opening OP of the second insulating layer INS2 and the contactor CNT of the first insulating layer INS1 may be less than the thickness of the third direction (e.g., the Z-axis direction) of the interlayer insulating layer ILD covered by the first insulating layer INS1. In case that the interlayer insulating layer ILD is tertiary etched to be partially removed, the first pad electrode PE1 may be protected by the interlayer insulating layer ILD, and at the same time it may be possible to prevent the interlayer insulating layer ILD from remaining in the contactor CNT of the pad component PD in a subsequent process. In addition, in case that the second insulating layer INS2 is over-etched to tertiary etch the interlayer insulating layer ILD, an additional mask for tertiary etching the interlayer insulating layer ILD is not required, so that economic efficiency for a process can be enhanced.

Figure 38:
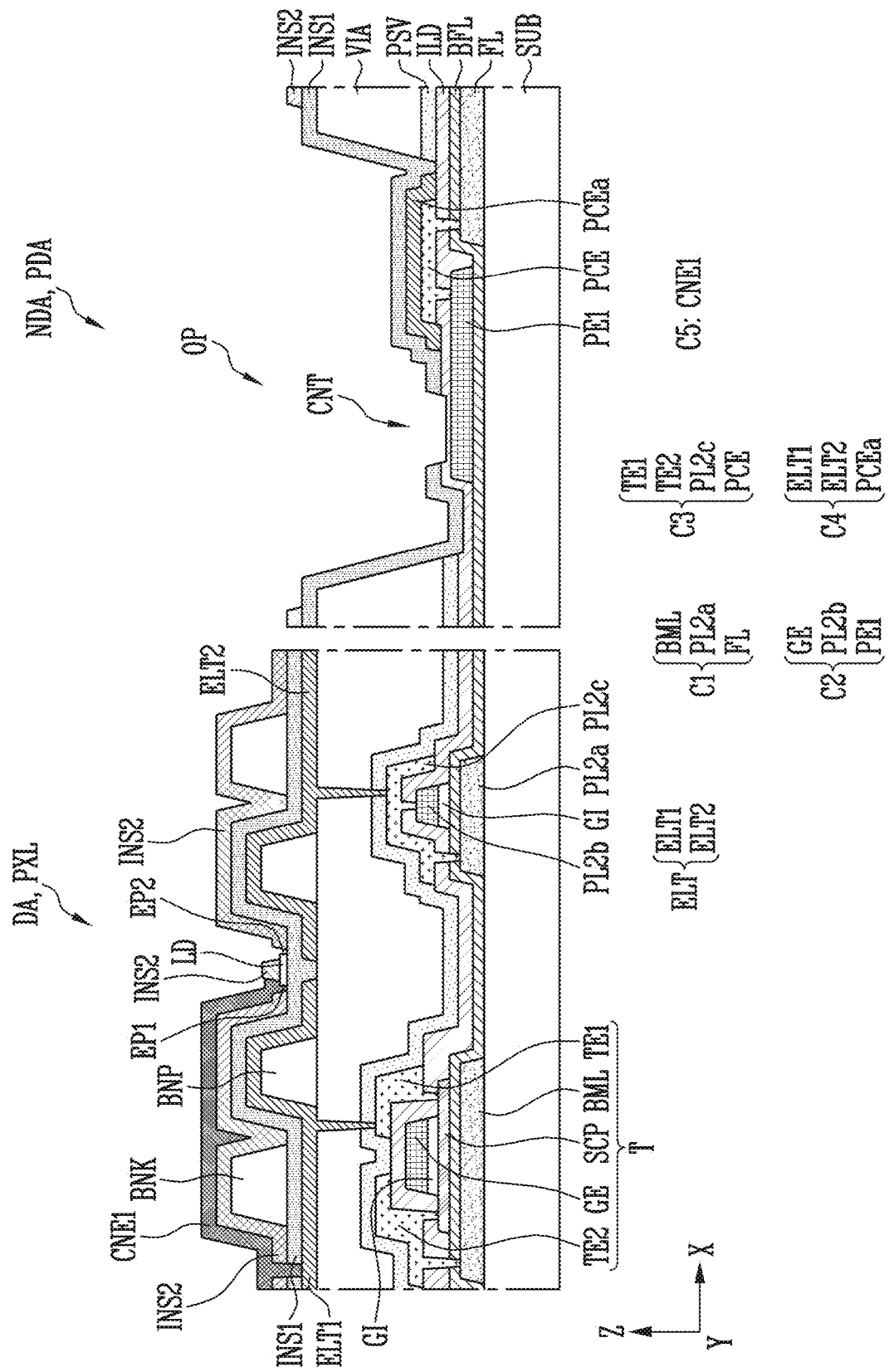

Referring to FIG. 38, next, the first connection electrode CNE1 is formed on the second insulating layer INS2. The first connection electrode CNE1 may be formed on the light emitting elements LD in the display area DA, for example, the pixel PXL. The first connection electrode CNE1 may be electrically connected to the first end EP1 of the light emitting elements LD exposed by the second insulating layer INS2. The first connection electrode CNE1 may be electrically connected to the first electrode ELT1 through the contact hole formed through the second insulating layer INS2 and the first insulating layer INS1. The first connection electrode CNE1 may be formed as the fifth conductive layer C5.

Figure 39:
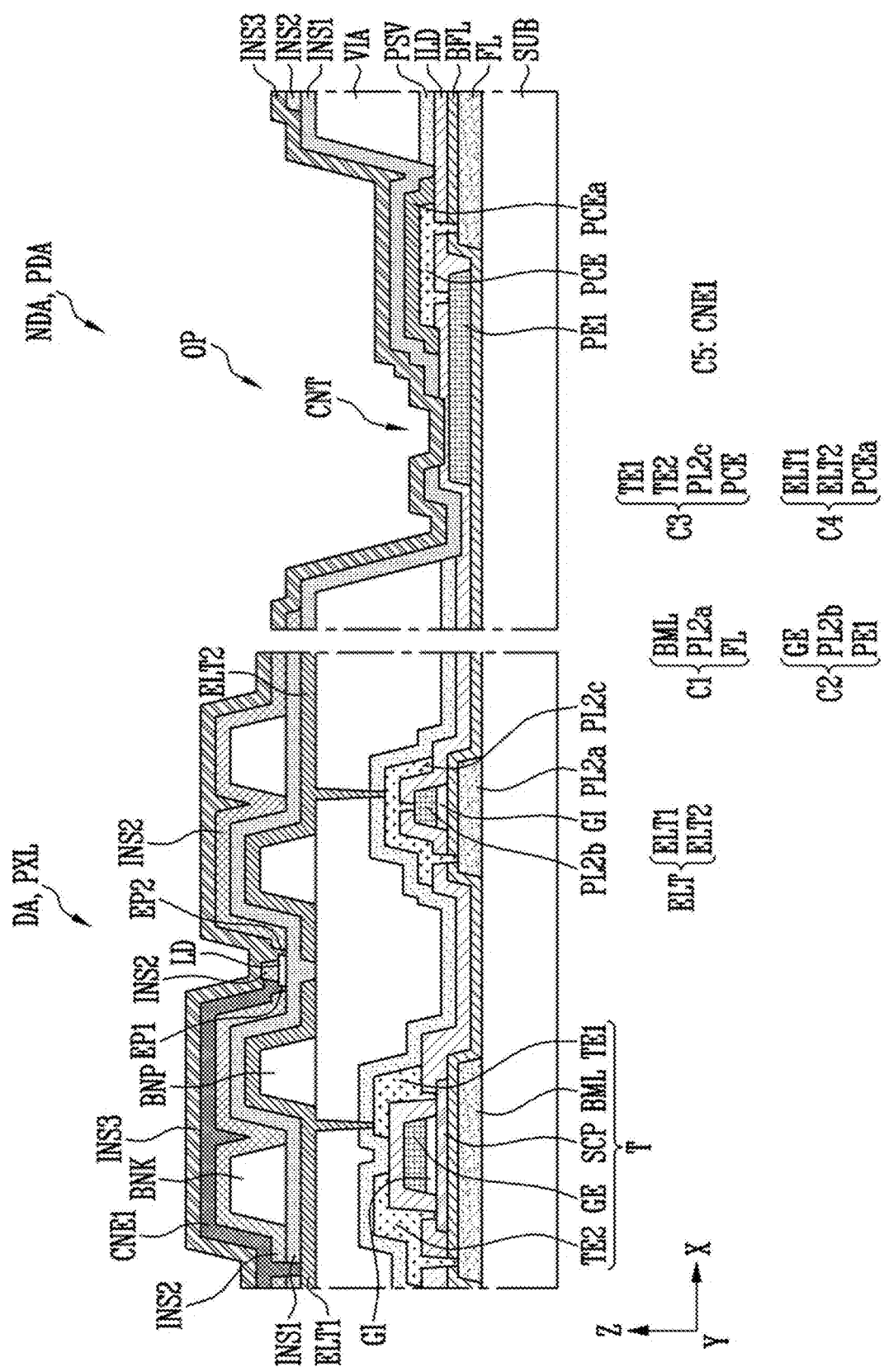

Referring to FIG. 39, next, the third insulating layer INS3 is formed on the fifth conductive layer C5. The third insulating layer INS3 may be formed throughout the display area DA and the non-display area NDA, for example, the pixel PXL and the pad area PDA.

Figure 40:
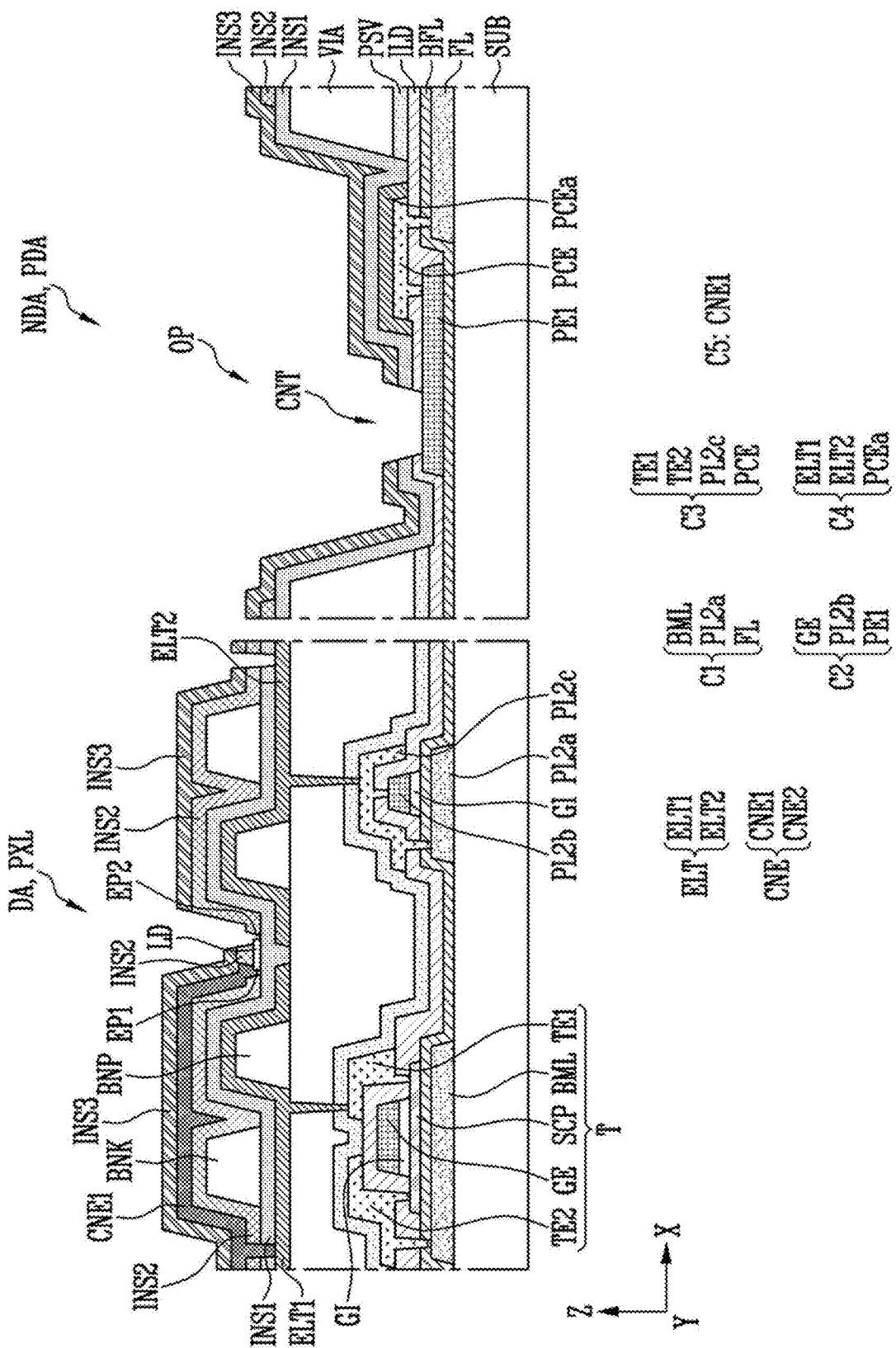

Referring to FIG. 40, next, the third insulating layer INS3 is etched. The third insulating layer INS3 of the display area DA and the non-display area NDA, for example, the pixel PXL and the pad area PDA may be concurrently (or simultaneously etched) in the same process. Thus, as described above, the manufacturing process may be simplified by reducing the number of masks.

The third insulating layer INS3 of the display area DA, e.g., the pixel PXL may be etched to form the contact hole which exposes the fourth conductive layer C4, e.g., the second electrode ELT2. Further, the third insulating layer INS3 may cover the first connection electrode CNE1, the second insulating layer INS2, and/or the light emitting elements LD, and may be partially removed to expose the second ends EP2 of the light emitting elements LD.

The third insulating layer INS3 of the non-display area NDA, e.g., the pad area PDA may be etched to form the contactor CNT. In one or more embodiments, the interlayer insulating layer ILD located at a lower position may be quaternary-etched to form the contactor CNT in the process of etching the third insulating layer INS3. For instance, the contactor CNT of the third insulating layer INS3 may be formed and over-etched to completely remove the interlayer insulating layer ILD exposed by the contactor CNT of the third insulating layer INS3. Thus, the first pad electrode PE1 may be exposed by the interlayer insulating layer ILD, the first insulating layer INS1, and the contactor CNT of the third insulating layer INS3.

As described above, in case that the interlayer insulating layer ILD is sequentially removed by primary to quaternary etching, the first pad electrode PE1 may be protected, and at the same time it may be possible to prevent the interlayer insulating layer ILD from remaining in the contactor CNT of the pad component PD. Further, in case that the second insulating layer INS2 is over-etched to quaternary etch the interlayer insulating layer ILD, an additional mask for quaternary etching the interlayer insulating layer ILD is not required, so that economic efficiency for a process can be enhanced.

Figure 41:
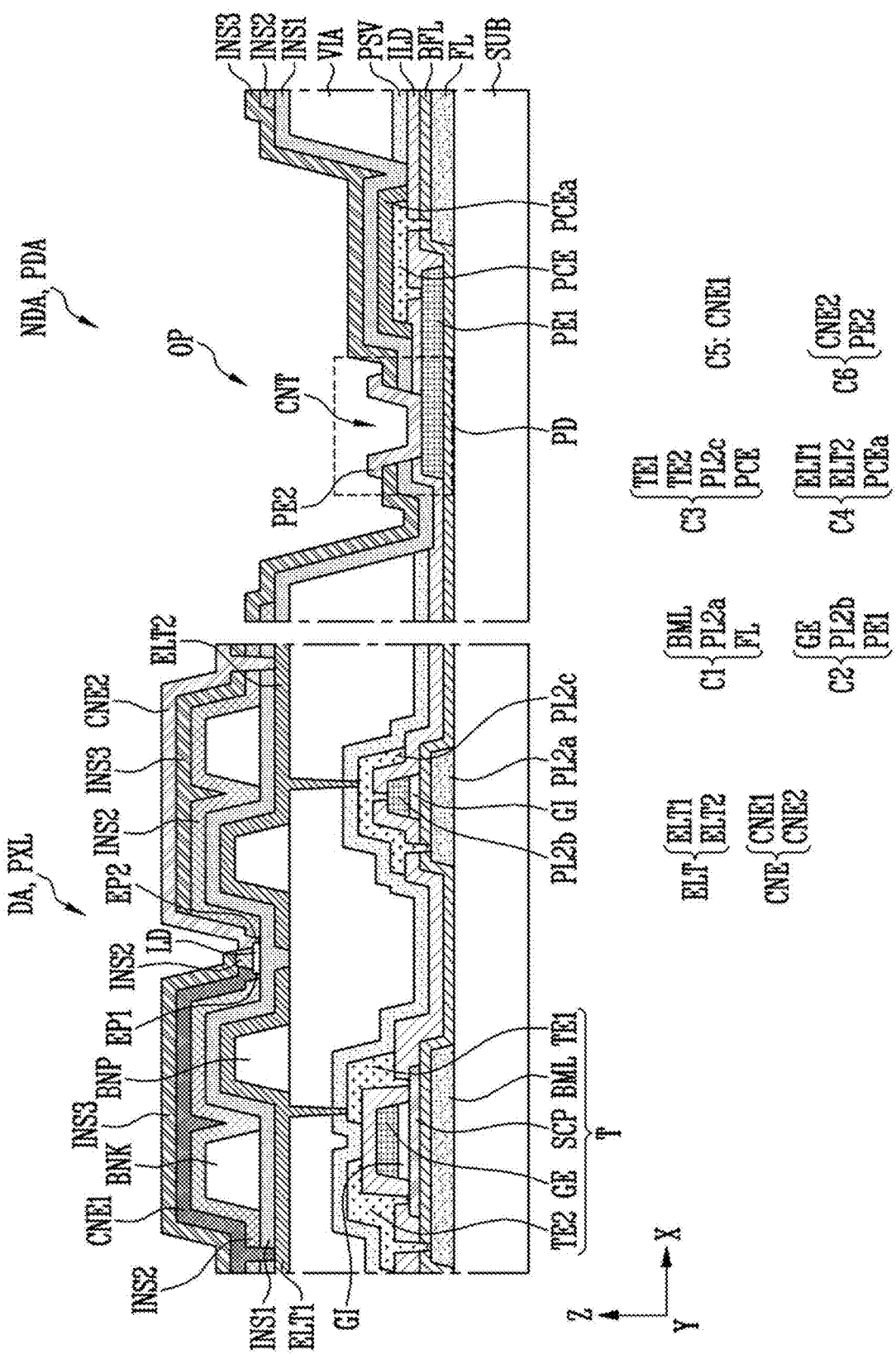

Referring to FIG. 41, next, the display device of FIGS. 5 and 13 may be completed by forming the second connection electrode CNE2 and/or the second pad electrode PE2 on the third insulating layer INS3. The second connection electrode CNE2 may be formed on the light emitting elements LD in the display area DA, for example, the pixel PXL. The second connection electrode CNE2 may be electrically connected to the second end EP2 of the light emitting elements LD exposed by the third insulating layer INS3. The second connection electrode CNE2 may be electrically connected to the second electrode ELT2 through the contact hole formed through the third insulating layer INS3, the second insulating layer INS2, and the first insulating layer INS1.

The second pad electrode PE2 may be formed on the first pad electrode PE1 in the non-display area NDA, for example, in the pad area PDA. The second pad electrode PE2 may contact the first pad electrode PE1 exposed by the contactor CNT passing through the third insulating layer INS3, the first insulating layer INS1, and the interlayer insulating layer ILD.

The second connection electrode CNE2 and/or the second pad electrode PE2 may be formed as the sixth conductive layer C6. The second connection electrode CNE2 and/or the second pad electrode PE2 may be concurrently (or simultaneously) formed in the same process, but the present disclosure is not necessarily limited thereto.

As such, in case that the second pad electrode PE2 constitutes the sixth conductive layer C6, the interlayer insulating layer ILD is sequentially removed by primary to quaternary etching processes before the sixth conductive layer C6 is formed, thus forming the contactor CNT. Thereby, it is possible to protect the first pad electrode PE1, and at the same time prevent the interlayer insulating layer ILD from remaining in the contactor CNT of the pad component PD. As described above, as the insulating layers disposed over the interlayer insulating layer ILD are over-etched to etch the interlayer insulating layer ILD, an additional mask for etching the interlayer insulating layer ILD is unnecessary, so that the economic efficiency for a process can be secured.

Figure 42:
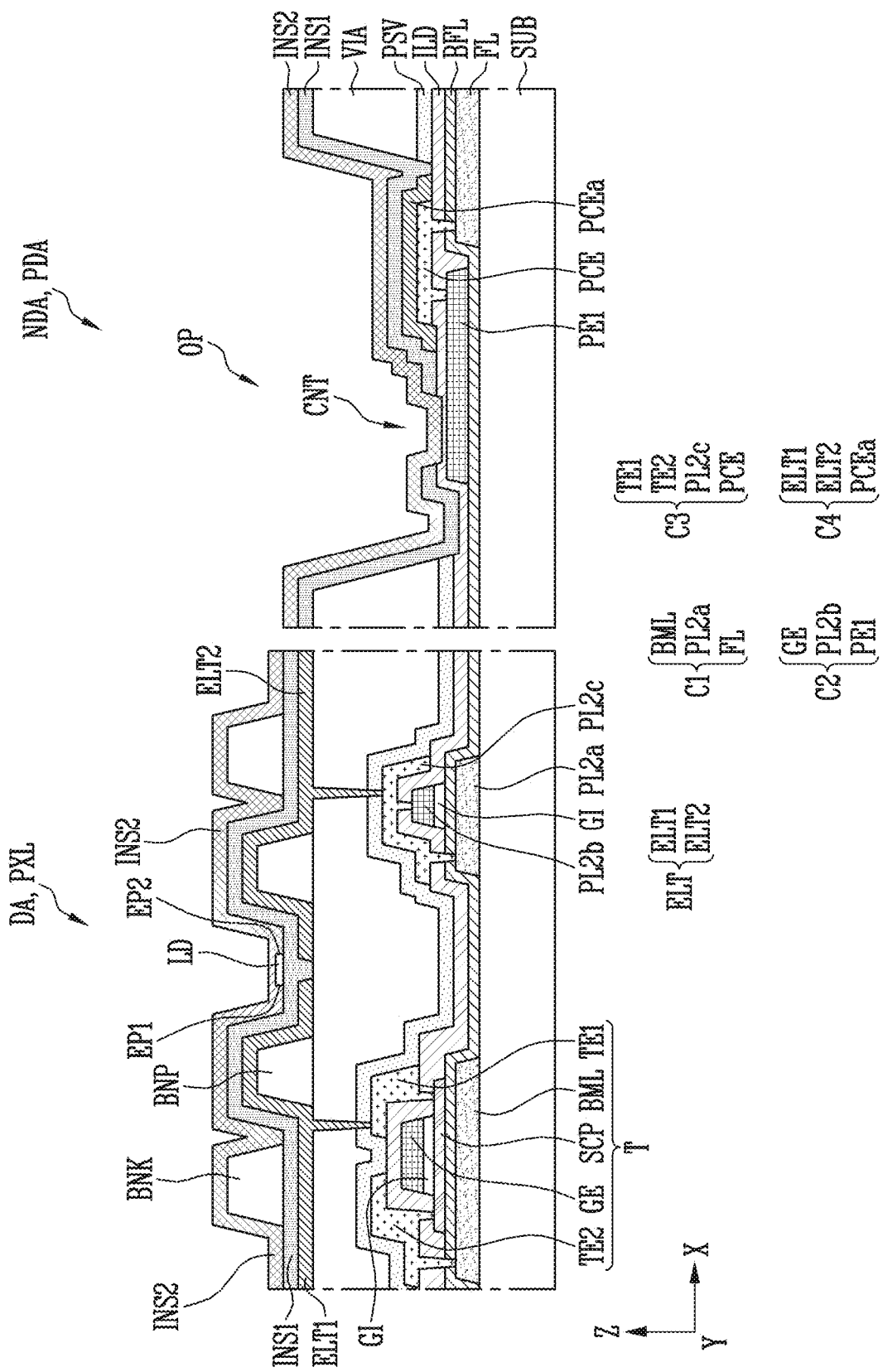
Figure 43:
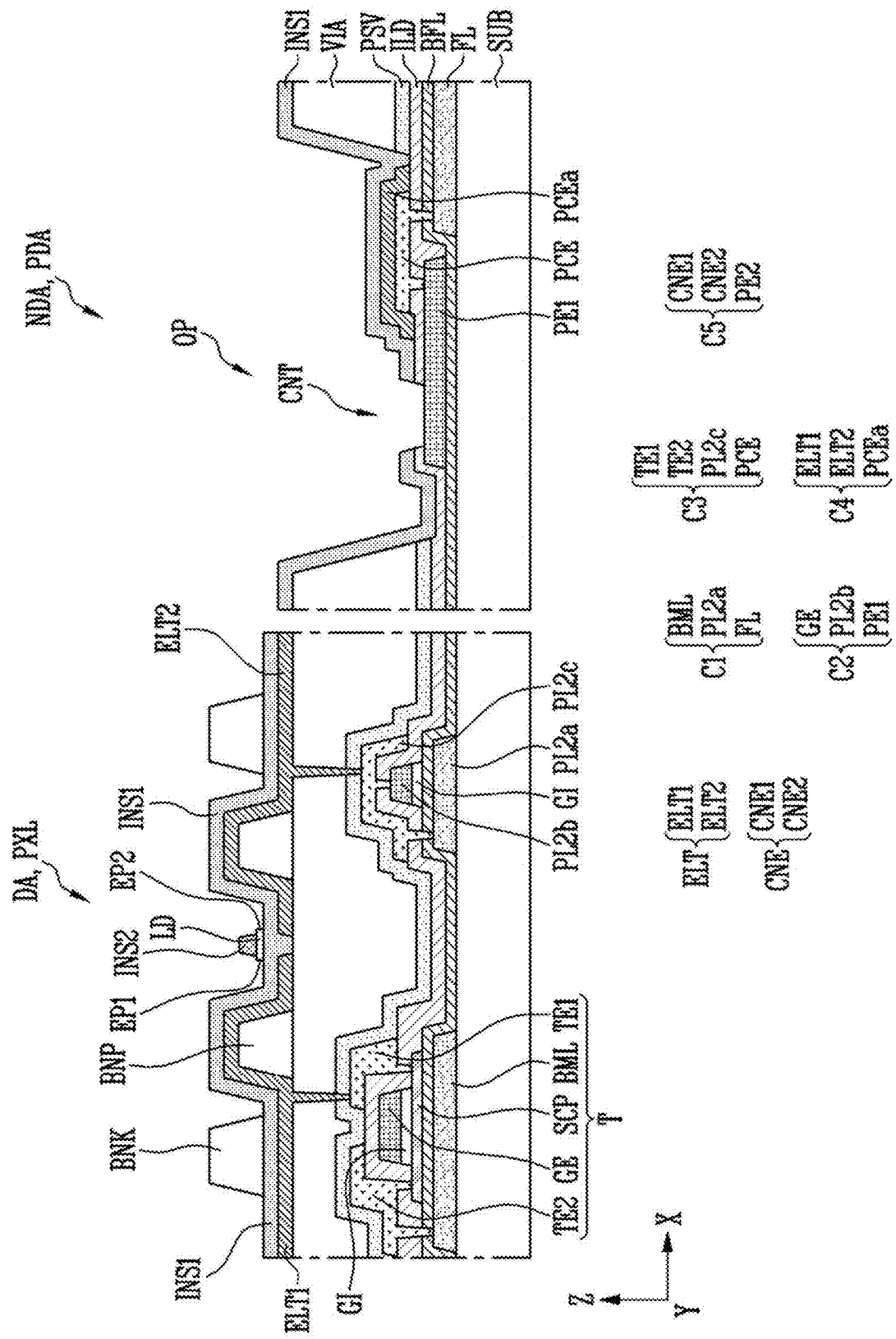

FIGS. 42 to 44 are sectional views of respective process steps to describe a method of manufacturing a display device in accordance with one or more embodiments of the present disclosure. FIGS. 42 to 44 are sectional views for describing the method of manufacturing the display device of FIGS. 6 and 14. Components that are substantially the same as those of FIGS. 6 and 14 are denoted by the same reference numerals, and a detailed description thereof will be omitted.

Referring to FIG. 42, the second insulating layer INS2 is formed on the light emitting elements LD. The second insulating layer INS2 may be formed throughout the display area DA and the non-display area NDA, for example, the pixel PXL and the pad area PDA. Because the step of providing the light emitting elements LD on the substrate SUB has been described in detail with reference to FIGS. 15 to 24, duplicated description will be omitted.

Referring to FIG. 43, next, the second insulating layer INS2 is etched. The second insulating layer INS2 of the display area DA, e.g., the pixel PXL may be partially removed to expose the first and second ends EP1 and EP2 of the light emitting elements LD. For example, the second insulating layer INS2 may be completely removed from areas other than one area of the light emitting elements LD.

In one or more embodiments, the interlayer insulating layer ILD located at a lower position may be tertiary-etched to form the contactor CNT in the process of etching the second insulating layer INS2 of the non-display area NDA, e.g., the pad area PDA. For instance, the second insulating layer INS2 may be over-etched to completely remove the interlayer insulating layer ILD exposed by the contactor CNT of the interlayer insulating layer ILD and the first insulating layer INS1. Thus, the first pad electrode PE1 may be exposed by the contactor CNT of the first insulating layer INS1 and the interlayer insulating layer ILD.

As described above, in case that the interlayer insulating layer ILD is sequentially removed by primary to tertiary etching processes to form the contactor CNT, the first pad electrode PE1 may be protected, and at the same time it may be possible to prevent the interlayer insulating layer ILD from remaining in the contactor CNT of the pad component PD. As described above, as the insulating layers disposed over the interlayer insulating layer ILD are over-etched to partially etch the interlayer insulating layer ILD, an additional mask for etching the interlayer insulating layer ILD is unnecessary, so that the economic efficiency for a process may be secured.

Referring to FIG. 44, next, the display device of FIGS. 5 and 14 may be completed by forming the first connection electrode CNE1, the second connection electrode CNE2 and/or the second pad electrode PE2.

The first and second connection electrodes CNE1 and CNE2 may be formed on the light emitting elements LD in the display area DA, for example, the pixel PXL. For example, the first connection electrode CNE1 may be formed on the first end EP1 of the light emitting elements LD exposed by the second insulating layer INS2. The first connection electrode CNE1 may be electrically connected to the first electrode ELT1 through the contact hole formed through the first insulating layer INS1. The second connection electrode CNE2 may be formed on the second end EP2 of the light emitting elements LD exposed by the second insulating layer INS2. The second connection electrode CNE2 may be electrically connected to the second electrode ELT2 through the contact hole formed through the first insulating layer INS1.

The second pad electrode PE2 may be formed on the first pad electrode PE1 in the non-display area NDA, for example, in the pad area PDA. The second pad electrode PE2 may contact the first pad electrode PE1 through the contactor CNT passing through the first insulating layer INS1 and the interlayer insulating layer ILD.

The first connection electrode CNE1, the second connection electrode CNE2, and/or the second pad electrode PE2 may be formed as the fifth conductive layer C5. The first connection electrode CNE1, the second connection electrode CNE2, and/or the second pad electrode PE2 may be concurrently (or simultaneously) formed in the same process. In case that the first connection electrode CNE1, the second connection electrode CNE2, and/or the second pad electrode PE2 are formed as the fifth conductive layer C5, the third insulating layer INS3 (see FIG. 30) and the sixth conductive layer C6 (see FIG. 30) may be omitted, so that the number of masks can be reduced and thereby the manufacturing process can be simplified.

It is to be understood by those skilled in the art that changes may be made without departing from the spirit or scope of the present disclosure. Therefore, the above-described embodiments are to be considered as being illustrative rather than restrictive. The scope of the present disclosure is defined by the appended claims rather than by the description preceding them, and all changes that fall within the claims or equivalence thereof are intended to be embraced by the claims.

According to one or more embodiments of the present disclosure, by forming a first pad electrode constituting a pad component as a second conductive layer (or gate conductive layer), the first pad electrode is prevented from being damaged, and at the same time the contact resistance of the pad component is improved, thus solving the heat issue of the pad component and a reduction in luminance of a display panel.

Further, a contactor of a pad component is formed by sequentially etching an interlayer insulating layer disposed on a first pad electrode, thus preventing the interlayer insulating layer from remaining on the contactor.

The effects, aspects, and features of embodiments of the present disclosure are not limited by the foregoing, and other various effects, aspects, and features are anticipated herein.

What is claimed is:
1. A display device comprising:
    a substrate comprising a display area in which pixels are located, and a non-display area;

first and second electrodes in the display area and spaced from each other;

light emitting elements between the first and second electrodes;

connection electrodes electrically connected to the light emitting elements;

a fan-out line electrically connected to the pixels in the non-display area;

a first pad electrode on the fan-out line;

a pad connection electrode on the fan-out line and the first pad electrode, and electrically connecting the fan-out line and the first pad electrode; and a second pad electrode at a same layer as at least one of the connection electrodes, and contacting the first pad electrode, wherein the connection electrodes comprise a first connection electrode electrically connected to a first end of the light emitting elements, and a second connection electrode electrically connected to a second end of the light emitting elements.

2. The display device according to claim 1, further comprising:

a lower conductive layer on the substrate;

a gate electrode on the lower conductive layer;

a semiconductor pattern between the lower conductive layer and the gate electrode; and a source electrode and a drain electrode on the semiconductor pattern, wherein the first pad electrode is at a same layer as the gate electrode.

3. The display device according to claim 2, wherein the pad connection electrode is at a same layer as the source electrode or the drain electrode.

4. The display device according to claim 3, further comprising a sub-connection electrode covering the pad connection electrode.

5. The display device according to claim 4, wherein the sub-connection electrode is at a same layer as the first and second electrodes.

6. The display device according to claim 2, wherein the fan-out line is at a same layer as the lower conductive layer.

7. The display device according to claim 2, further comprising a passivation layer on the source electrode or the drain electrode, wherein the passivation layer includes an opening exposing the second pad electrode.

8. The display device according to claim 7, wherein the passivation layer covers the pad connection electrode.

9. The display device according to claim 1, wherein the first pad electrode comprises:

a first electrode layer comprising titanium (Ti);

a second electrode layer on the first electrode layer and comprising copper (Cu);

a third electrode layer on the second electrode layer and comprising titanium (Ti); and a fourth electrode layer on the third electrode layer and comprising indium tin oxide (ITO).

10. The display device according to claim 1, further comprising an insulating layer between the first connection electrode and the second connection electrode.

11. The display device according to claim 10, further comprising a third pad electrode on the second pad electrode, wherein the second pad electrode is at a same layer as the first connection electrode, and wherein the third pad electrode is at a same layer as the second connection electrode.

12. The display device according to claim 10, wherein the insulating layer comprises an opening exposing the second pad electrode.

13. The display device according to claim 10, wherein the second pad electrode is at a same layer as the second connection electrode.

14. The display device according to claim 1, wherein the first connection electrode and the second connection electrode are at a same layer.

* * * * *